United States Patent
Lee et al.

(10) Patent No.: US 11,610,966 B2
(45) Date of Patent: *Mar. 21, 2023

(54) SEMICONDUCTOR DEVICES

(71) Applicant: SAMSUNG ELECTRONICS CO., LTD., Suwon-si (KR)

(72) Inventors: Jung-Han Lee, Anyang-si (KR); Jae-Hwan Lee, Seoul (KR); Sang-Su Kim, Yongin-si (KR); Hwan-Wook Choi, Yongin-si (KR); Tae-Jong Lee, Hwaseong-si (KR); Seung-Mo Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/694,031

(22) Filed: Nov. 25, 2019

(65) Prior Publication Data

US 2020/0091286 A1 Mar. 19, 2020

Related U.S. Application Data

(60) Continuation of application No. 16/124,521, filed on Sep. 7, 2018, now Pat. No. 10,622,444, which is a
(Continued)

(30) Foreign Application Priority Data

Apr. 14, 2015 (KR) .................. 10-2015-0052408

(51) Int. Cl.
*H01L 29/06* (2006.01)
*H01L 27/088* (2006.01)
*H01L 21/8234* (2006.01)

(52) U.S. Cl.
CPC .. *H01L 29/0657* (2013.01); *H01L 21/823431* (2013.01); *H01L 21/823468* (2013.01); *H01L 27/0886* (2013.01)

(58) Field of Classification Search
CPC ............. H01L 29/0657; H01L 27/0886; H01L 21/823431; H01L 21/823468; H01L 29/66553; H01L 29/42356
See application file for complete search history.

(56) References Cited

U.S. PATENT DOCUMENTS 7,915,693 B2  3/2011  Okano
8,269,288 B2  9/2012  Iwamatsu et al.
(Continued)

FOREIGN PATENT DOCUMENTS

CN   103531478 A   1/2014
CN   103578988 A   2/2014
(Continued)

OTHER PUBLICATIONS

Korean Office action dated May 20, 2021.
(Continued)

*Primary Examiner* — Tuan A Hoang
(74) *Attorney, Agent, or Firm* — Lee IP Law, P.C.

(57) ABSTRACT

A semiconductor device includes a plurality of active fins defined by an isolation layer on a substrate, a gate structure on the active fins and the isolation layer, and a gate spacer structure covering a sidewall of the gate structure. A sidewall of the gate structure includes first, second, and third regions having first, second, and third slopes, respectively. The second slope increases from a bottom toward a top of the second region. The second slope has a value at the bottom of the second region less than the first slope. The third slope is greater than the second slope.

19 Claims, 60 Drawing Sheets

Related U.S. Application Data division of application No. 14/993,212, filed on Jan. 12, 2016, now Pat. No. 10,074,717.

(56) References Cited

U.S. PATENT DOCUMENTS

| | | |
|---|---|---|
| 8,294,186 B2 | 10/2012 | Iwasaki et al. |
| 8,772,148 B1 | 7/2014 | Wang et al. |
| 8,883,570 B2 | 11/2014 | Lu |
| 9,269,813 B2 | 2/2016 | Hong et al. |
| 9,887,275 B2 | 2/2018 | Lee et al. |
| 10,074,717 B2* | 9/2018 | Lee ............... H01L 21/823468 |
| 2008/0296667 A1 | 12/2008 | Mikasa |
| 2009/0085075 A1 | 4/2009 | Kim et al. |
| 2009/0184359 A1 | 7/2009 | He et al. |
| 2011/0223736 A1 | 9/2011 | Lin et al. |
| 2011/0233626 A1 | 9/2011 | Iwasaki et al. |
| 2012/0146123 A1 | 6/2012 | Da et al. |
| 2013/0115759 A1 | 5/2013 | Park et al. |
| 2013/0187228 A1* | 7/2013 | Xie ....................... H01L 29/518 257/E21.409 |
| 2013/0273705 A1 | 10/2013 | Liu et al. |
| 2013/0299916 A1* | 11/2013 | Won ................. H01L 29/6656 257/392 |
| 2014/0151761 A1 | 6/2014 | Hsieh |
| 2014/0183599 A1* | 7/2014 | Hong ............... H01L 29/66545 257/190 |
| 2014/0239393 A1* | 8/2014 | Kuo .................... H01L 29/495 438/424 |
| 2014/0264604 A1* | 9/2014 | Tsai ................. H01L 29/66795 438/283 |
| 2015/0079751 A1 | 3/2015 | Alptekin |
| 2015/0108544 A1 | 4/2015 | Ching |
| 2015/0214331 A1* | 7/2015 | Jang ................... H01L 29/7851 438/164 |
| 2016/0204215 A1* | 7/2016 | Chang ............. H01L 29/42376 438/283 |
| 2016/0240650 A1* | 8/2016 | Chang ............. H01L 29/66795 |
| 2016/0359021 A1 | 12/2016 | Kim et al. |
| 2017/0323951 A1 | 11/2017 | Bergendahl et al. |
| 2019/0019864 A1* | 1/2019 | Lee .................... H01L 29/0657 |

FOREIGN PATENT DOCUMENTS

| | | |
|---|---|---|
| CN | 104425263 A | 3/2015 |
| JP | 2009-147265 A | 7/2009 |
| KR | 10-2006-0053556 A | 5/2006 |
| KR | 10-2011-0012458 A | 2/2011 |
| KR | 10-2014-0130911 A | 11/2014 |
| TW | 201436228 A | 9/2014 |
| TW | 201436241 A | 9/2014 |

OTHER PUBLICATIONS

Chinese Office Action dated Aug. 27, 2020.
Taiwanese Office Action dated May 29, 2019 from the Taiwan Intellectual Property Office for corresponding TW 105105571.
U.S. Appl. No. 16/124,521, filed Sep. 7, 2018.
Notice of Allowance dated Dec. 2, 2019, in U.S. Appl. No. 16/124,521 (parent).
Final Rejection received in co pending related U.S. Appl. No. 16/993,514 dated May 2, 2022.

* cited by examiner ns relate to
SEMICONDUCTOR DEVICES

CROSS-REFERENCE TO RELATED APPLICATIONS

This is a continuation application based on pending application Ser. No. 16/124,521, filed Sep. 7, 2018, which in turn is a divisional application based on application Ser. No. 14/993,212, filed Jan. 12, 2016, now U.S. Pat. No. 10,074,717 B2, issued Sep. 11, 2018, the entire contents of both being hereby incorporated by reference.

Korean Patent Application No. 10-2015-0052408, filed on Apr. 14, 2015, and entitled, "Semiconductor Devices and Methods of Manufacturing the Same," is incorporated by reference herein in its entirety.

BACKGROUND

1. Field

One or more embodiments described herein relate to semiconductor devices and methods of manufacturing the semiconductor devices.

2. Description of the Related Art

A fin-type field effect transistor (finFET) may be manufactured by forming a dummy gate electrode to cross over active fins. As the distance between the active fins decreases, the dummy gate electrode may have a skirt-like shape. This is because the lower portion of the dummy gate electrode may not be etched well, and thus may be exposed when a gate spacer is subsequently formed. Consequently, a short may form between a gate electrode and a source/drain layer of the transistor.

SUMMARY

In accordance with one or more embodiments, a semiconductor device includes a plurality of active fins defined by an isolation layer on a substrate, each of the active fins extending in a first direction; a gate structure on the active fins and the isolation layer in a second direction crossing the first direction; and a gate spacer structure covering a sidewall of the gate structure, wherein a sidewall of a first portion of the gate structure on the isolation layer includes first, second, and third regions having first, second, and third slopes, respectively, with respect to a top surface of the substrate, the second slope increasing from a bottom toward a top thereof, the second slope having a value at the bottom thereof smaller than the first slope, and the third slope being greater than the second slope.

The first, second, and third regions of the sidewall of the first portion of the gate structure may be disposed from the top surface of the substrate upwardly in this order. The first slope may be substantially constant, and the third slope may be substantially 90 degrees. The first slope may be equal to or less than the third slope.

The gate spacer structure may include a first gate spacer covering the second and third regions of the sidewall of the first portion of the gate structure; and a second gate spacer covering the first region of the sidewall of the first portion of the gate structure and an outer sidewall of the first gate spacer. The first and second gate spacers may include substantially a same material. The first and second gate spacers may include a nitride. The first and second gate spacers may include different materials. The first and second gate spacers may include an oxide and a nitride, respectively.

The gate structure may include a gate electrode; and a gate insulation pattern covering a bottom and a sidewall of the gate electrode. The gate electrode may include a metal, and the gate insulation pattern may include a high-k dielectric material. The semiconductor device may include an interface pattern between a top surface of each of the active fins and the gate insulation pattern, the interface pattern including an oxide.

A sidewall of a second portion of the gate structure on the active fins may be substantially perpendicular to the top surface of the substrate. The gate spacer structure may include a first gate spacer covering the second and third regions of the sidewall of the first portion of the gate structure; and a second gate spacer covering the first region of the sidewall of the first portion of the gate structure, and an outer sidewall of the first gate spacer, wherein the first gate spacer covers the sidewall of the second portion of the gate structure, and wherein the second gate spacer covers an outer sidewall of a portion of the first gate spacer covering the sidewall of the second portion of the gate structure.

The semiconductor device may include a fin spacer structure covering a sidewall of each of the active fins, wherein the fin spacer structure extends in the first direction and wherein a third portion of the gate structure on a portion of the isolation layer adjacent the sidewall of each of the active fins extends in the first direction and is covered by the gate spacer structure and the fin spacer structure.

The fin spacer structure may include a first fin spacer on the third portion of the gate structure, the first fin spacer covering the sidewall of each of the active fins; and second fin spacer covering an outer sidewall of the first fin spacer. The fin spacer structure and the gate spacer structure may include substantially a same material. The gate structure may include a plurality of gate structures spaced apart from each other in the first direction. The first and second directions may be substantially perpendicular to each other.

The semiconductor device may include source/drain layers on portions of the active fins adjacent sidewalls of the gate structure in the first direction. The source/drain layers include single crystalline silicon doped with impurities, single crystalline silicon carbide doped with impurities, or single crystalline silicon-germanium doped with impurities. The semiconductor device may include a metal silicide pattern on each of the source/drain layers, wherein the metal silicide pattern is electrically insulated from the gate structure.

In accordance with one or more other embodiments, a semiconductor device includes a plurality of active fins, each of the active fins protruding from a top surface of an isolation layer on a substrate and extending in a first direction; a plurality of gate structures, each of the gate structures extending on the active fins and the isolation layer in a second direction substantially perpendicular to the first direction, a sidewall of a first portion of each of the gate structures on the isolation layer having a slope at least partially different from a sidewall of a second portion of each of the gate structures on the active fins; and a spacer structure covering a sidewall of each of the gate structures.

The sidewall of the first portion of each of the gate structures may include first, second, and third regions having first, second, and third slopes, respectively, with respect to a top surface of the substrate, the second slope may increase from a bottom toward a top thereof, the second slope may have a value at the bottom thereof smaller than the first slope, the third slope maybe greater than the second slope, the sidewall of the second portion of each of the gate structures may have the third slope. The third slope may be substantially 90 degrees, and the first slope may be equal to or less than the third slope.

A top surface of the first portion of each of the gate structures may be substantially coplanar with a top surface of the second portion of each of the gate structures, and a bottom of the first portion of each of the gate structures may be lower than a bottom of the second portion of each of the gate structures. The first, second, and third regions of the sidewall of the first portion of each of the gate structures may be disposed from the top surface of the isolation layer upwardly in this order, and the first and second regions of the sidewall of the first portion of each of the gate structures may be at heights substantially equal to or lower than a height of a bottom of the second portion of each of the gate structures.

The e spacer structure may include a gate spacer structure covering a sidewall of each of the gate structures in the first direction; and a fin spacer structure covering a sidewall of each of the active fins in the second direction. The gate spacer structure may include a first gate spacer covering the second and third regions of the sidewall of the first portion of the gate structure; and a second gate spacer covering the first region of the sidewall of the first portion of the gate structure, and an outer sidewall of the first gate spacer.

A portion of the first gate spacer may cover the sidewall of the second portion of each of the gate structures, and a portion of the second gate spacer may cover an outer sidewall of the portion of the first gate spacer covering the sidewall of the second portion of each of the gate structures. The fin spacer structure may cover a top surface of a third portion of each of the gate structures, the third portion may extend in the first direction on the isolation layer and contact the sidewall of each of the active fins, and a portion of the second gate spacer may cover a sidewall of the third portion of each of the gate structures.

The fin spacer structure may include a first fin spacer on the third portion of each of the gate structures, the first fin spacer covering the sidewall of each of the active fins; and a second fin spacer covering an outer sidewall of the first fin spacer. The first fin spacer and the first gate spacer may include a same material, and the second fin spacer and the second gate spacer may include a same material.

In accordance with one or more other embodiments, a semiconductor device includes a plurality of active fins, each of the active fins protruding from a top surface of an isolation layer on a substrate and extending in a first direction; a plurality of gate structures, each of the gate structures extending on the active fins and the isolation layer in a second direction substantially perpendicular to the first direction, and including a first portion on the isolation layer and a second portion on the active fins, a width of the first portion in the first direction being at least partially different from a width of the second portion in the first direction; and a spacer structure covering a sidewall of each of the gate structures.

A top surface of the first portion of each of the gate structures may be substantially coplanar with a top surface of the second portion of each of the gate structures, and a bottom of the first portion of each of the gate structures may be lower than a bottom of the second portion of each of the gate structures.

An upper portion of the first portion of each of the gate structures at a height substantially equal to the second portion of each of the gate structures may have a width substantially equal to the second portion of each of the gate structures, and a lower portion of the first portion of each of the gate structures at a height lower than that of the second portion of each of the gate structures may have a width greater than that of the second portion of each of the gate structures.

The first portion of each of the gate structures may include first, second, and third regions vertically disposed from the top surface of the isolation layer upwardly in this order, the first, second, and third regions may have third, second, and first widths, respectively, the second width may decrease from a bottom toward a top thereof, the second width may have a reduction rate changing according to height, the first width may be substantially equal to a width of the second portion of each of the gate structures.

The reduction rate of the second width may decrease from the bottom toward the top of the second region of each of the gate structures. The first and second regions of the first portion of each of the gate structures may be formed at heights equal to or lower than a bottom of the second portion of each of the gate structures. The spacer structure may include a gate spacer structure covering a sidewall of each of the gate structures in the first direction; and a fin spacer structure covering a sidewall of each of the active fins in the second direction.

In accordance with one or more other embodiments, a semiconductor device includes a plurality of active fins defined by an isolation layer on a substrate, each of the active fins extending in a first direction; a plurality of gate structures, each of the gate structures extending on the active fins and the isolation layer in a second direction substantially perpendicular to the first direction, and including first and third portions on the isolation layer and a second portion on the active fins; and a spacer structure covering a sidewall of each of the gate structures and including a nitride, wherein the third portion of each of the gate structures extends in the first direction and contacts a sidewall of each of the active fins, and has a width in the first direction greater than those of the first and second portions of each of the gate structures.

The spacer structure may include a gate spacer structure on sidewalls of the first and second portions of each of the gate structures in the first direction; and a fin spacer structure on sidewalls of each of the active fins in the second direction. The fin spacer structure may include a first fin spacer covering a top surface of the third portion of each of the gate structures; and a second fin spacer covering an outer sidewall of the first fin spacer. The gate spacer may cover a sidewall of the third portion of each of the gate structures. The gate spacer and the second fin spacer may include substantially a same material. The gate spacer and the second fin spacer may include a nitride. The gate spacer may have a sidewall substantially perpendicular to a top surface of the substrate.

In accordance with one or more embodiments, a method of manufacturing a semiconductor device includes forming an isolation layer on a substrate to define a plurality of active fins, each of the active fins extending in a first direction; forming a plurality of first gate structures on the active fins and the isolation layer, each of the first gate structures extending in a second direction substantially perpendicular to the first direction and including a first portion on the isolation layer, and a lower portion of the first portion of each of the first gate structures having a width in the first direction decreasing according to height, forming a first gate spacer on a sidewall of the first gate structure, the lower portion of the first portion of each of the first gate structures not being covered partially by the first gate spacer; removing the exposed lower portion of the first portion of each of the first gate structures using the first gate spacer as an etching mask; and forming a second gate spacer to cover the first gate spacer and a sidewall of the lower portion of the first portion of each of the first gate structures.

Forming a first gate spacer on a sidewall of the first gate structure may include forming a first gate spacer layer on the active fins and the isolation layer to cover the first gate structure; and anisotropically etching the first gate spacer layer. The first and second gate spacers may include a nitride or an oxide.

The first gate structure may include a dummy gate insulation pattern, a dummy gate electrode and a gate mask sequentially stacked, and the method may include after forming the second gate spacer: forming an insulating interlayer to cover the first gate structure and the first and second gate spacers; planarizing the insulating interlayer until the dummy gate electrode of the first gate structure is exposed; removing the exposed the dummy gate electrode and the dummy gate insulation pattern thereunder to form an opening exposing top surfaces of the active fins and the isolation layer; and forming a second gate structure to fill the opening.

Forming an opening may include removing the first gate spacer. Forming a second gate structure may include forming a gate insulation pattern on the exposed top surfaces of the active fins and the isolation layer and a sidewall of the opening, the gate insulation pattern including a high-k dielectric material; and forming a gate electrode to fill a remaining portion of the opening, the gate electrode including a metal.

The method may include, prior to the forming a gate insulation pattern, oxidizing the exposed top surfaces of the active fins to form an interface pattern. Forming a first gate spacer may include forming a first fin spacer on a sidewall of each of the active fins, removing the exposed lower portion of the first portion of each of the first gate structures using the first gate spacer as an etching mask includes: removing the exposed lower portion of the first portion of each of the first gate structures using the first gate spacer and the first fin spacer as an etching mask, so that a portion of the lower portion of the first portion of each of the first gate structures extending in the first direction remains on the isolation layer. Forming a second gate spacer may include forming the second gate spacer covering an outer sidewall of the first fin spacer, and a sidewall of the portion of the lower portion of the first portion of each of the first gate structures remaining on the isolation layer.

In accordance with one or more other embodiments, a semiconductor device includes a first active fin; a second active fin; an isolation layer between the first and second active fins; a gate structure on the first and second active fins; and a gate spacer structure covering the gate structure, wherein the gate structure includes a sidewall having a first region with a first slope, a second region with a second slope, and third region having a third slope, and wherein the first slope is different from at least one of the second slope or the second slope and the second slope is different from the third slope.

The first slope may be equal to or less than the third slope. The second slope may increase from a bottom to a top of the second region, the second slope may have a value at the bottom of the second region less than the first slope, and the third slope may be greater than the second slope. The gate spacer structure may include a first gate spacer covering the second and third regions; and a second gate spacer covering the first region and a sidewall of the first gate spacer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
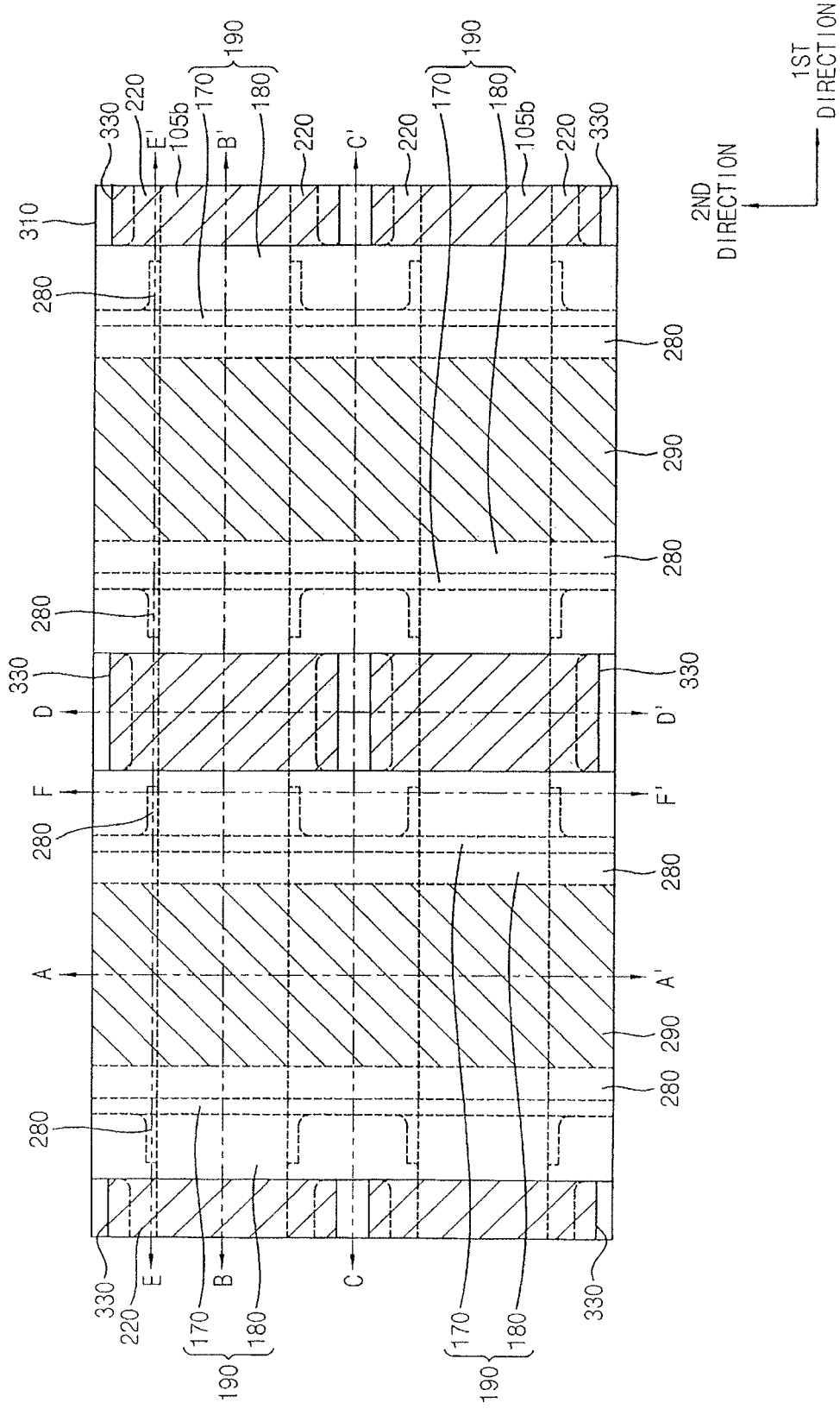
FIGS. 1 to 8 illustrate an embodiment of a semiconductor device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may not always illustrate the actual shape of a region of a device.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly faunal sense unless expressly so herein.

Figure 2:
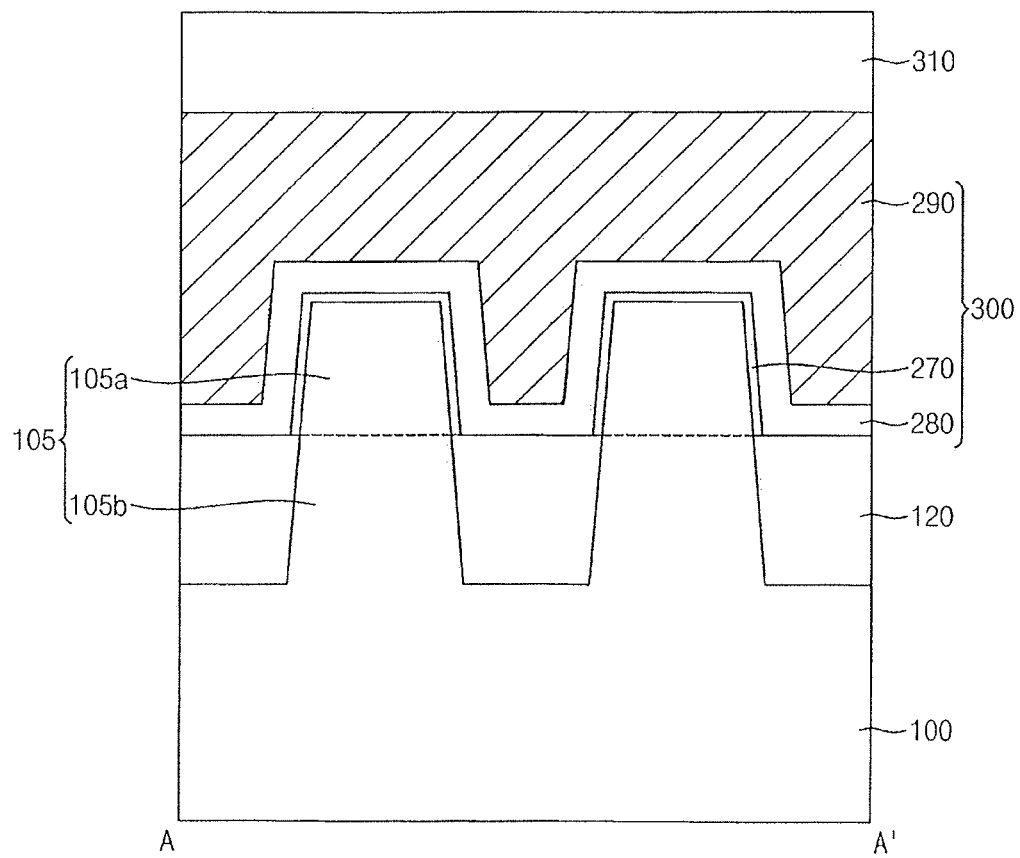
Figure 3:
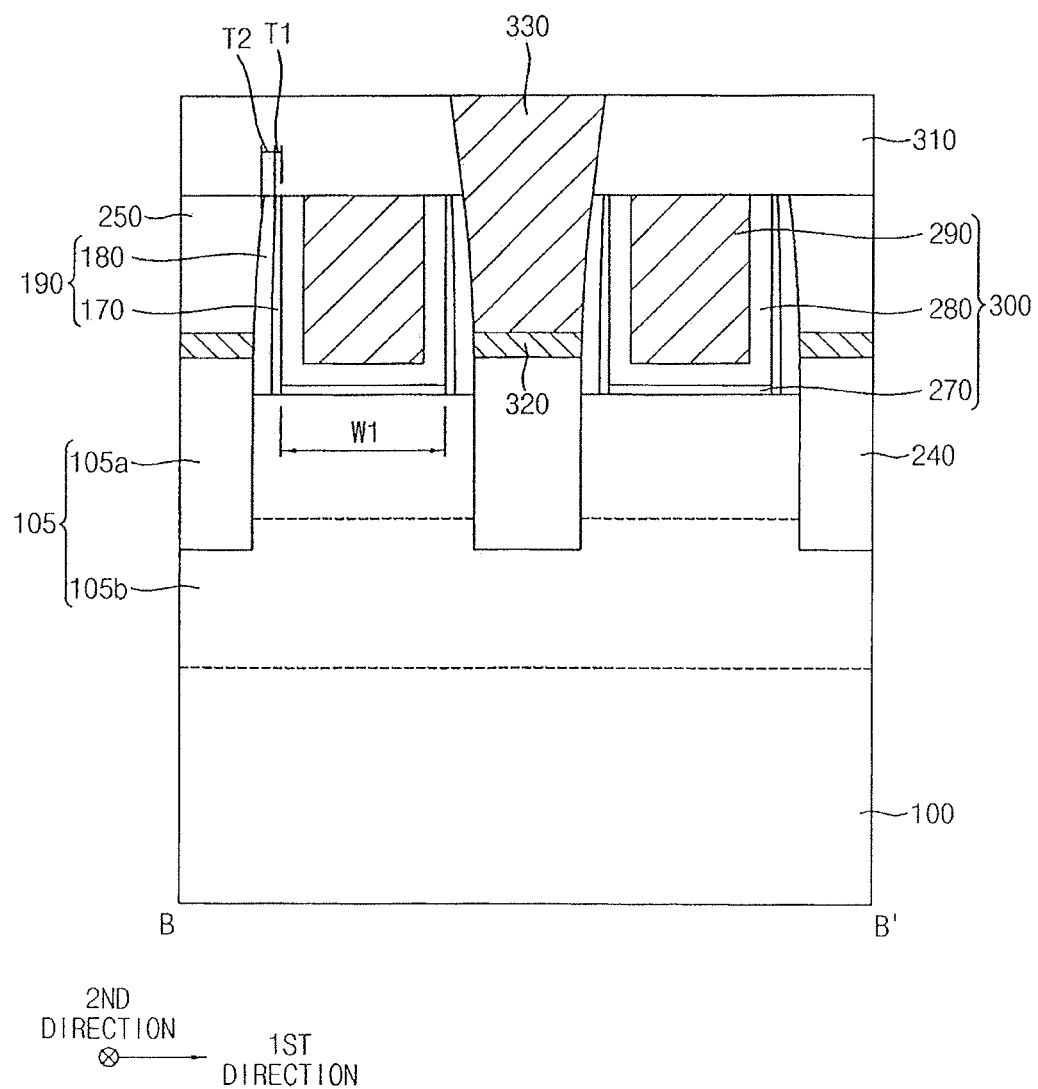
Figure 4:
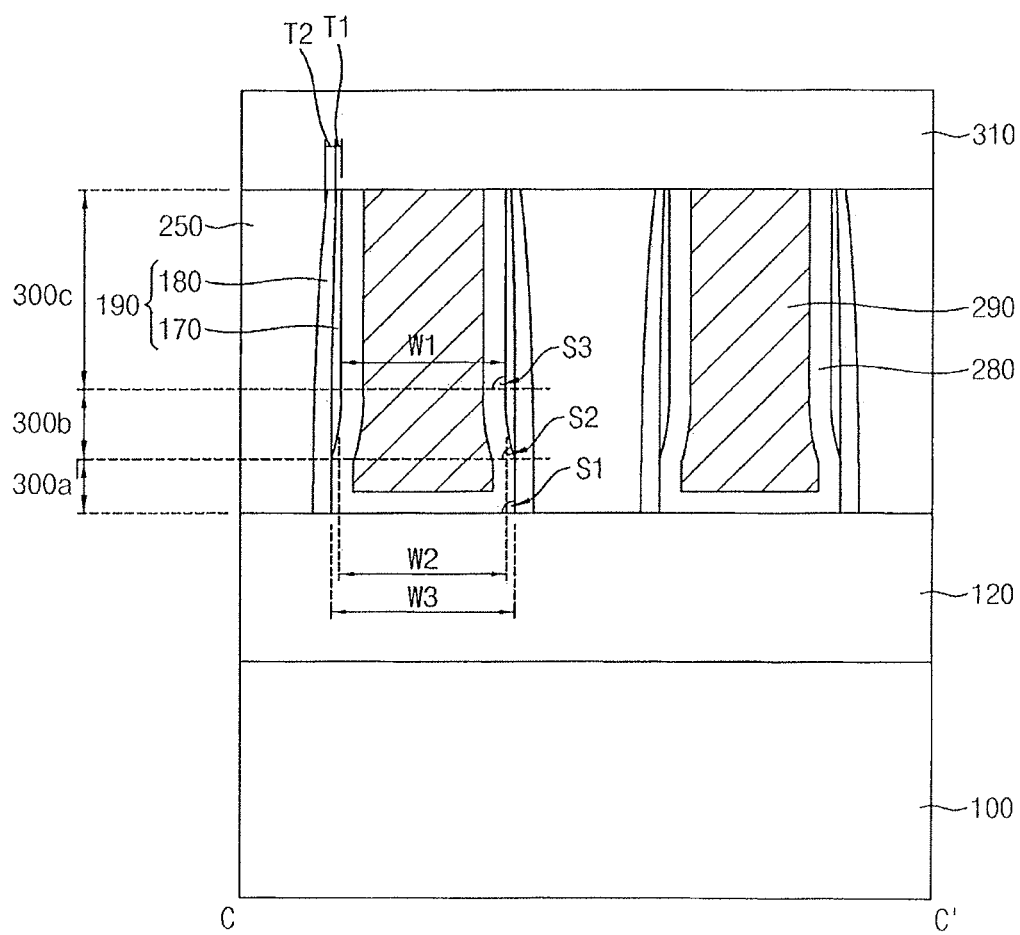
Figure 5:
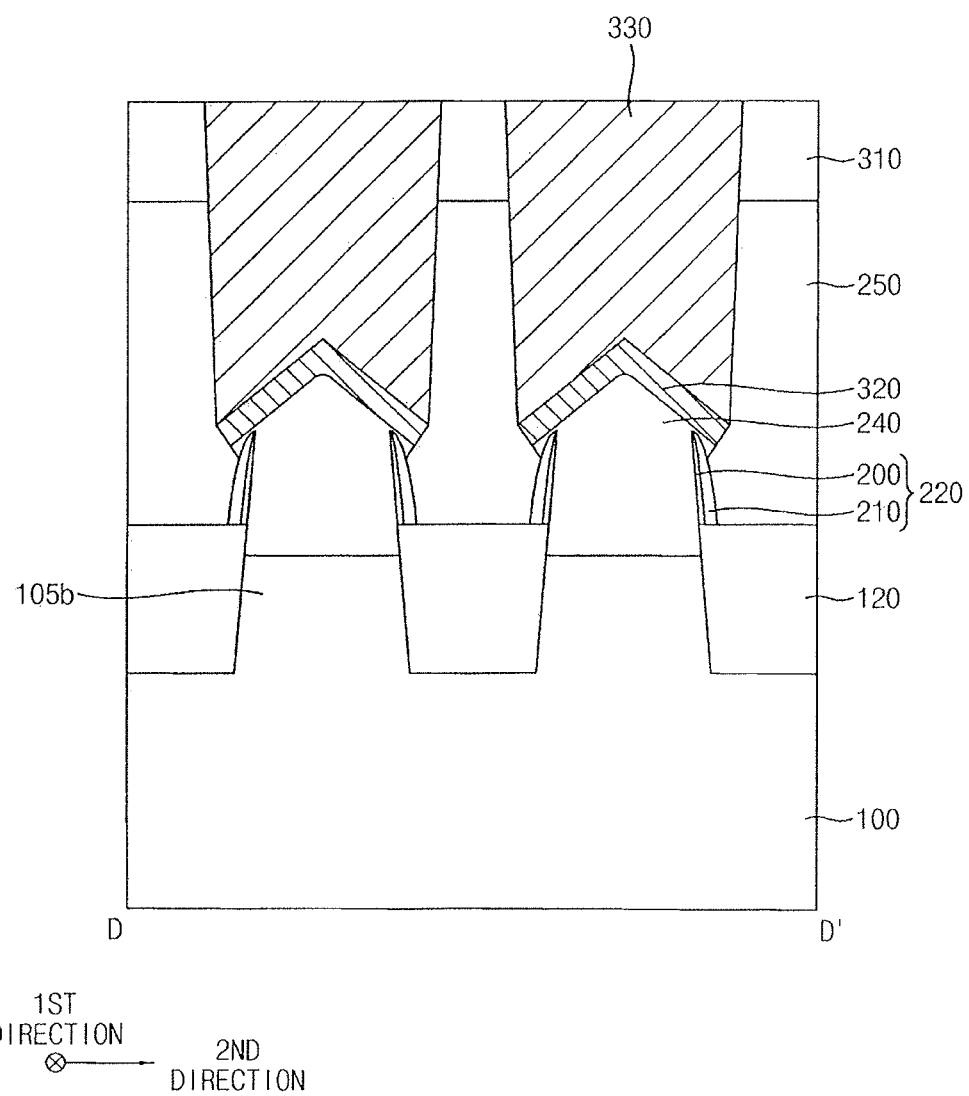
Figure 6:
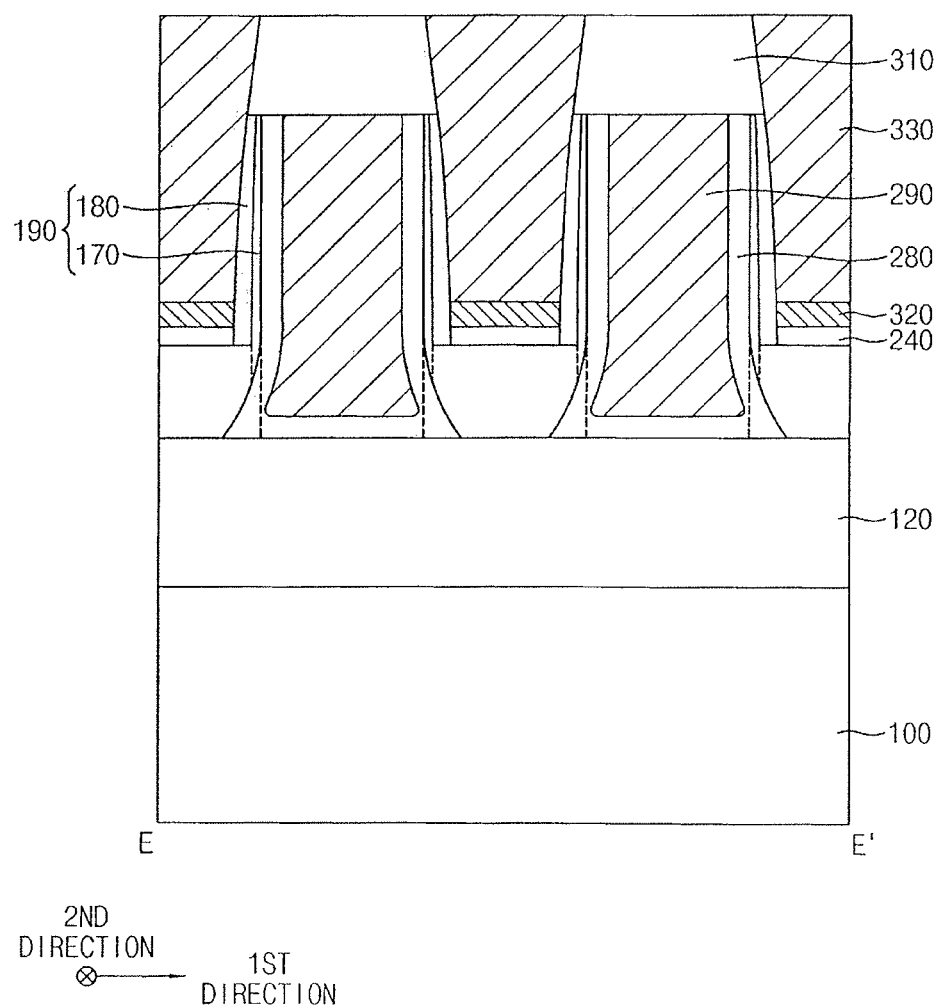
Figure 7:
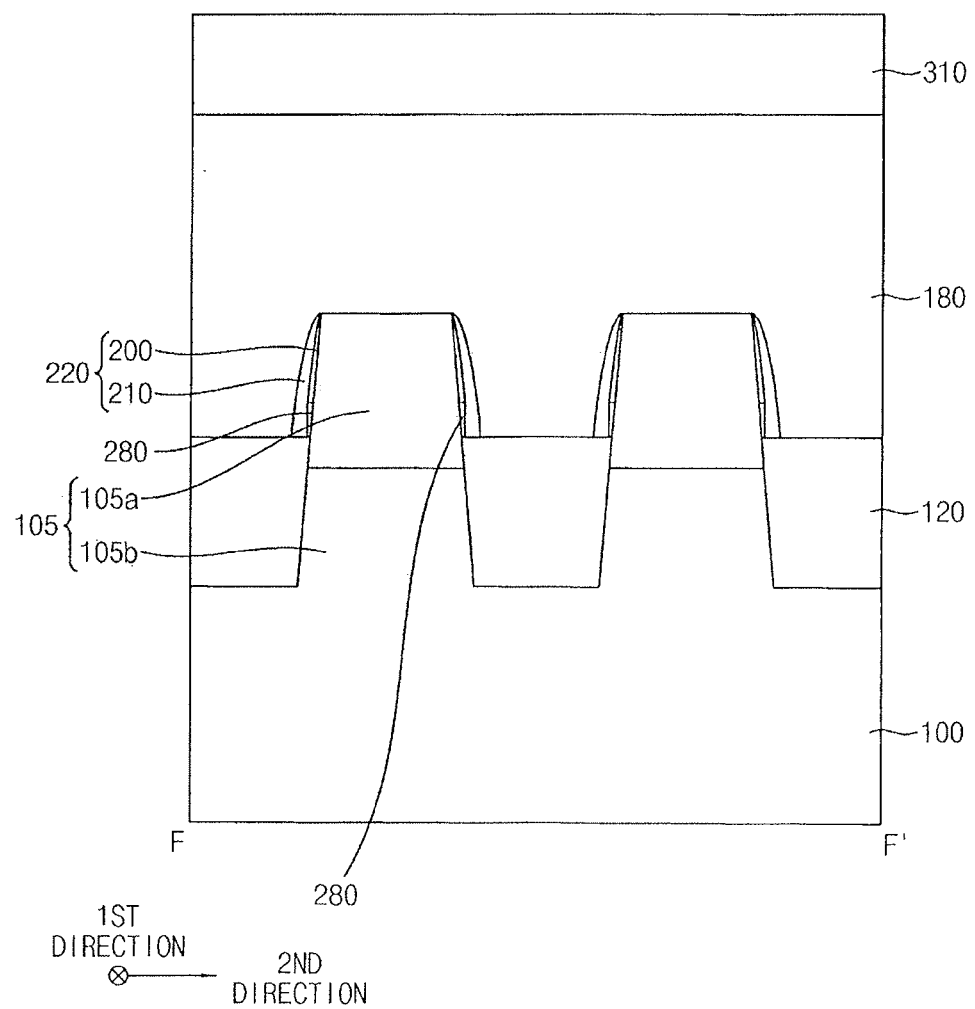
Figure 8:
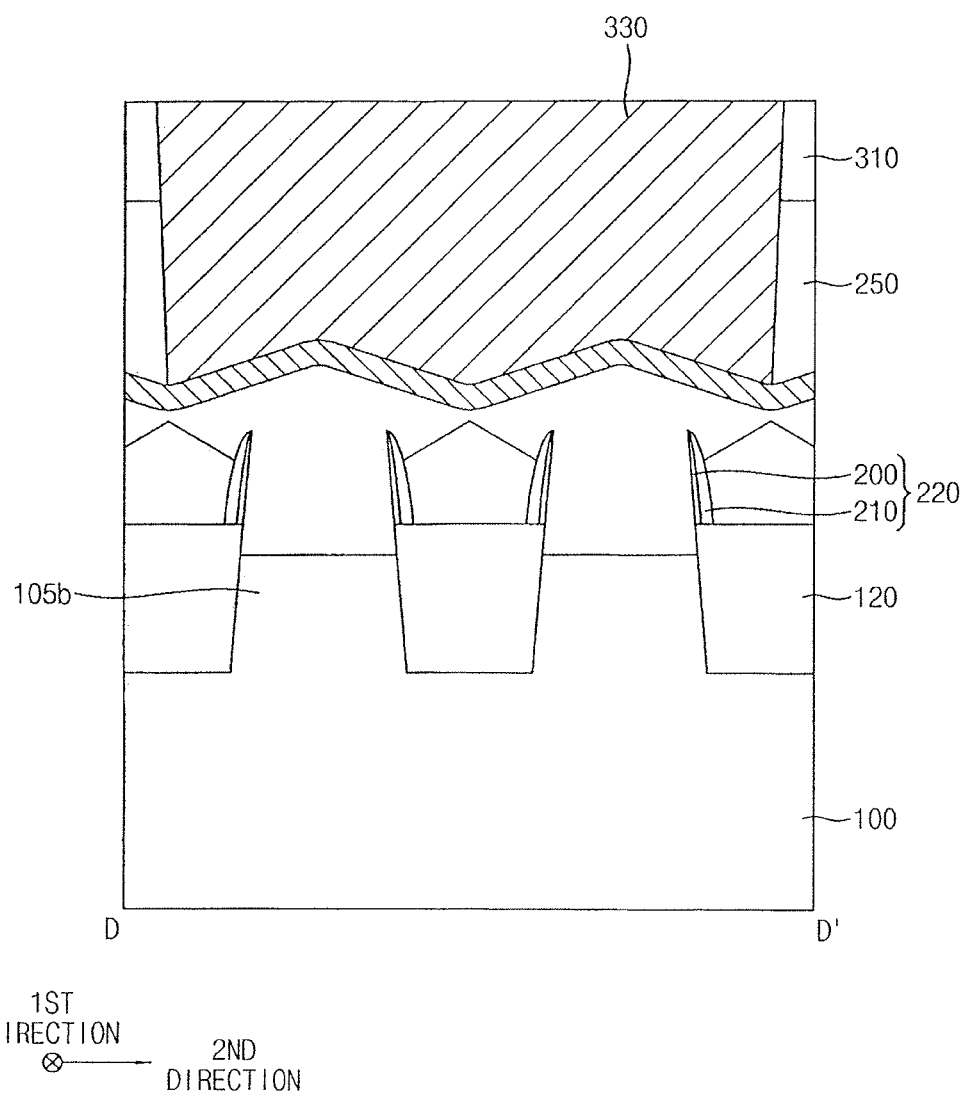

FIGS. 1 to 8 illustrate an embodiment of a semiconductor device. Particularly, FIG. 1 is a plan view illustrating the semiconductor device, and FIGS. 2 to 8 are cross-sectional views illustrating the semiconductor device. FIG. 2 is a cross-sectional view taken along a line A-A' of FIG. 1, FIG. 3 is a cross-sectional view taken along a line B-B' of FIG. 1, FIG. 4 is a cross-sectional view taken along a line C-C' of FIG. 1, FIGS. 5 and 8 are cross-sectional views taken along a line D-D' of FIG. 1, FIG. 6 is a cross-sectional view taken along a line E-E' of FIG. 1, and FIG. 7 is a cross-sectional view taken along a line F-F' of FIG. 1.

Referring to FIGS. 1 to 7, the semiconductor device includes an active fin 105, a gate structure 300, and a gate spacer structure 190 on a substrate 100. The semiconductor device also includes a fin spacer structure 220, a source/drain layer 240, a metal silicide pattern 320, a contact plug 330, and insulating interlayers 250 and 310.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate, or a germanium-on-insulator (GOI) substrate.

An isolation layer 120 may be formed on the substrate 100 to define a field region and an active region. The field region has a top surface covered by the isolation layer 120, and the active region has a top surface which may not be covered by the isolation layer 120. The active region has a fin-like shape protruding upwardly, and thus may be referred to as the active fin 105.

In example embodiments, the active fin 105 may extend in a first direction substantially parallel to a top surface of the substrate 100. A plurality of active fins 105 may be formed in a second direction, which may be substantially parallel to the top surface of the substrate 100 and which may cross the first direction. In example embodiments, the first and second directions may cross each other, for example, at a right angle, e.g., the first and second directions may be substantially perpendicular to each other.

In example embodiments, the active fin 105 may include lower and upper active patterns 105b and 105a sequentially stacked and integrally formed with each other. A sidewall of the lower active pattern 105b may be covered by the isolation layer 120. The upper active pattern 105a may protrude from a top surface of the isolation layer 120. In example embodiments, the lower active pattern 105b may have a width in the second direction slightly greater than that of the upper active pattern 105a.

The gate structure 300 may extend in the second direction and may be formed on the active fin 105 and the isolation layer 120. In example embodiments, a plurality of gate structures 300 may be formed in the first direction.

The gate structure 300 may include a first portion on the isolation layer 120 and a second portion on the active fin 105. The first and second portions of the gate structure 300 may be integrally formed so as not to be spaced apart from each other in the second direction. FIG. 3 shows a cross-section of the second portion of the gate structure 300, and FIG. 4 shows a cross-section of the first portion of the gate structure 300.

In example embodiments, top surfaces of the first and second portions of the gate structure 300 may be substantially coplanar with each other. A bottom surface of the first portion of the gate structure 300 may be lower than a bottom surface of the second portion of the gate structure 300. For example, the second portion of the gate structure 300 may be formed on the active fin 105 protruding from the top surface of the isolation layer 120. Thus, the bottom surface thereof may be higher than that of the first portion of the gate structure 300 on the isolation layer 120. In some embodiments, the top surface of the second portion of the gate structure 300 may be higher than that of the first portion of the gate structure 300.

A sidewall of the second portion of the gate structure 300 in the first direction may be substantially perpendicular to a top surface of the active fin 105. However, a sidewall of the first portion of the gate structure 300 in the first direction may not have a constant angle with respect to a top surface of the isolation layer 120, e.g., may not have a constant slope with respect to the top surface of the isolation layer 120. In at least one embodiment, both of a slope with respect to the top surface of the active fin 105 and a slope with respect to the top surface of the isolation layer 120 may be referred to as a slope with respect to the top surface of the substrate 100.

First, second, and third regions 300a, 300b, and 300c may be defined in the first portion of the gate structure 300 from the top surface of the isolation layer 120 upwardly in this order. The third region 300c of the first portion of the gate structure 300 may be formed at a height corresponding to that of the second portion of the gate structure 300. The first and second regions 300a and 300b of the gate structure 300 may be formed at a height lower than that of the second portion of the gate structure 300. For example, a bottom of the third region 300c of the first portion of the gate structure 300 may be formed at a height substantially the same as that of a bottom of the second portion of the gate structure 300. Alternatively, the bottom of the third region 300c of the first portion of the gate structure 300 may be formed at a height slightly lower than that of the bottom of the second portion of the gate structure 300.

Sidewalls of the first, second, and third regions 300a, 300b, and 300c in the first direction may have first, second, and third slopes S1, S2, and S3, respectively, with respect to the top surface of the substrate 100. In example embodiments, the third slope S3 may be about 90 degrees with respect to the top surface of the substrate 100. The first slope S1 may be equal to or less than the third slope S3. The second slope S2 may vary according to height. In example embodiments, the second slope S2 of the second region 300b may be less than the first slope S1 at an interface between the first and second regions 300a and 300b, may increase according to the height thereof, and may be substantially the same as the third slope S3 at an interface between the second and third regions 300b and 300c.

Since the first portion of the gate structure 300 may have the slopes S1, S2, and S3 varying according to the height, the first portion of the gate structure 300 may have a width in the first direction varying according to the height. For example, the first, second, and third regions 300a, 300b, and 300c of the first portion of the gate structure 300 may have first, second, and third widths W1, W2, and W3, respectively, in the first direction. In example embodiments, the third width W3 may be substantially the same as that of the second portion of the gate structure 300. The second width W2 of the second region 300b may be greater than the third width W3 of the third region 300c. The first width W1 of the first region 300a may be greater than the second width W2 of the second region 300b. The second width W2 of the second region 300b may decrease according to the height thereof, and a rate of reduction may also decrease according to the height thereof.

As mentioned above, the sidewalls of the first and second portions of the gate structure 300 may have slopes that are at least partially different from each other. Also, the first and second portions of the gate structure 300 may have widths that are at least partially different from each other.

The gate structure 300 may include an interface pattern 270, a gate insulation pattern 280, and a gate electrode 290 sequentially stacked. The gate spacer structure 190 may cover the sidewall of the gate structure 300.

In example embodiments, the interface pattern 270 may be formed only on a top surface of the active fin 105. The gate insulation pattern 280 may be formed on the interface pattern 270, the isolation layer 120, and an inner sidewall of the gate spacer structure 190. Alternatively, the interface pattern 270 may be formed not only on the active fin 105, but also on the isolation layer 120 and the inner sidewall of the gate spacer structure 190. In some cases, the interface pattern 270 may not be formed, and thus the gate structure 300 may not have an interface pattern therein. A bottom and a sidewall of the gate electrode 290 may be covered by the gate insulation pattern 280.

The interface pattern 270 may include an oxide (e.g., silicon oxide), the gate insulation pattern 280 may include a metal oxide having a high dielectric constant (e.g., hafnium oxide, tantalum oxide, zirconium oxide, etc.), and the gate electrode 290 may include a metal having a low electrical resistance, e.g., aluminum, copper, tantalum, etc., or a metal nitride.

FIG. 4 illustrates that the first portion of the gate structure 300 has a width and sidewall slope that varies according to height. As a result, the gate electrode 290 may have a width and a sidewall slope that varies according to height.

The gate spacer structure 190 may include first and second gate spacers 170 and 180. In example embodiments, the first gate spacer 170 may cover the sidewall of the second portion of the gate structure 300 and the sidewalls of the second and third regions 300b and 300c of the first portion of the gate structure 300. Thus, an inner sidewall of the first gate spacer 170 may have a shape corresponding to those of the sidewalls of the second and third regions 300b and 300c of the first portion of the gate structure 300.

Additionally, the second gate spacer 180 may cover an outer sidewall of the first gate spacer 170 and the sidewall of the first region 300a of the first portion of the gate structure 300. Thus, the sidewall of the gate structure 300 may not be exposed.

The first and second gate spacers 170 and 180 may have first and second thicknesses T1 and T2, respectively, in the first direction. In example embodiments, the first thickness T1 may be less than the second thickness T2. In another embodiment, the first thickness T1 may be equal to or greater than the second thickness T2.

The first and second gate spacers 170 and 180 may include a nitride, e.g., silicon nitride, silicon oxynitride, silicon oxycarbonitride, etc., or an oxide, e.g., silicon oxide. The first and second gate spacers 170 and 180 may include materials substantially the same as or different from each other.

The source/drain layer 240 may be formed on the active fin 105 adjacent the gate structure 290 extending in the second direction. The source/drain layer 240 may fill a recess formed at the upper active pattern 105a and/or the lower active pattern 105b. An upper portion of the source/drain layer 240 may contact an outer sidewall of the second gate spacer 180. In example embodiments, the cross-section of an upper portion of the source/drain layer 240 along the second direction may have a shape of pentagon or hexagon.

Referring to FIG. 8, when the active fins 105 are spaced apart from each other in the second direction at a short distance (e.g., less than a predetermined distance), the source/drain layers 240 grown from the respective active fins 105 may merge with each other.

In example embodiments, the source/drain layer 240 may include single crystalline silicon-germanium doped with p-type impurities. In another embodiment, the source/drain layer 240 may include single crystalline silicon carbide doped with n-type impurities, or single crystalline silicon doped with n-type impurities.

The metal silicide pattern 320 may be formed on the source/drain layer 240 and may include a metal silicide, e.g., cobalt, nickel, etc.

The fin spacer structure 220 may cover a sidewall of the active fin 105 (e.g., a sidewall of the upper active pattern 105a in the second direction) and a lower sidewall of the source/drain layer 240 in the second direction. For example, the fin spacer structure 220 may cover the lower sidewall of the source/drain layer 240 at a region in which the source/drain layer 240 is formed between the gate spacer structures 190 on the active fin 105, and may cover the sidewall of the active fin 105 at a region in which the source/drain layer 240 is not formed under the second gate spacer 180.

In example embodiments, the fin spacer structure 220 may include first and second fin spacers 200 and 210. The first fin spacer 200 may cover the sidewall of the upper active pattern 105a in the second direction and the sidewall of the source/drain layer 240 in the second direction. The second fin spacer 210 may cover an outer sidewall of the first fin spacer 200.

In example embodiments, top surfaces of the first and second fin spacers 200 and 210 may be lower than those of the first and second gate spacers 170 and 180, respectively. The first and second fin spacers 200 and 210 may include materials substantially the same as those of the first and second gate spacers 170 and 180, respectively, and thus may be merged therewith.

A third portion of the second portion of the gate structure 300, which may contact the active fin 105, may have a shape different from those of others in the second portion of the gate structure 300. Thus, hereinafter, the third portion will be illustrated independently from the second portion. For example, the third portion in the second portion of the gate structure 300 on the isolation layer 120 may extend in the first direction. Thus, the third portion of the gate structure 300 may have a width in the first direction greater than those of the first and second portions of the gate structure 300.

A top surface of the third portion of the gate structure 300 may be covered by the first fin spacer 200. A sidewall of the third portion of the gate structure 300 may be covered by the second gate spacer 180. Thus, the third portion of the gate structure 300 may not be exposed.

The first insulating interlayer 250 may be formed on the substrate 100 and may cover the source/drain layer 240 and the metal silicide pattern 320. The first insulating interlayer 250 may also cover an outer sidewall of the gate spacer structure 190 on the sidewalls of the gate structure 300. The second insulating interlayer 310 may be formed on the first insulating interlayer 250, the gate structure 300, and the gate spacer structure 190. The first and second insulating interlayers 250 and 310 may include an oxide, e.g., silicon oxide.

The contact plug 330 may penetrate through the first and second insulating interlayers 250 and 310 and may contact the metal silicide pattern 320. The contact plug 330 may include a metal, a metal nitride, doped polysilicon, etc.

As illustrated above, in the semiconductor device, the sidewall of the gate structure 300 may be completely covered by the spacer structure including the gate spacer structure 190 and the fin spacer structure 220. Thus, the gate structure 300 may not contact the source/drain layer 240 and/or the metal silicide pattern 320 thereon. Thus, the formation of an electrical short may be prevented.

FIGS. 9 to 49 illustrate stages of an embodiment of method for manufacturing a semiconductor device. Particularly, FIGS. 9, 11, 15, 21, 25, 31, 33, 36, 38, 42 and 46 are plan views, and FIGS. 10, 12-14, 16-20, 22-24, 26-30, 32, 34-35, 37, 39-41, 43-45 and 47-49 are cross-sectional views. FIGS. 10, 12, 43 and 47 are cross-sectional views taken along lines A-A' of corresponding plan views, respectively, FIGS. 13, 16, 26, 34, 39, 44 and 48 are cross-sectional views taken along lines B-B' of corresponding plan views, respectively, FIGS. 14, 17, 19, 20, 22-24, 27, 29-30, 40, 45 and 49 are cross-sectional views taken along lines C-C' of corresponding plan views, respectively, and FIGS. 18, 28, 32, 35, 37 and 41 are cross-sectional views taken along lines D-D' of corresponding plan views, respectively.

Figure 9:
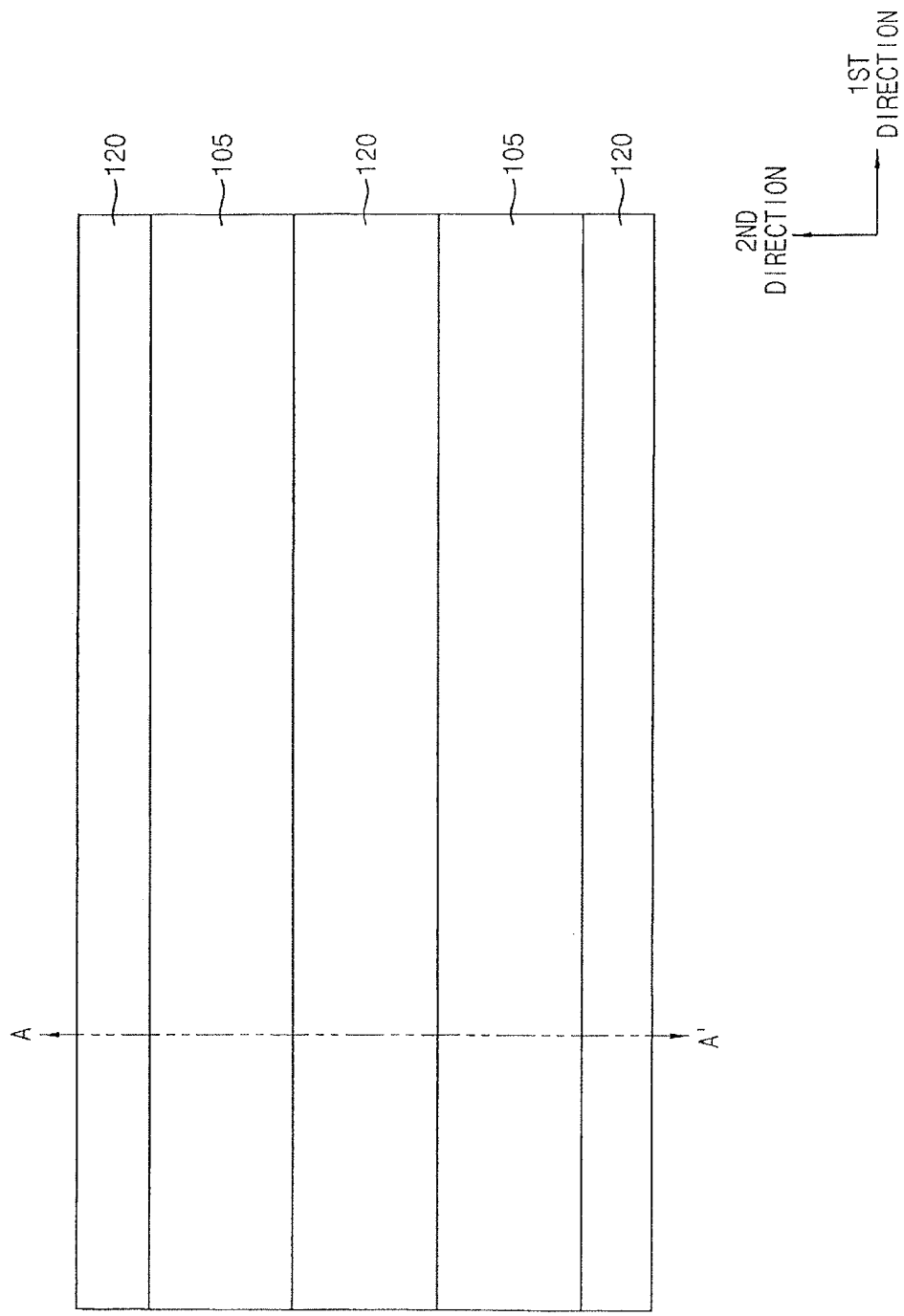
FIGS. 9 to 49 illustrate various an embodiment of a method for manufacturing a semiconductor device.
Figure 10:
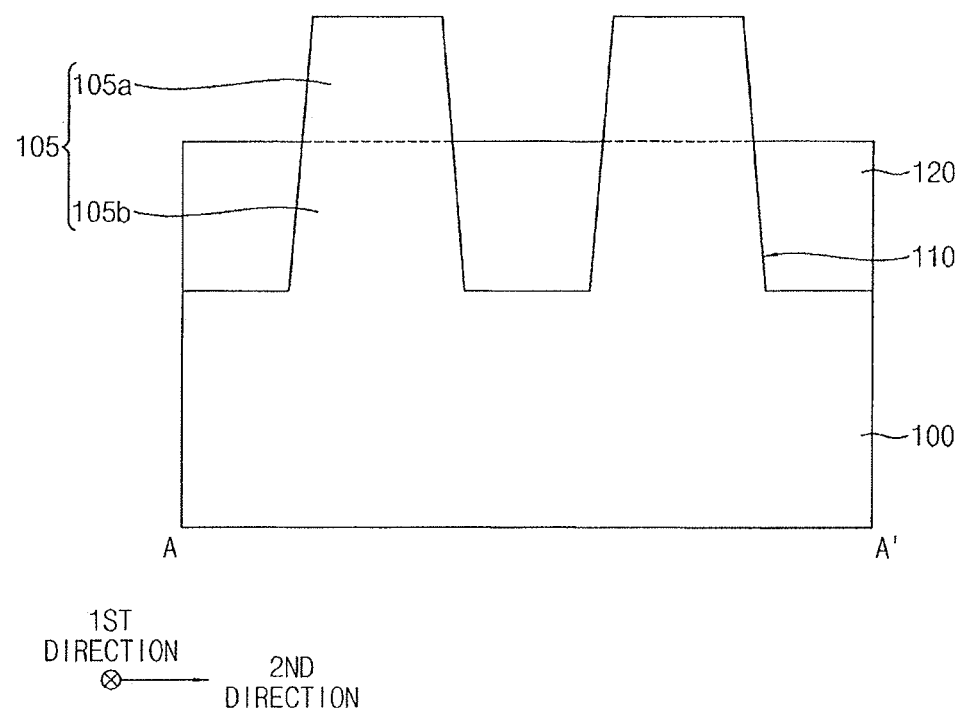
Figure 11:
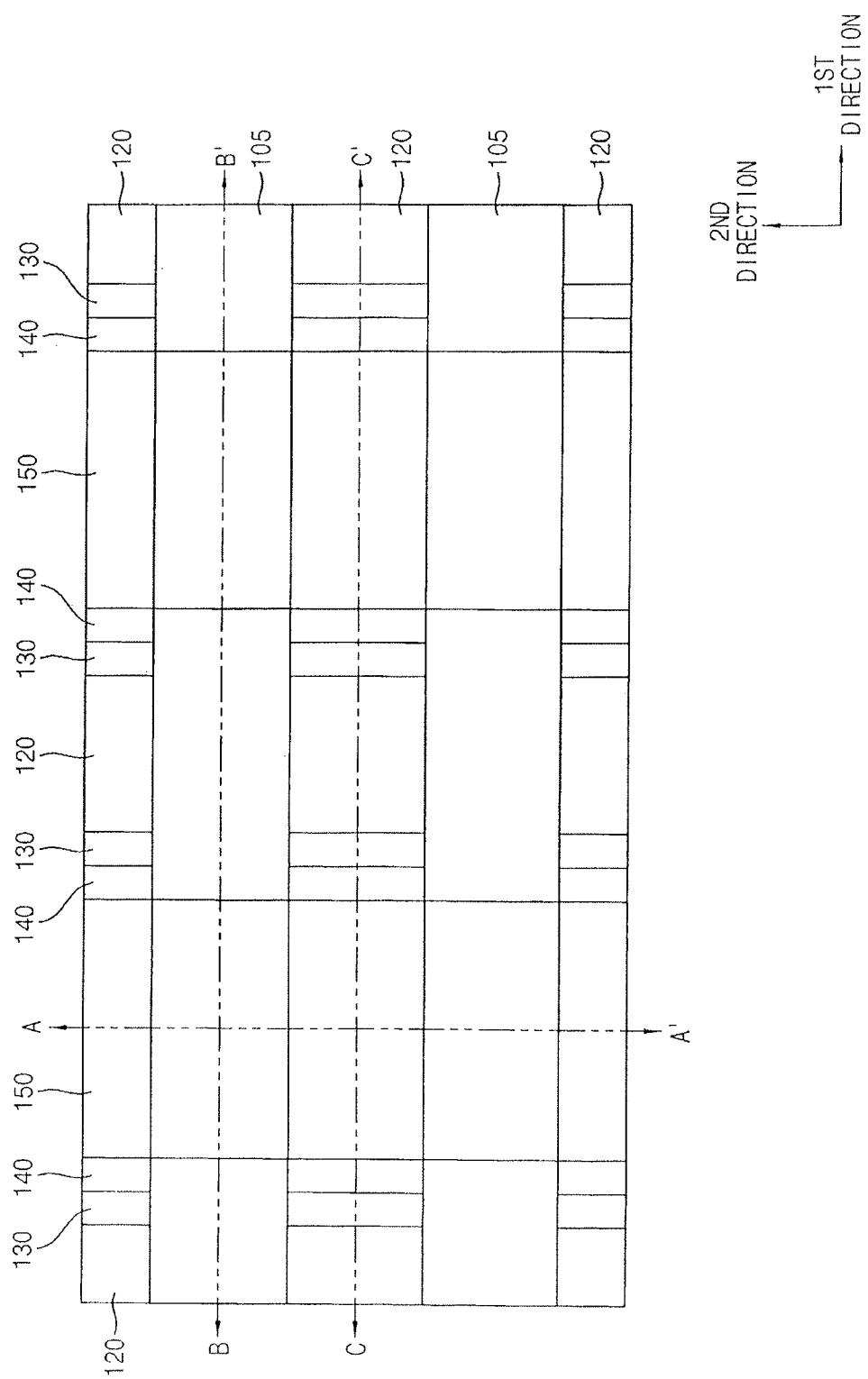
Figure 12:
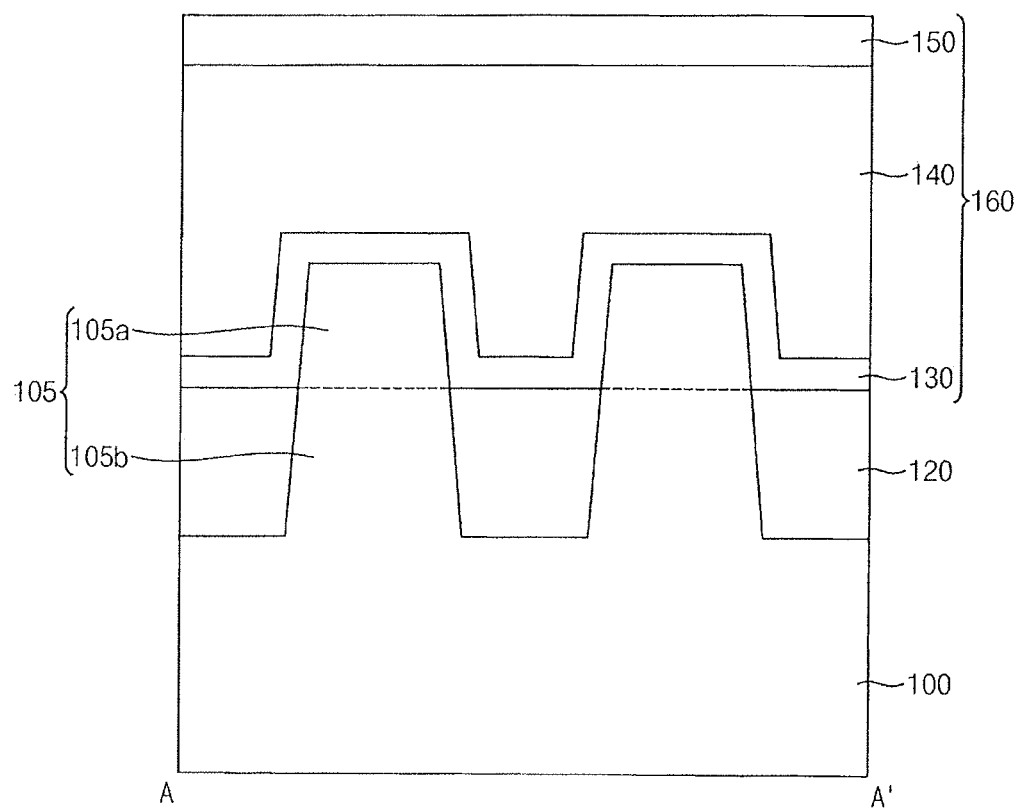
Figure 13:
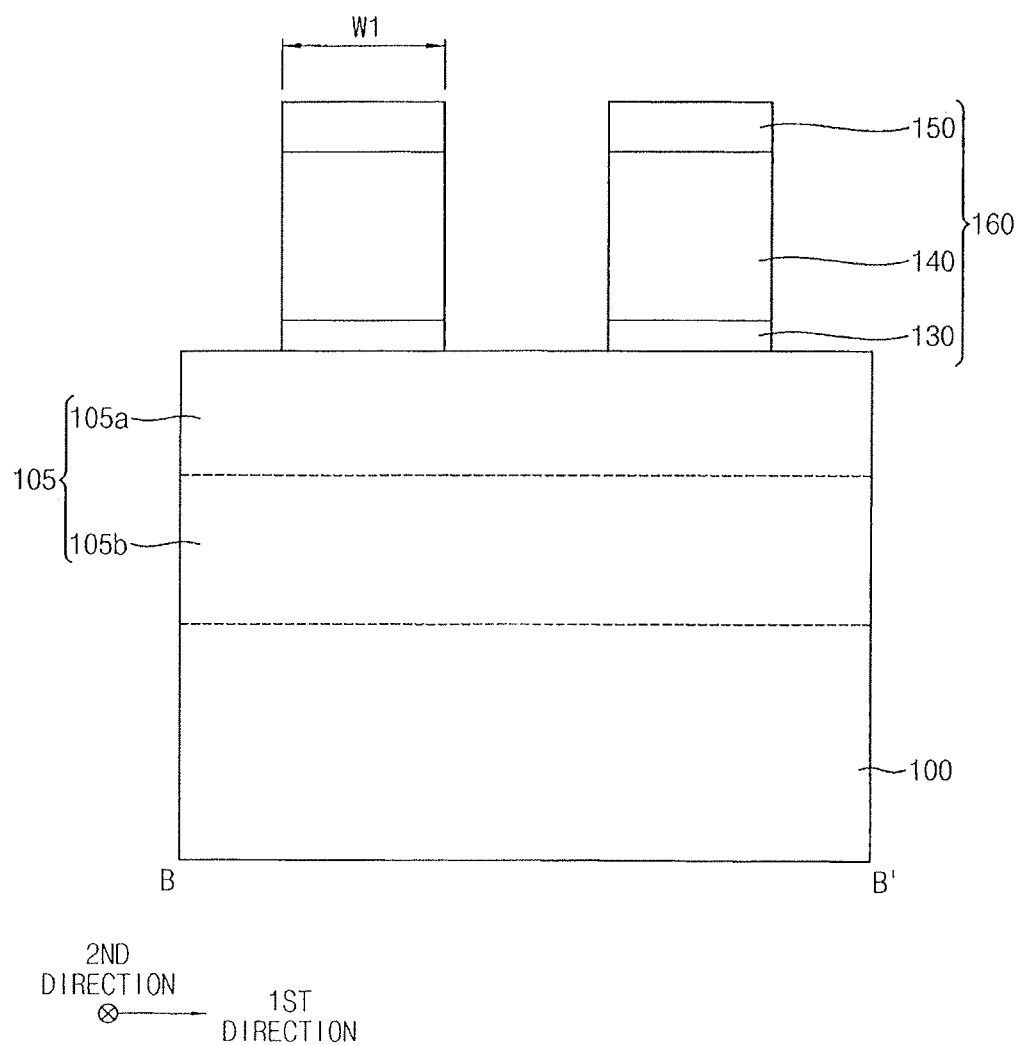
Figure 14:
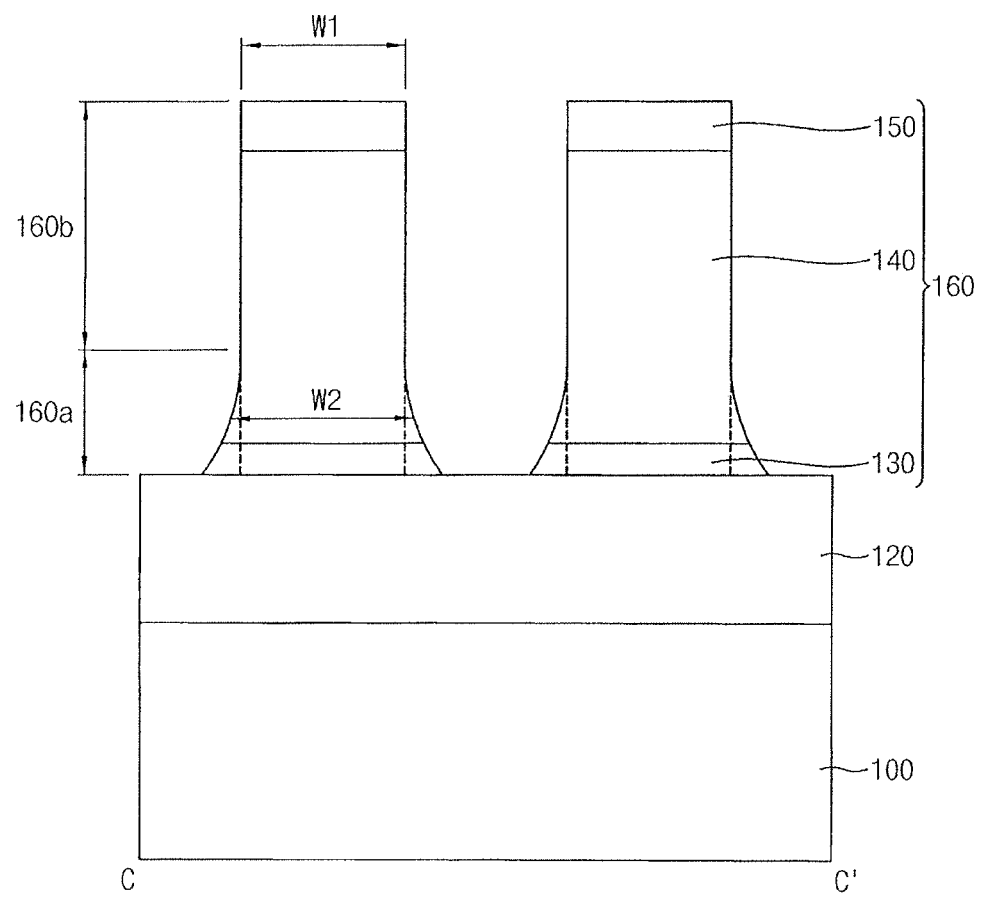
Figure 15:
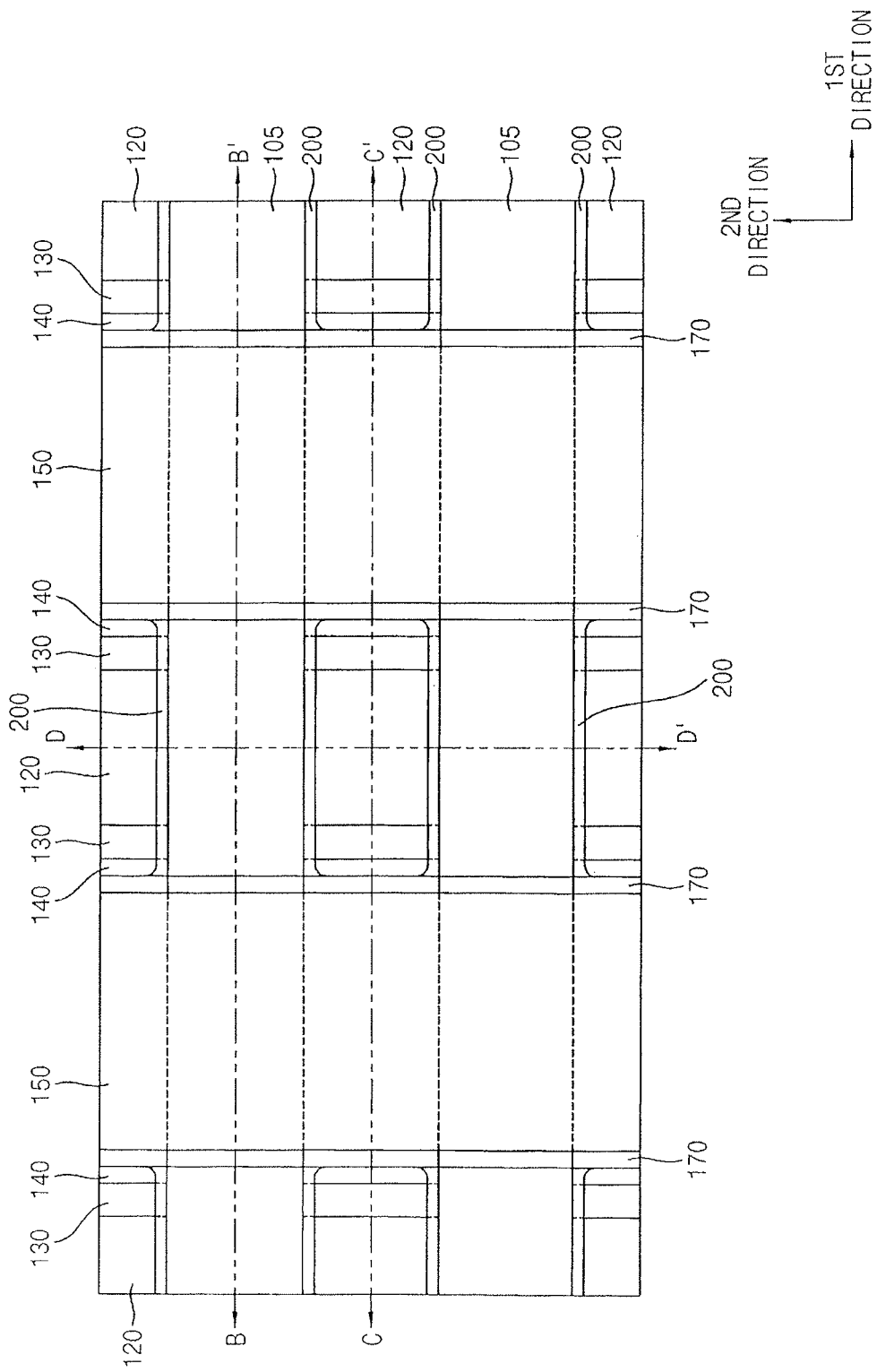
Figure 16:
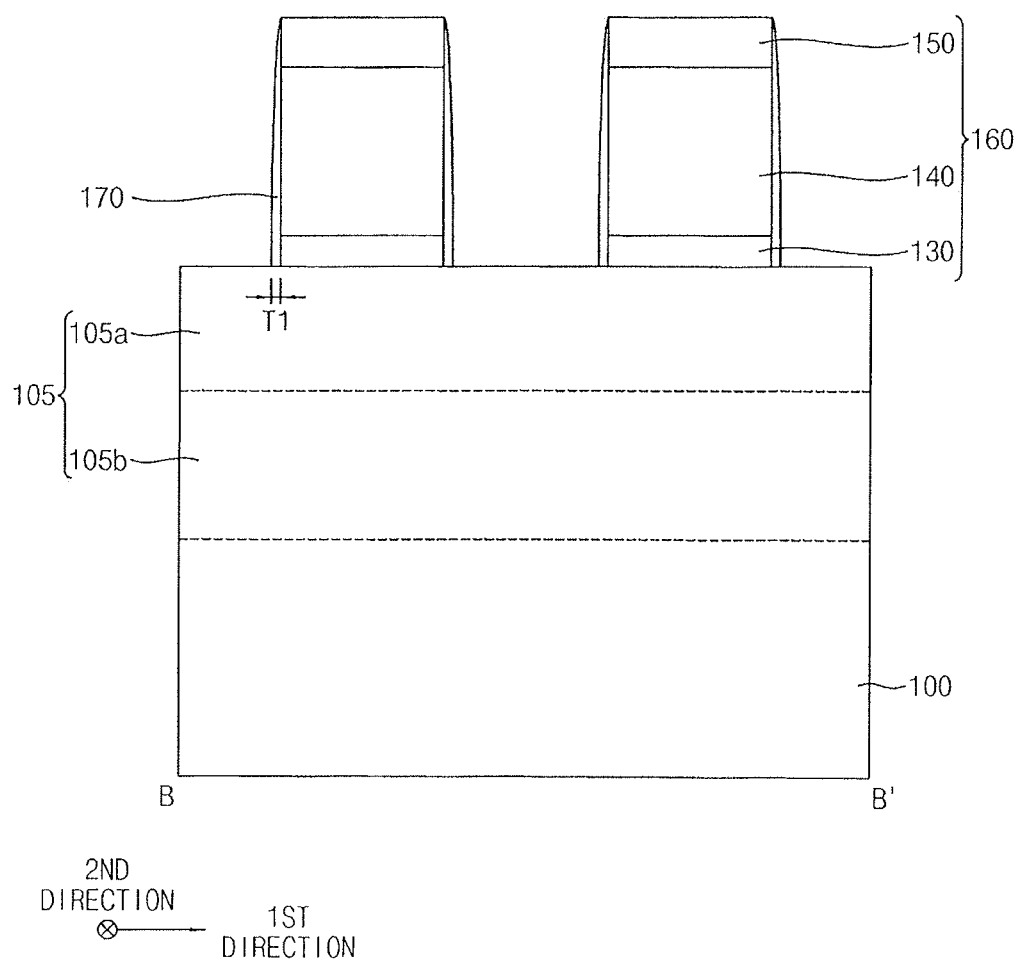
Figure 17:
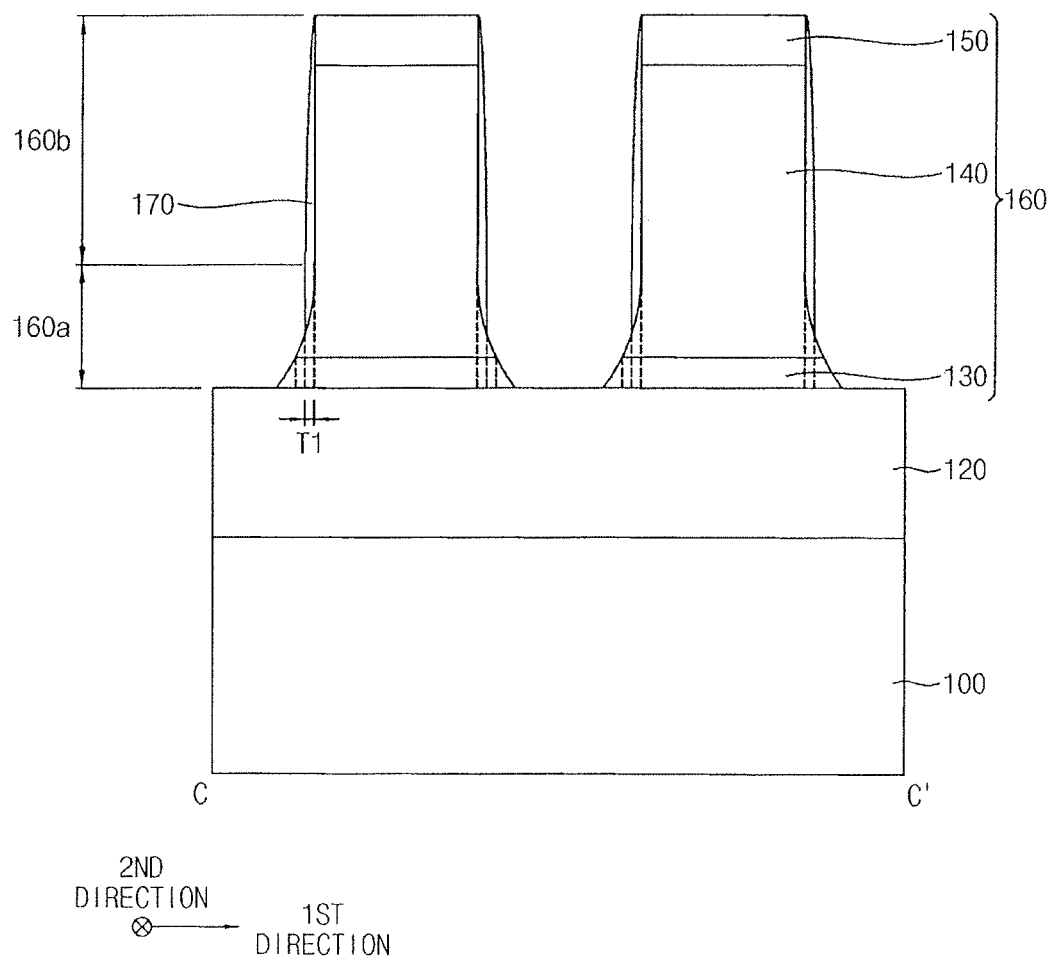
Figure 18:
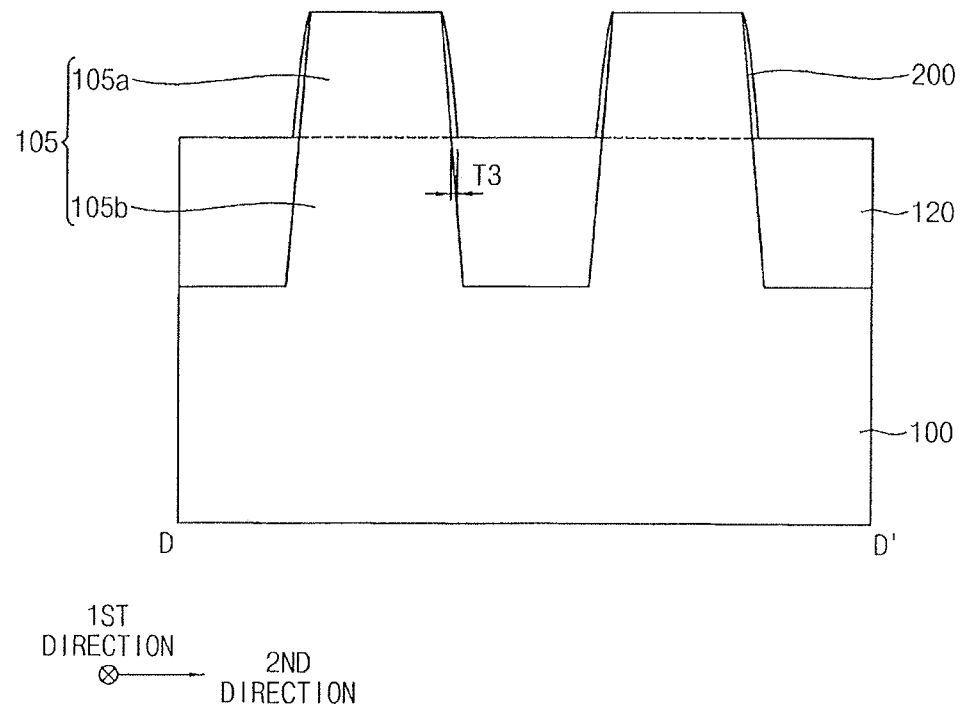

Referring to FIGS. 9 and 10, an upper portion of a substrate 100 may be partially removed to form a first trench 110, and an isolation layer 120 may be formed to fill a lower portion of the first trench 110. The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be an SOI substrate or a GOI substrate.

In example embodiments, the isolation layer 120 may be formed by forming an insulation layer on the substrate 100 to sufficiently fill the first trench 110, planarizing the insulation layer until a top surface of the substrate 100 may be exposed, and removing an upper portion of the insulation layer to expose an upper portion of the first trench 110. When the upper portion of the insulation layer is removed, a portion of the substrate 100 adjacent thereto may be also removed. Thus, a width of a portion of the substrate 100 having a sidewall not be covered by the isolation layer 120 may be less than a width of a portion of the substrate 100 having a sidewall covered by the isolation layer 120. The insulation layer may be formed of an oxide, e.g., silicon oxide.

As the isolation layer 120 is formed on the substrate 100, a field region having a top surface covered by the isolation layer 120, and an active region having a top surface not covered by the isolation layer 120, may be defined in the substrate 100. The active region may be also referred to as an active fin 105.

In example embodiments, the active fin 105 may extend in a first direction substantially parallel to a top surface of the substrate 100. A plurality of active fins 105 may be formed in a second direction, which may be substantially parallel to the top surface of the substrate 100 and cross the first direction. In example embodiments, the first and second directions may be substantially perpendicular to each other.

In example embodiments, the active fin 105 may include lower and upper active patterns 105b and 105a sequentially stacked and integrally formed with each other. A sidewall of the lower active pattern 105b may be covered by the isolation layer 120. The upper active pattern 105a may protrude from top surfaces of the isolation layer 120. In example embodiments, the lower active pattern 105b may have a width in the second direction slightly greater than that of the upper active pattern 105a.

Referring to FIGS. 11 to 14, a dummy gate structure 160 may be formed on the substrate 100. The dummy gate structure 160 may be formed by sequentially forming a dummy gate insulation layer, a dummy gate electrode layer, and a gate mask layer on the active fin 105 of the substrate 100 and the isolation layer 120, patterning the gate mask layer by a photolithography process using a photoresist pattern to form a gate mask 150, and sequentially etching the dummy gate electrode layer and the dummy gate insulation layer using the gate mask 150 as an etching mask. Thus, the dummy gate structure 160 may be fainted to include a dummy gate insulation pattern 130, a dummy gate electrode 140, and the gate mask 150 sequentially stacked on the active fin 105 and a portion of the isolation layer 120 adjacent the active fin 105 in the second direction.

The dummy gate insulation layer may be formed of an oxide (e.g., silicon oxide), the dummy gate electrode layer may be formed of, e.g., polysilicon, and the gate mask layer may be formed of a nitride, e.g., silicon nitride. The dummy gate insulation layer may be formed by a chemical vapor deposition (CVD) process, an atomic layer deposition (ALD) process, or the like. Alternatively, the dummy gate insulation layer may be formed by a thermal oxidation process on an upper portion of the substrate 100. In this case, the dummy gate insulation layer may be formed only on the active fin 105. The dummy gate electrode layer and the gate mask layer may be formed by a CVD process, an ALD process, etc.

In example embodiments, the dummy gate structure 160 may be formed to extend in the second direction on the active fins 105 of the substrate 100 and the isolation layer 120. A plurality of dummy gate structures 160 may be formed to be spaced apart from each other in the first direction. As a distance between the active fins 105 adjacent to each other in the second direction is short (e.g., below a predetermined distance), portions of the dummy gate insulation layer and the dummy gate electrode layer between the neighboring active fins 105 may not be etched well. Thus, a portion of the dummy gate structure 160 between the active fins 105 (e.g., a portion of the dummy gate structure 160 on the isolation layer 120) may have a width increasing toward a bottom thereof.

For example, a portion of the dummy gate structure 160 on the active fin 105 may have a first width W1 in the first direction. A second region 160*b*, which may be an upper portion of the portion of the dummy gate structure 160 on the isolation layer 120, may have the first width W1 in the first direction. A first region 160*a*, which may be a lower portion of the portion of the dummy gate structure 160 on the isolation layer 120, may have a second width W2 in the first direction greater than the first width W1. The second width W2 may increase from a top toward a bottom of the second region 160*b*, and a rate of increase of the second width W2 may also increase from the top toward the bottom of the second region 160*b*.

An ion implantation process may be further performed to form an impurity region at an upper portion of the active fin 105 adjacent the dummy gate structure 160.

Referring to FIGS. 15 to 18, a first gate spacer 170 and a first fin spacer 200 may be formed on sidewalls of the dummy gate structure 160 and the active fin 105, respectively. In example embodiments, the first gate spacer 170 and the first fin spacer 200 may be formed by forming a first spacer layer on the dummy gate structure 160, the active fin 105, and the isolation layer 120, and anisotropically etching the spacer layer. Thus, the first gate spacer 170 and the first fin spacer 200 may not be differentiated from each other and may be merged with each other. The first spacer layer may be formed of a nitride, e.g., silicon nitride, silicon oxynitride, silicon oxycarbonitride, etc., or an oxide, e.g., silicon oxide.

The first gate spacer 170 may be formed on the sidewalls of the dummy gate structure 160 opposed to each other in the first direction. The first fin spacer 200 may be formed on the sidewalls of the active fin 105 opposed to each other in the second direction.

In example embodiments, the first gate spacer 170 and the first fin spacer 200 may be formed to have first and third thicknesses T1 and T3, respectively, in the first and second directions, respectively. The first gate spacer 170 may not completely cover the first region 160*a* of the portion of the dummy gate structure 160 on the isolation layer 120, which may have a thickness greater than that of the second region 160*b* of the portion of the dummy gate structure 160 on the isolation layer 120. Thus, a portion of the second region 160*b* of the dummy gate structure 160, particularly, a portion of the dummy gate insulation pattern 130 and a portion of the dummy gate electrode 140, may be exposed.

Figure 19:
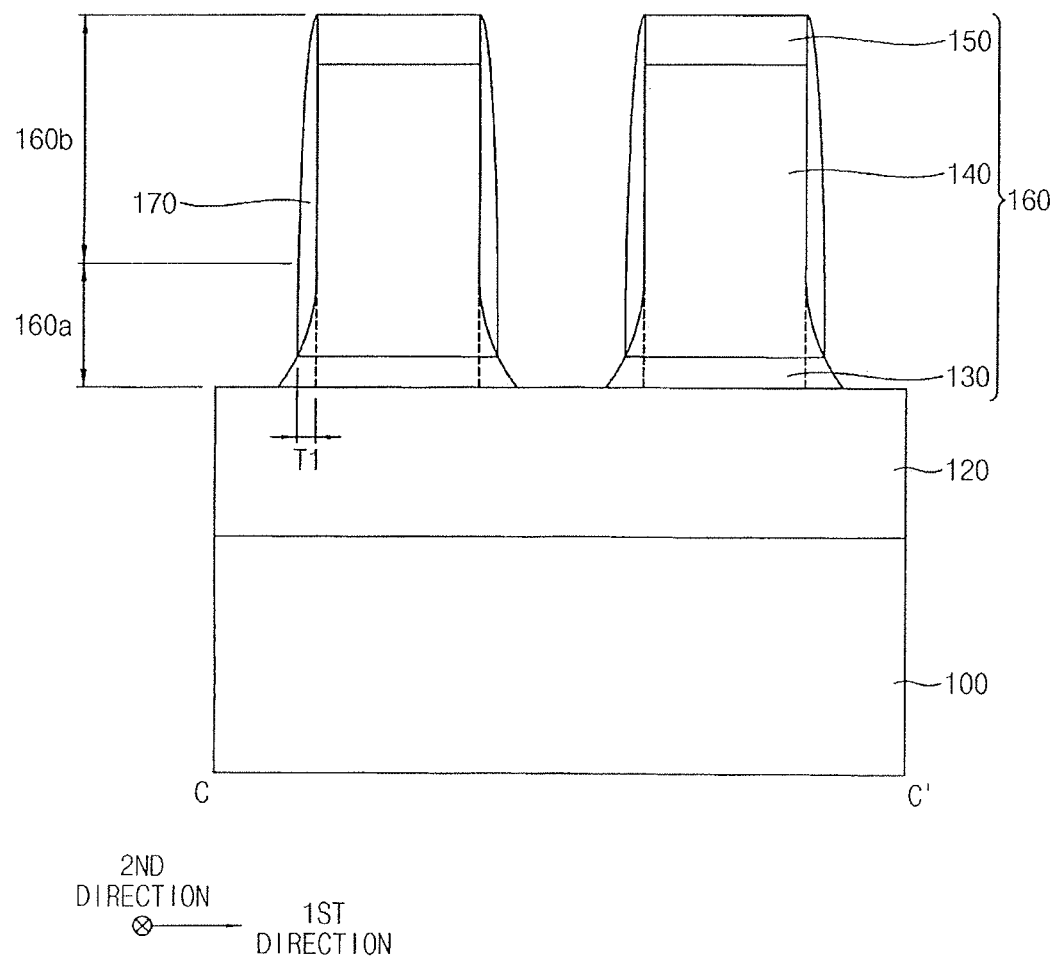
Figure 20:
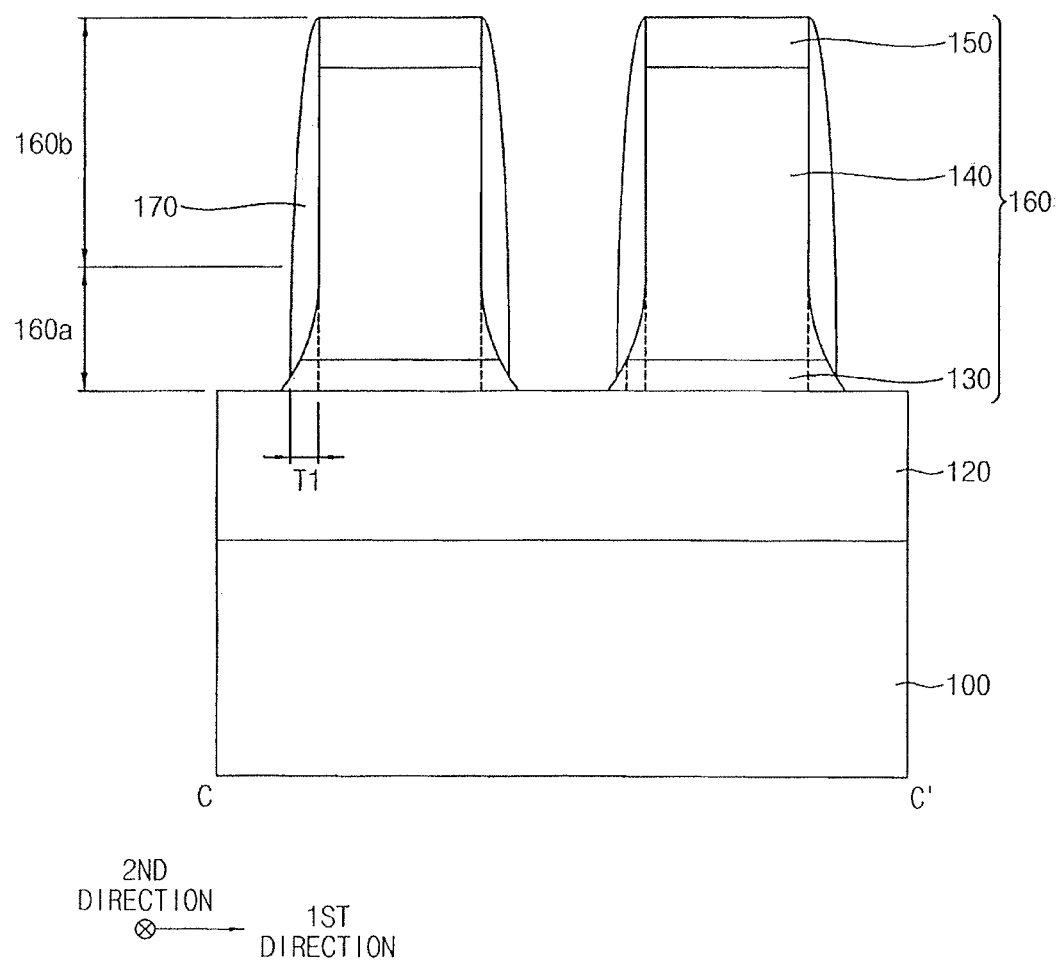

Referring to FIGS. 19 and 20, the exposed portion of the dummy gate structure 160 may be changed according to the first thickness T1 of the first gate spacer. For example, FIGS. 19 and 20 show, as the first thickness T1 of the first gate spacer 170 increases when compared to that of FIG. 18, only a portion of the dummy gate insulation pattern 130 is exposed.

Figure 21:
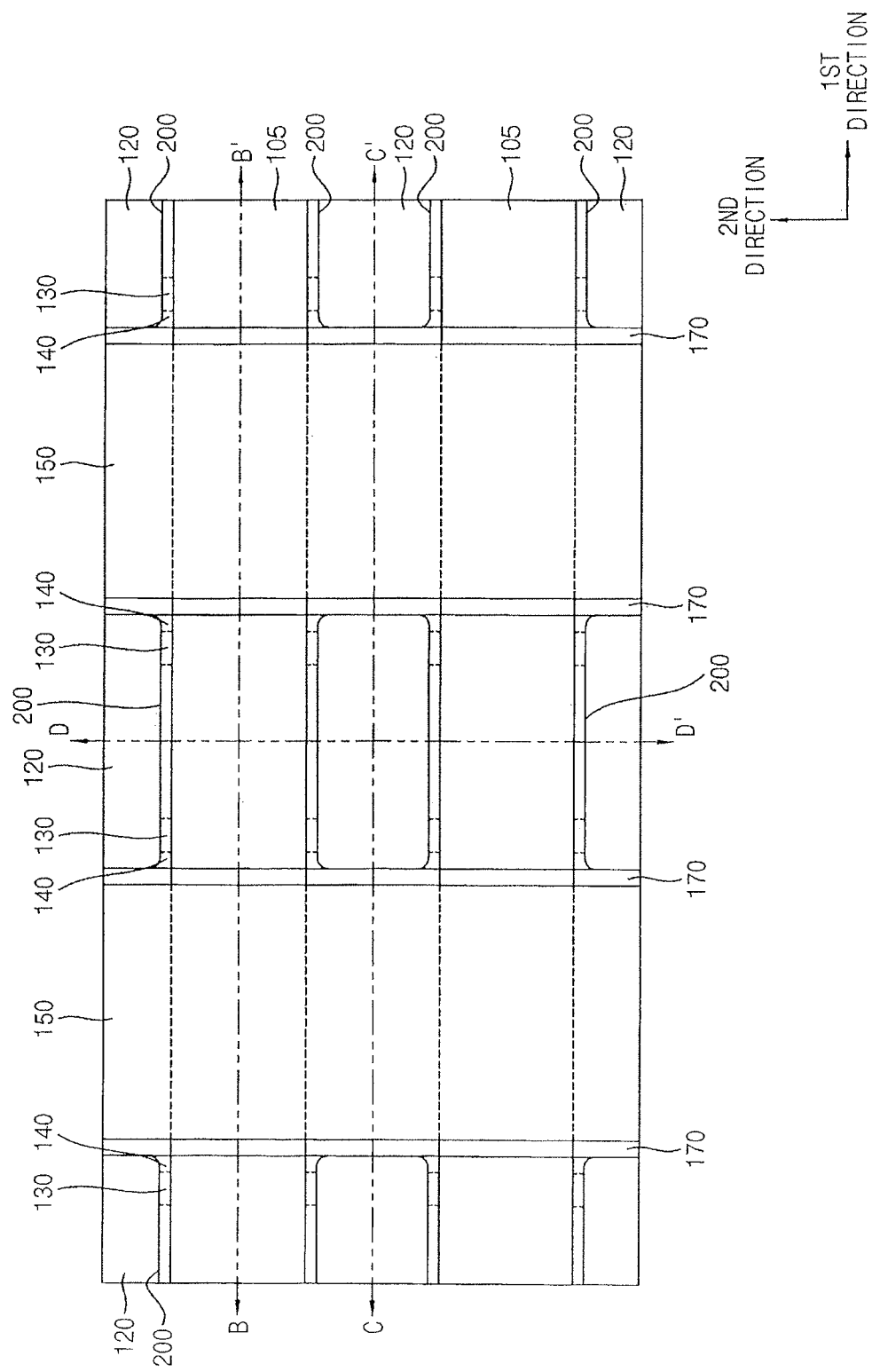
Figure 22:
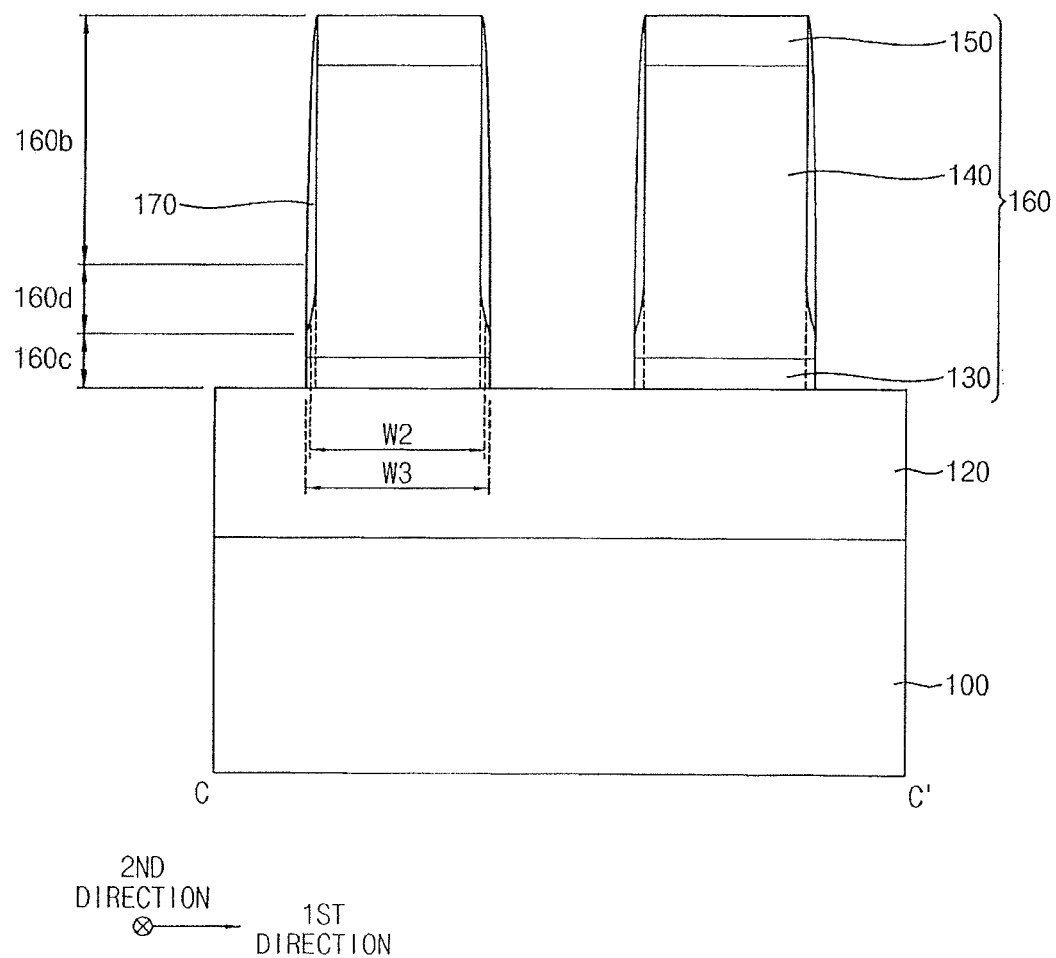

Referring to FIGS. 21 and 22, the exposed portion of the dummy gate structure 160 may be removed using the first gate spacer 170 as an etching mask. Thus, the exposed portions of the dummy gate insulation pattern 130 and the dummy gate electrode 140 in the dummy gate electrode 160 on the isolation layer 120 may be removed, and the first region 160*a* may be divided into third and fourth regions 160*c* and 160*d*. The third region 160*c* may have a third width W3 in the first direction, and the fourth region 160*d* may have a second width W2 that may change according to the height thereof and may be smaller than the third width W3.

As the first fin spacer 200 may be formed on the sidewall of the active fin 105, a portion of the dummy gate structure 160 under the first fin spacer 200 on the isolation layer 120 may remain.

Figure 23:
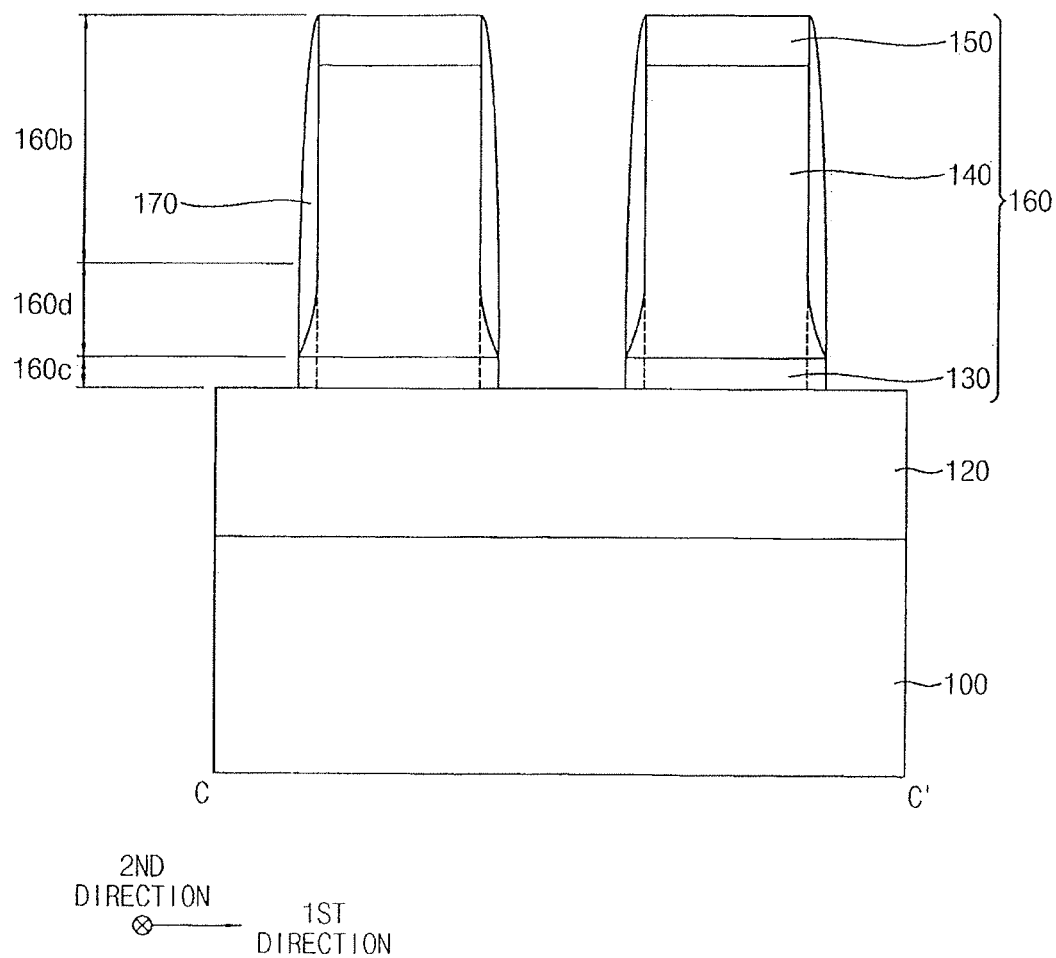
Figure 24:
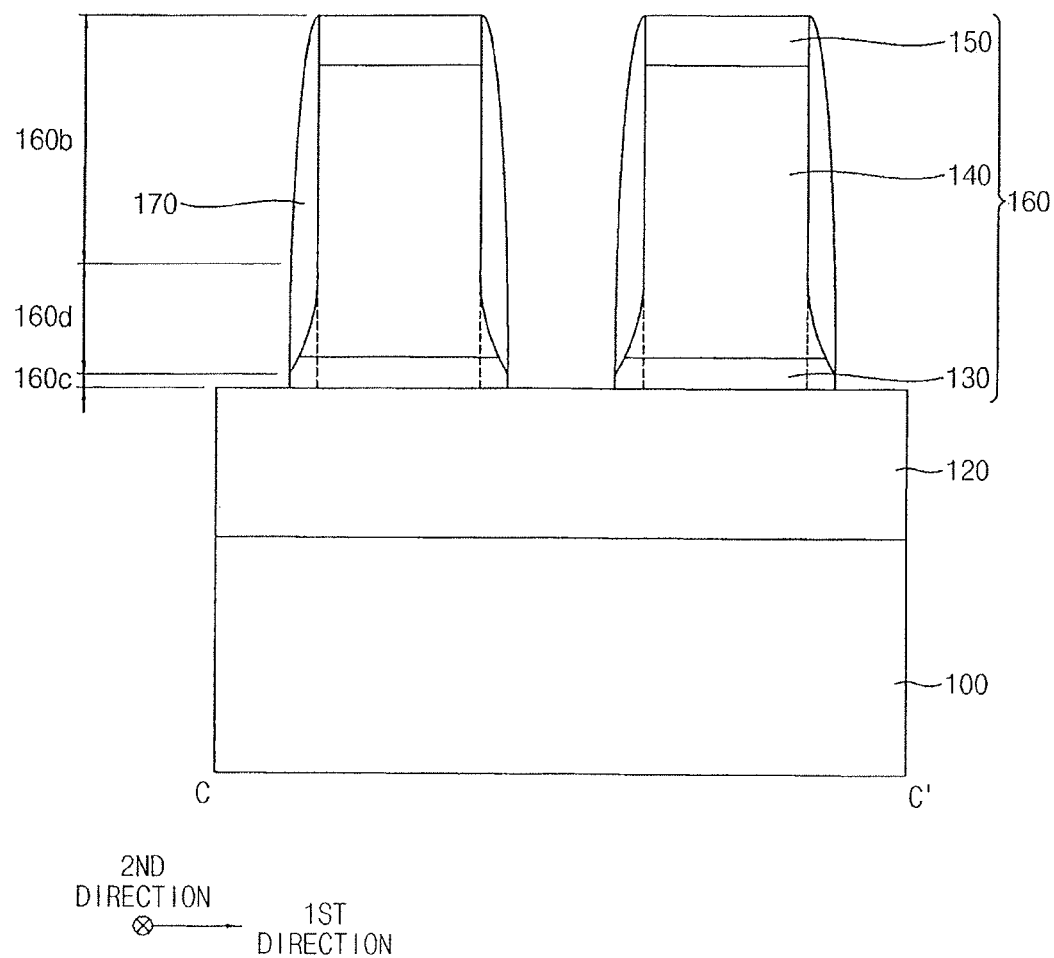
Figure 25:
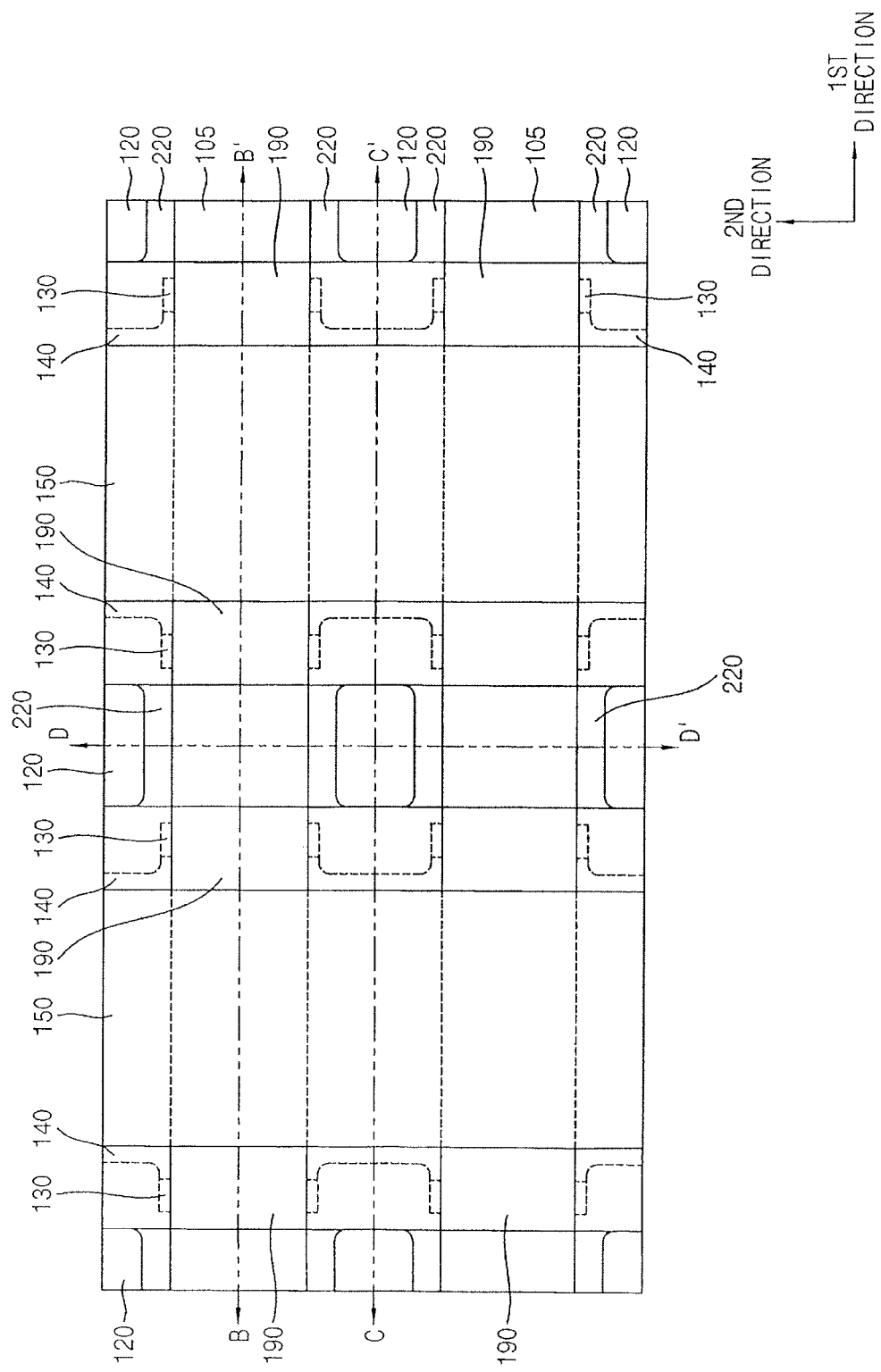
Figure 26:
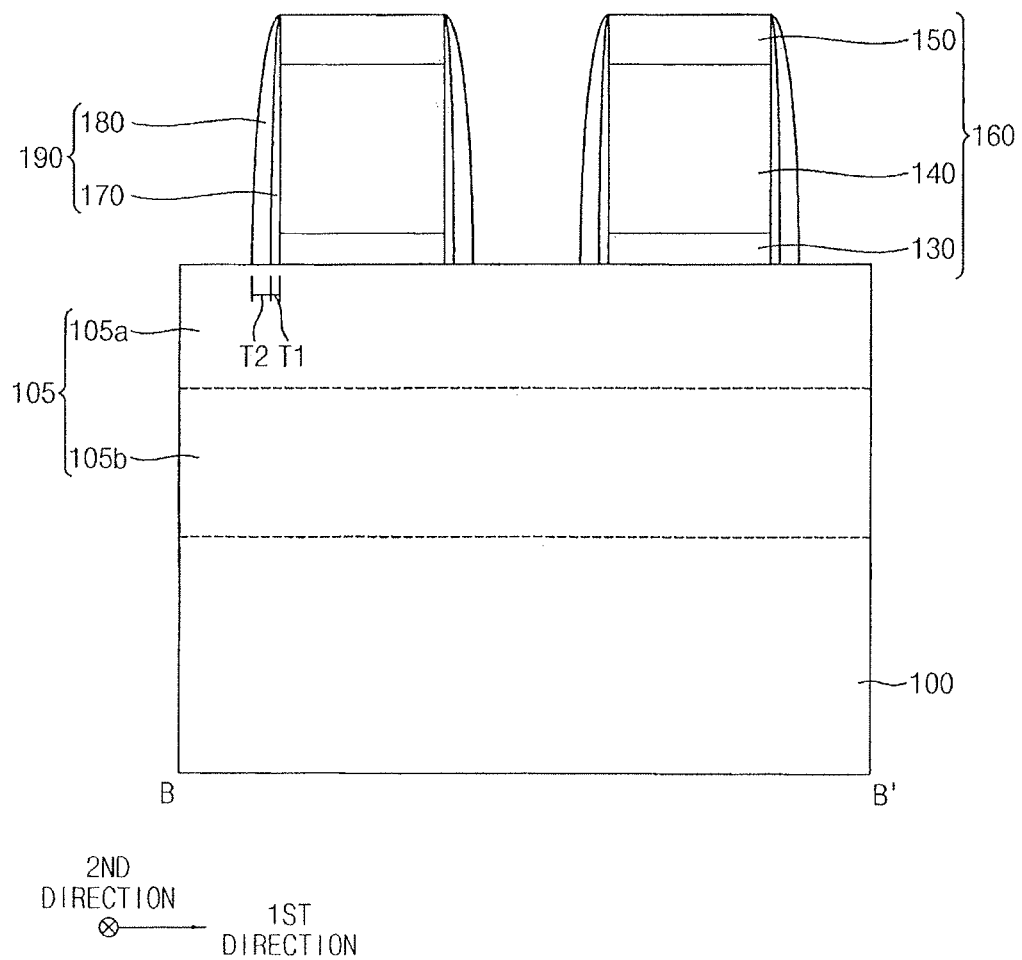
Figure 27:
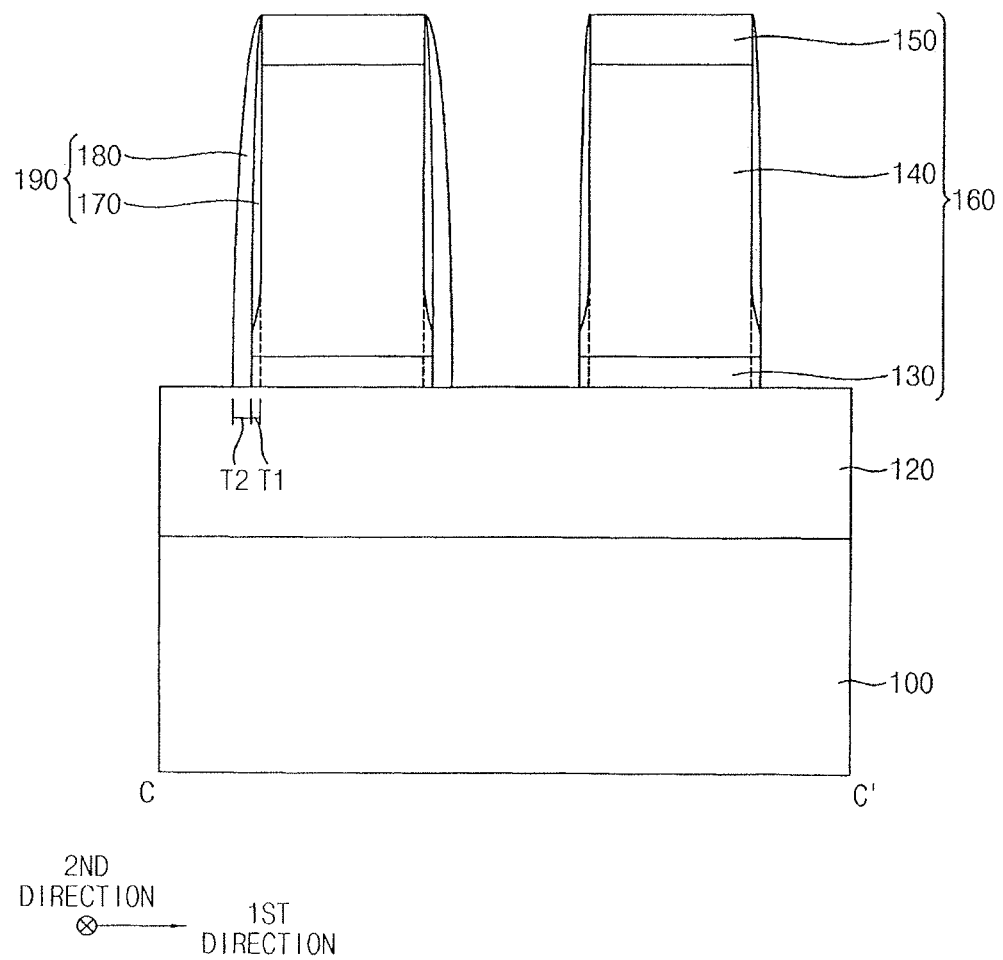
Figure 28:
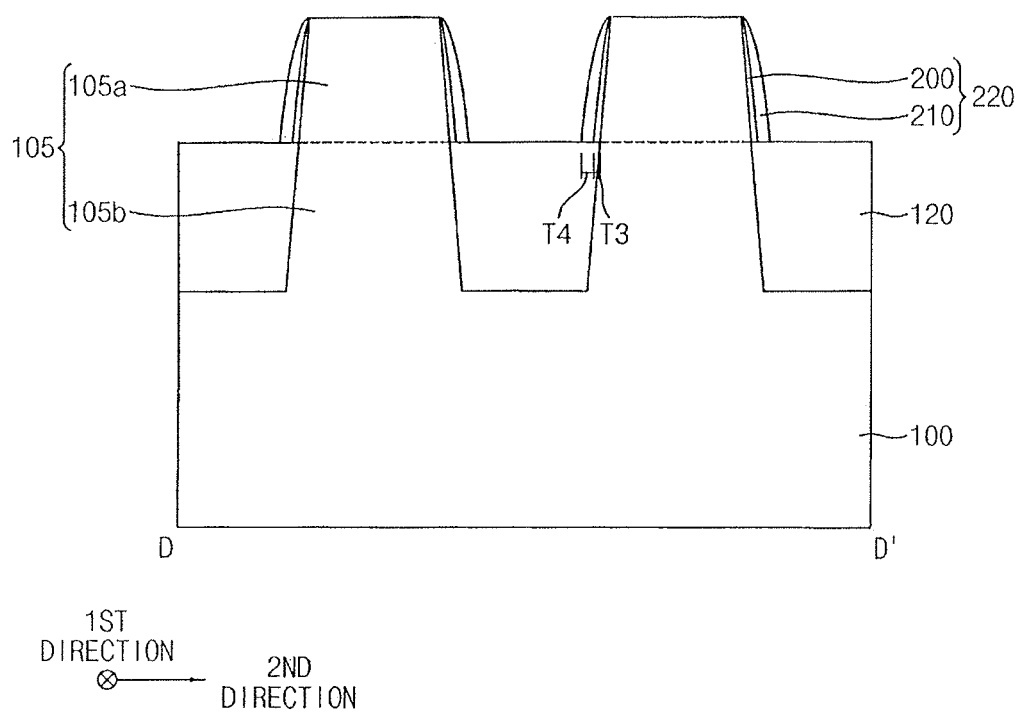

FIGS. 23 and 24 illustrate remaining portions of the dummy gate structure 160 after the etching process, as the first thickness T1 of the first gate spacer 170 changes.

Referring to FIGS. 25 to 28, a second gate spacer 180 may be formed on the first gate spacer 170 and a sidewall of the exposed portion of the dummy gate structure 160. A second fin spacer 210 may be formed on an outer sidewall of the first fin spacer 200. The second gate spacer 180 and the second fin spacer 210 may be formed, for example, by forming a second spacer layer on the dummy gate structure 160, the first gate spacer 170, the first fin spacer 200, the active fin 105, and the isolation layer 120, and anisotropically etching the second spacer layer.

Thus, the second gate spacer 180 may be formed to have a second thickness T2. As a result, the sidewall of the exposed portion of the dummy gate structure 160 may be covered. The second fin spacer 210 may be formed on the outer sidewall of the first fin spacer 200 to have a fourth thickness T4. The remaining portion of the dummy gate structure 160 under the first fin spacer 200 on the isolation layer 120 may be also covered by the second gate spacer 180.

Figure 29:
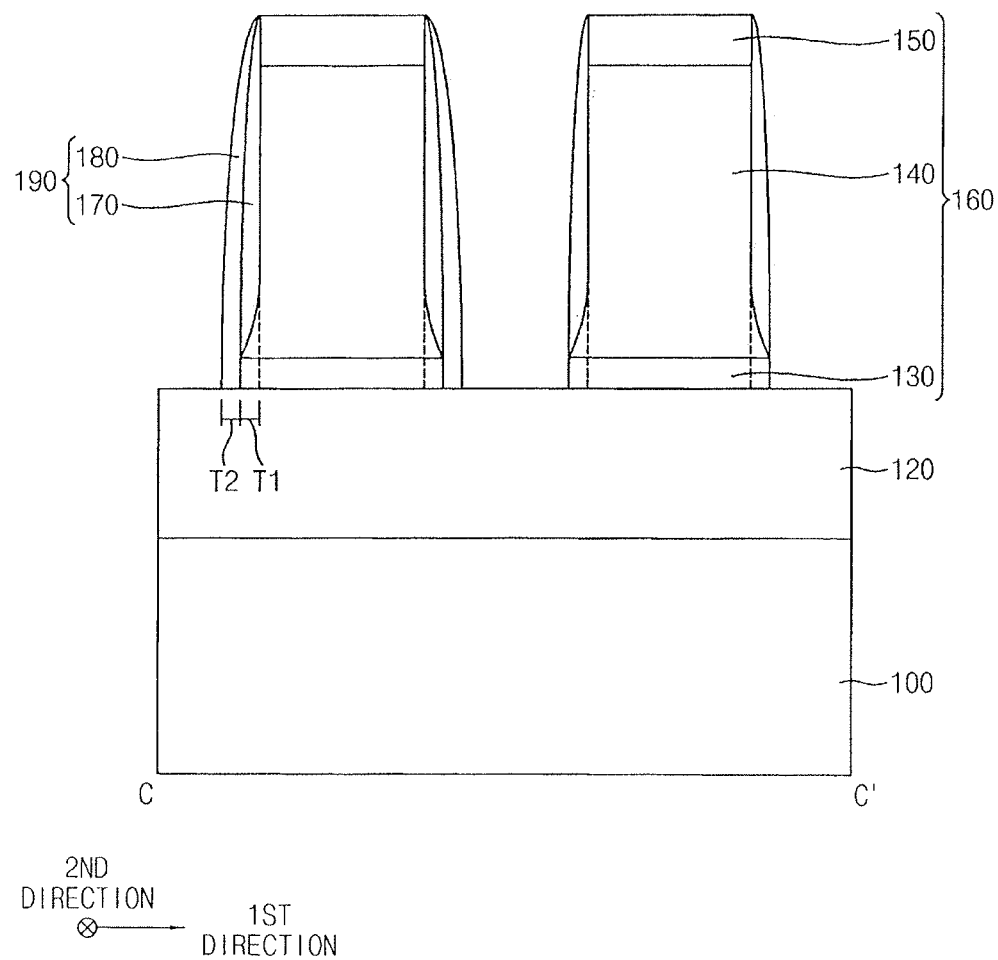
Figure 30:
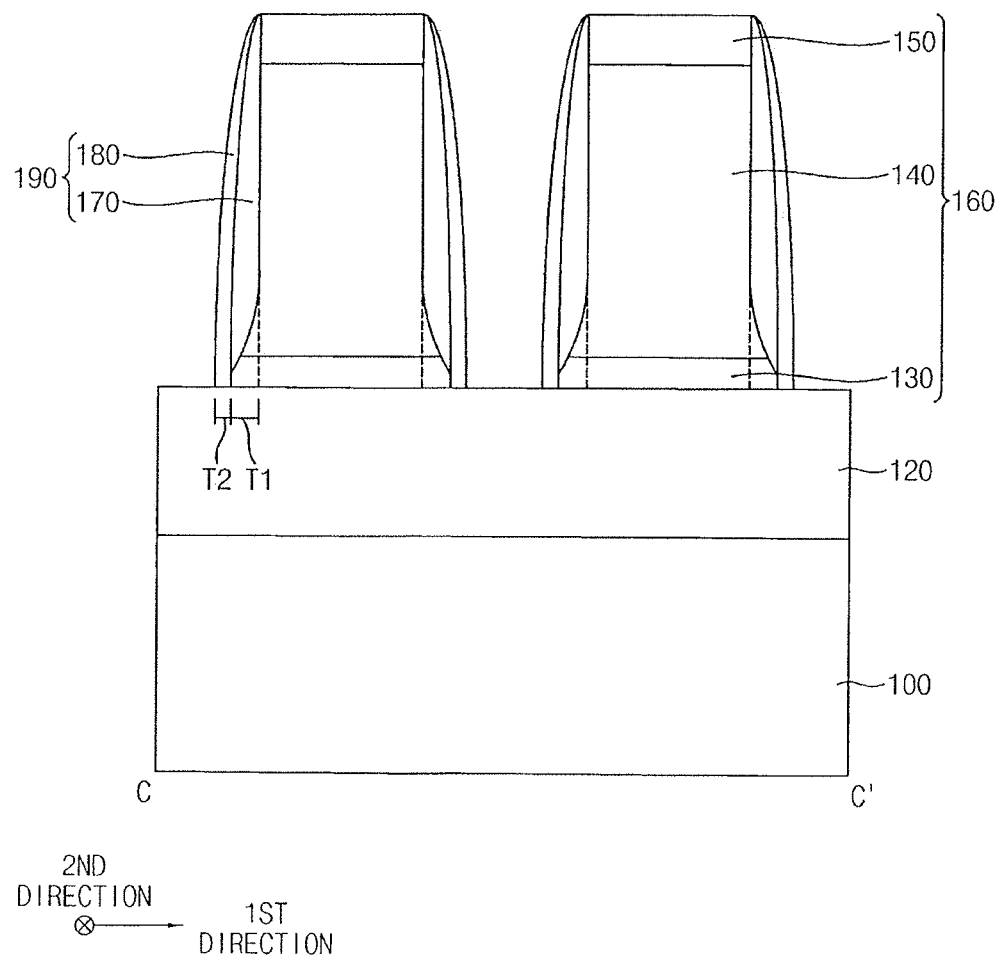

In example embodiments, the second and fourth thicknesses T2 and T4 may be greater than the first and third thicknesses T1 and T3, respectively. In another embodiment, if the exposed portion of the dummy gate structure 160 is covered, the second and fourth thicknesses T2 and T4 may be equal to or smaller than the first and third thicknesses, respectively. FIGS. 29 and 30 illustrate that the second thickness T2 of the second gate spacer 180 may change as the first thickness T1 of the first gate spacer 170 changes.

The second spacer layer may be formed of a nitride, e.g., silicon nitride, silicon oxynitride, silicon oxycarbonitride, etc., or an oxide, e.g., silicon oxide. In example embodiments, the second spacer layer may be formed of a material substantially the same as or different from that of the first spacer layer. The first and second gate spacers 170 and 180 may form a gate spacer structure 190. The first and second fin spacers 200 and 210 may form a fin spacer structure 220.

Figure 31:
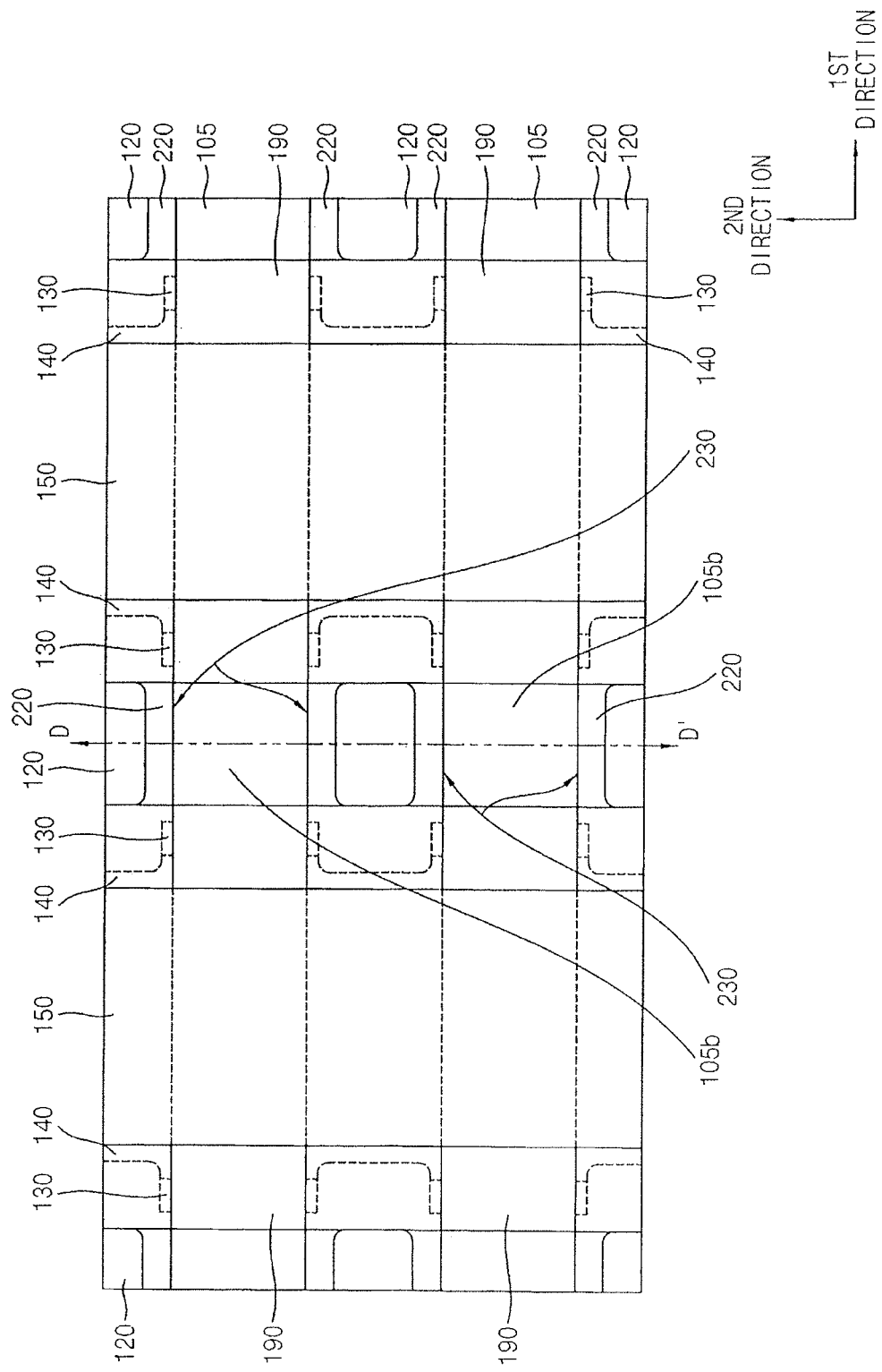
Figure 32:
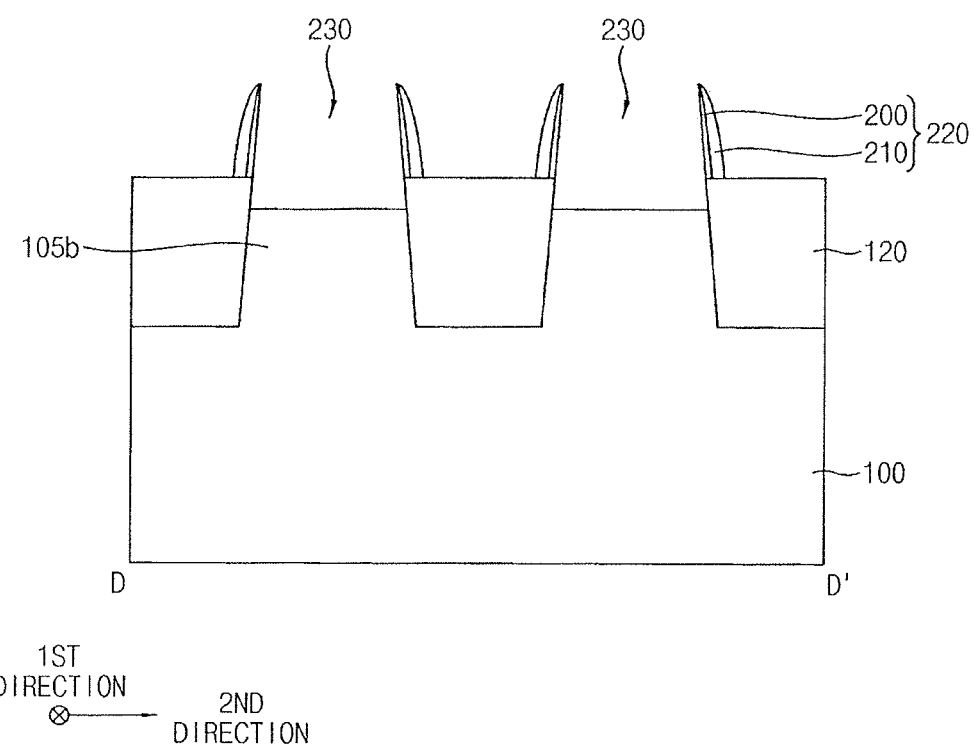

Referring to FIGS. 31 and 32, an upper portion of the active fin 105 adjacent the dummy gate structure 160 in the first direction may be removed to form a second trench 230. Particularly, the upper portion of the active fin 105 may be removed using the dummy gate structure 160, the gate spacer structure 190 on the sidewall of the dummy gate structure 160, and the fin spacer structure 220 as an etching mask to form the second trench 230. FIG. 32 illustrates that the active pattern 105a and a portion of the lower active pattern 105b are removed. In another embodiment, only the active pattern 105a may be removed.

In example embodiments, the second trench 230 may be formed to have, for example, a sigma shape. In another embodiment, the second trench 230 may be have a U-like shape, a ball-like shape, or a vertical sidewall.

Figure 33:
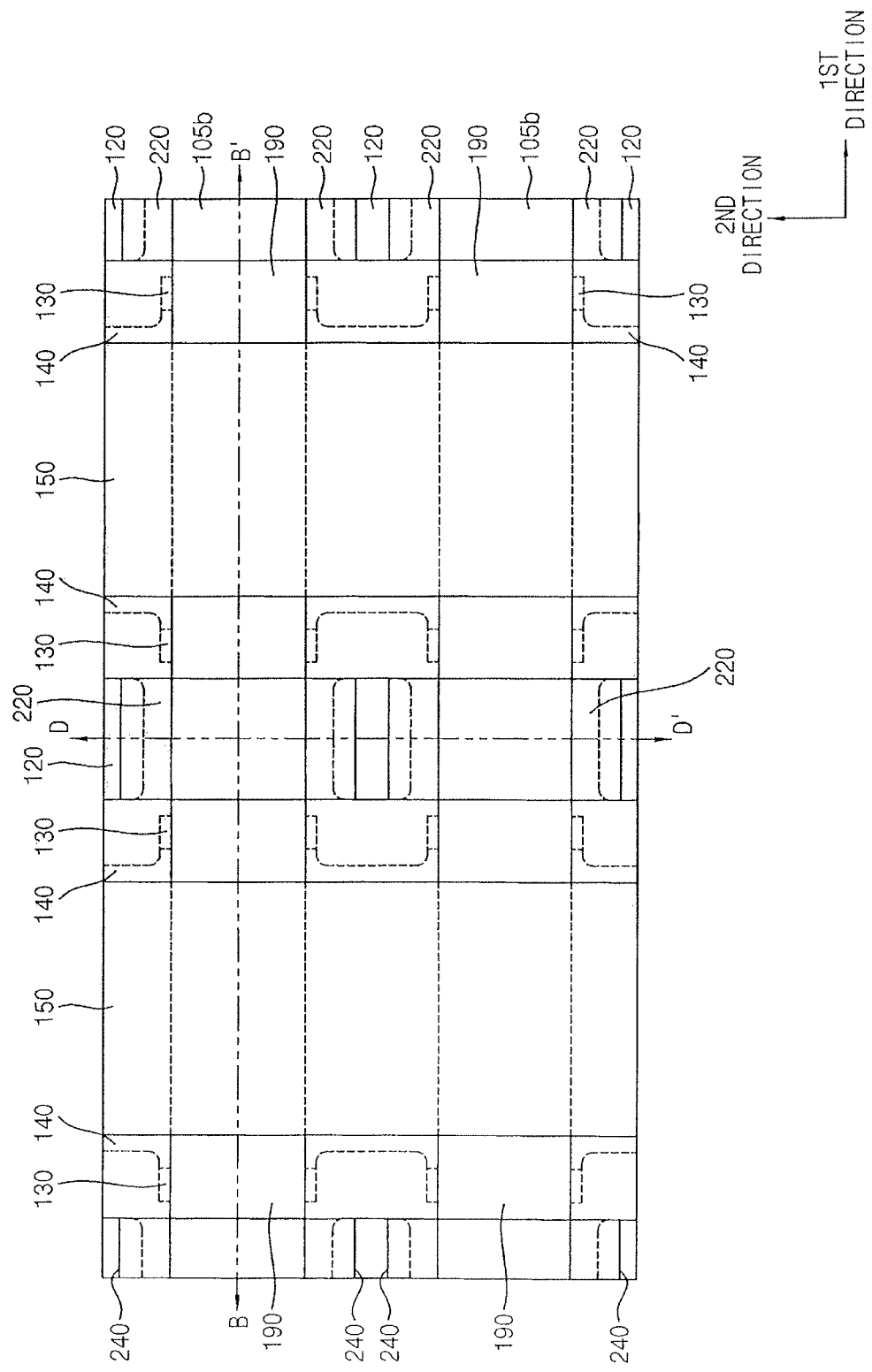
Figure 34:
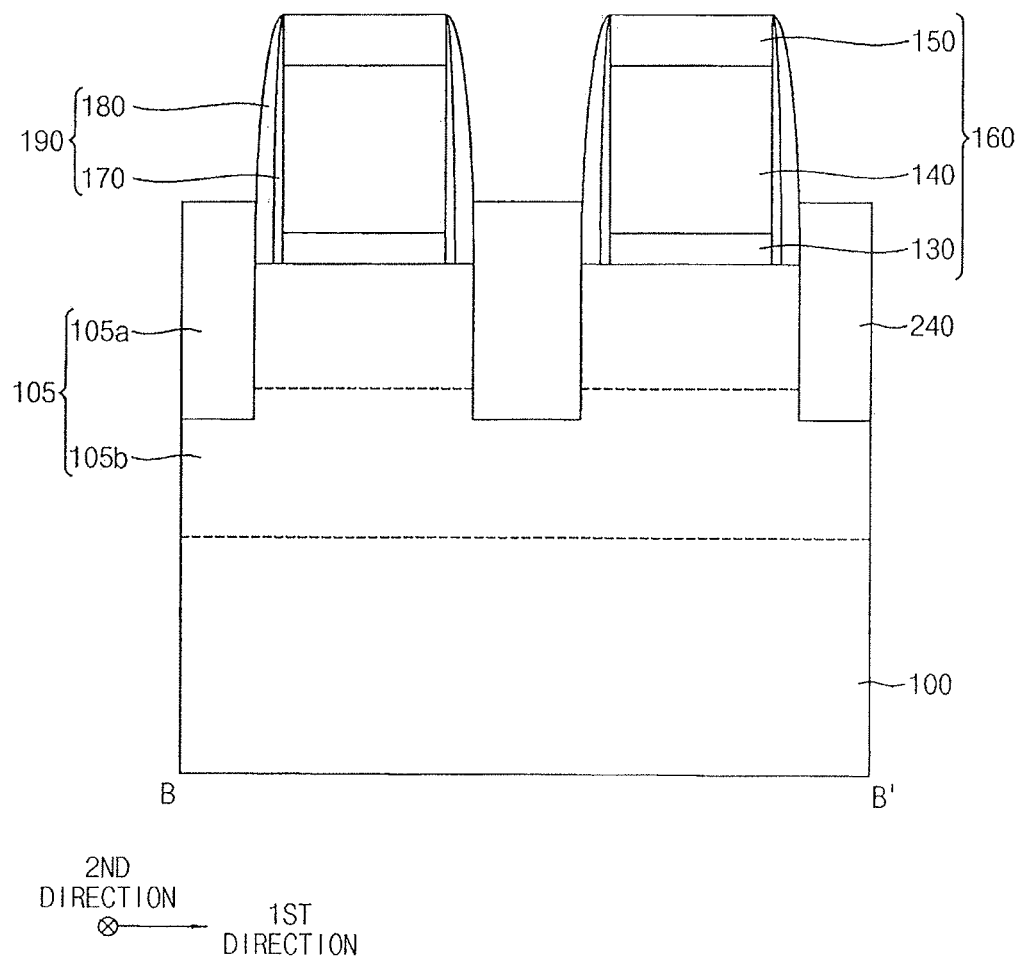
Figure 35:
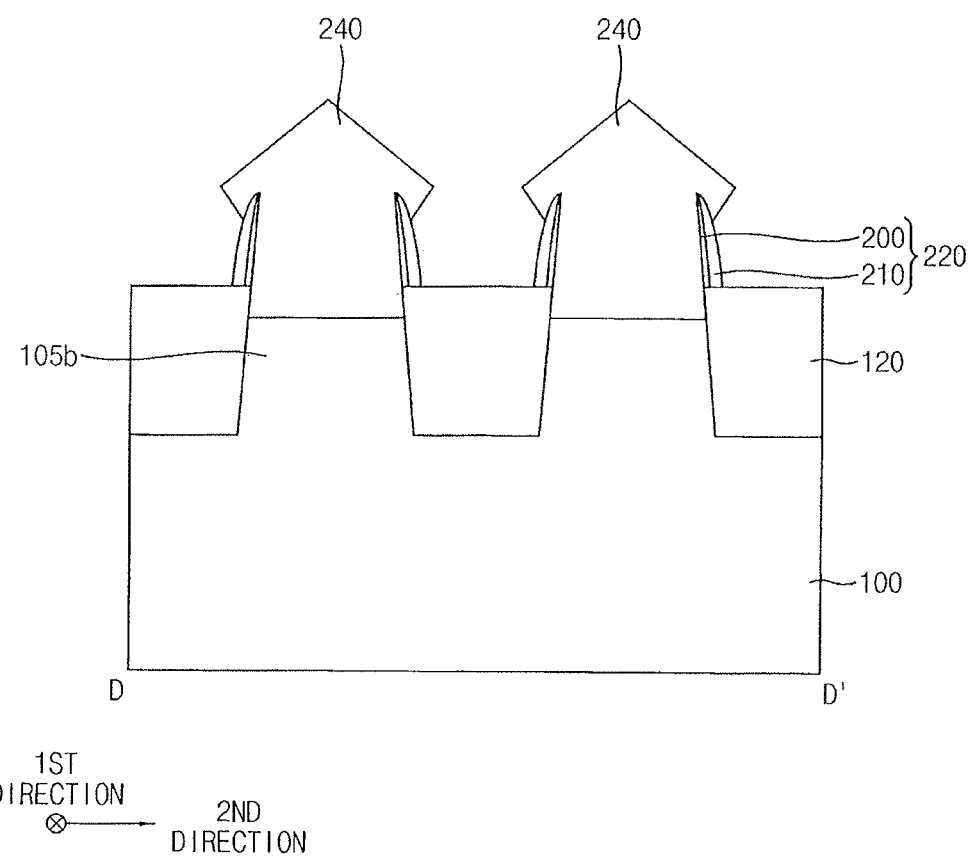

Referring to FIGS. 33 to 35, a source/drain layer 240 may be formed on the active fin 105 to fill the second trench 230 and grow over the fin space structure 220. In example embodiments, the source/drain layer 240 may be formed by a selective epitaxial growth (SEG) process using the top surface of the active fin 105 exposed by the second trench 230 as a seed.

In example embodiments, the source/drain layer 240 may be formed by performing an SEG process using a silicon source gas, e.g., disilane ($Si_2H_6$) gas and a carbon source gas, e.g., monomethylsilane ($SiH_3CH_3$) gas to form a single crystalline silicon carbide layer. Alternatively, the SEG process may be performed using only the silicon source gas, e.g., disilane ($Si_2H_6$) gas to form a single crystalline silicon layer. In example embodiments, an n-type impurity source gas, e.g., phosphine ($PH_3$) gas may be also used to form a single crystalline silicon carbide layer doped with n-type impurities or a single crystalline silicon layer doped with n-type impurities. Thus, the source/drain layer 240 may serve as a source/drain region of an NMOS transistor.

Alternatively, the source/drain layer 240 may be formed by performing an SEG process using a silicon source gas, e.g., dichlorosilane ($SiH_2Cl_2$) gas, a germanium source gas, e.g., germane ($GeH_4$) gas to form a single crystalline silicon-germanium layer. In example embodiments, a p-type impurity source gas, e.g., diborane ($B_2H_6$) gas may be also used to form a single crystalline silicon-germanium layer doped with p-type impurities. Thus, the source/drain layer 240 may serve as a source/drain region of a PMOS transistor. The source/drain layer 240 may fill the second trench 230, and may be further grown to contact a portion of the second gate spacer 180.

Figure 36:
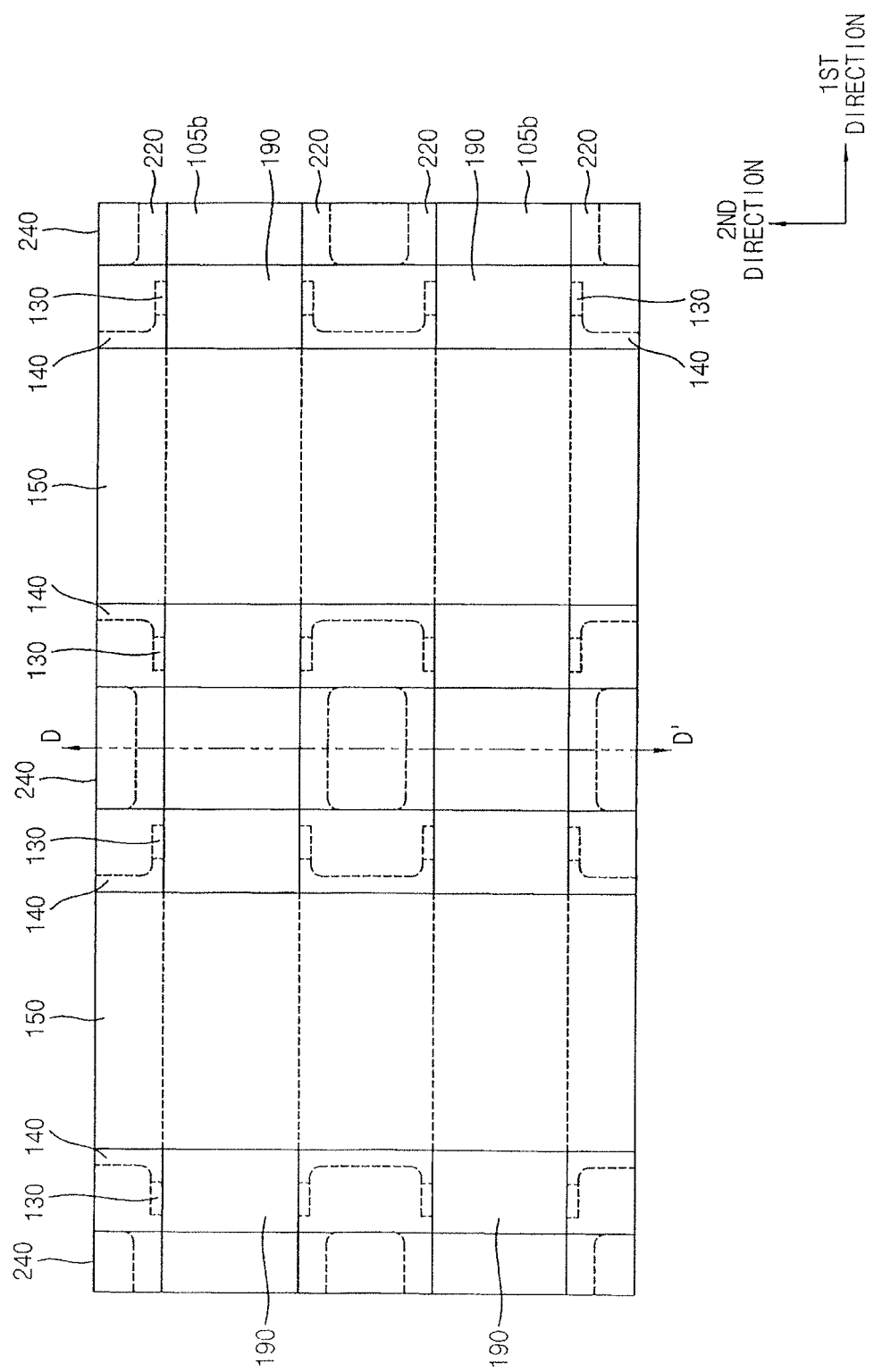
Figure 37:
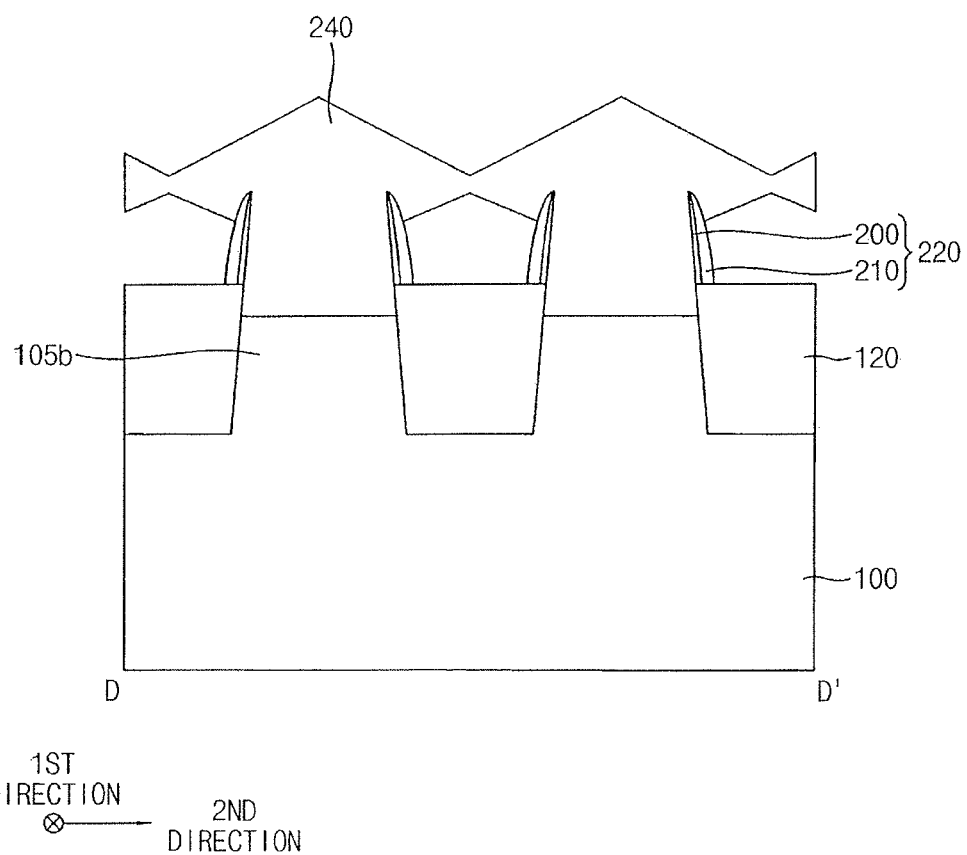
Figure 38:
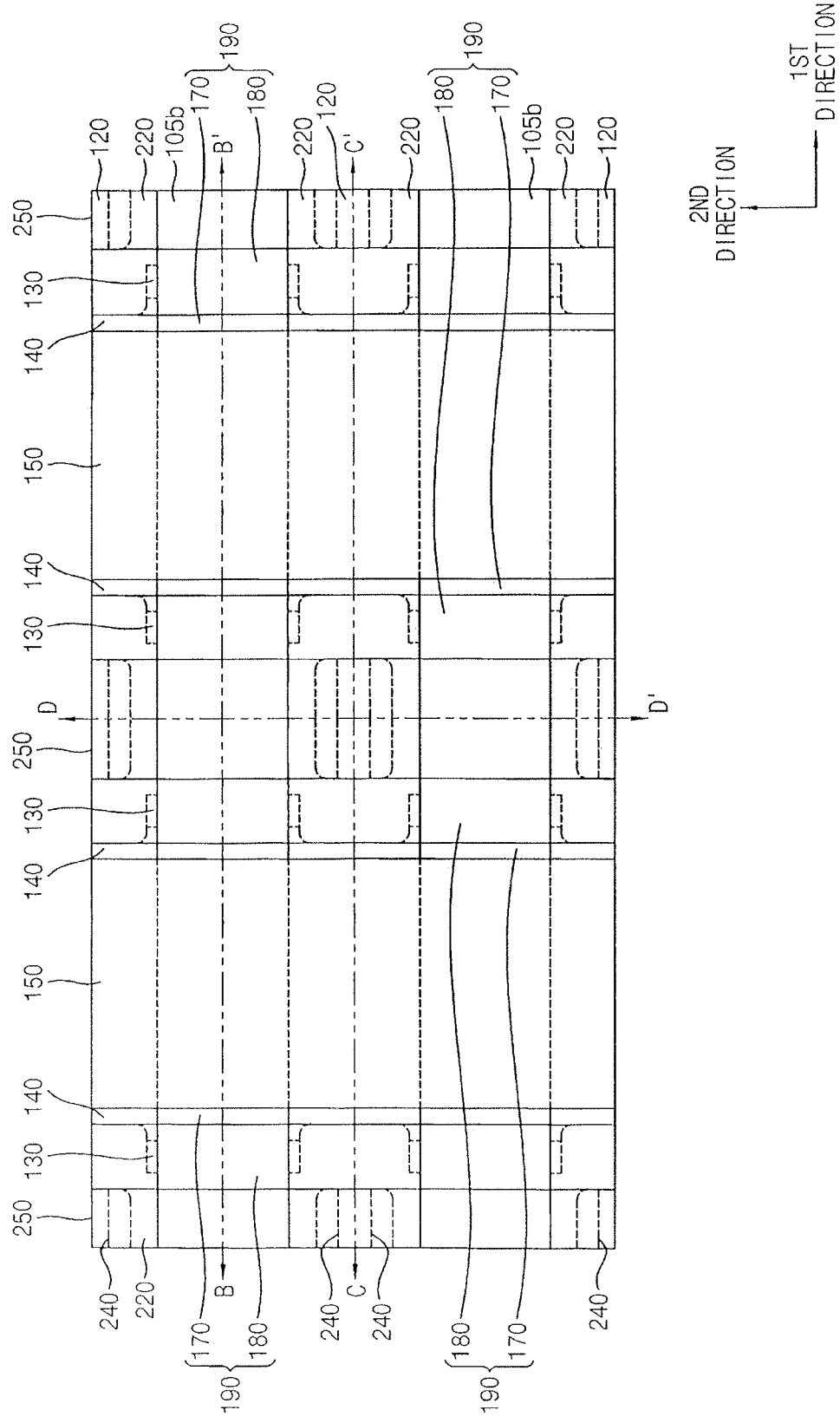
Figure 39:
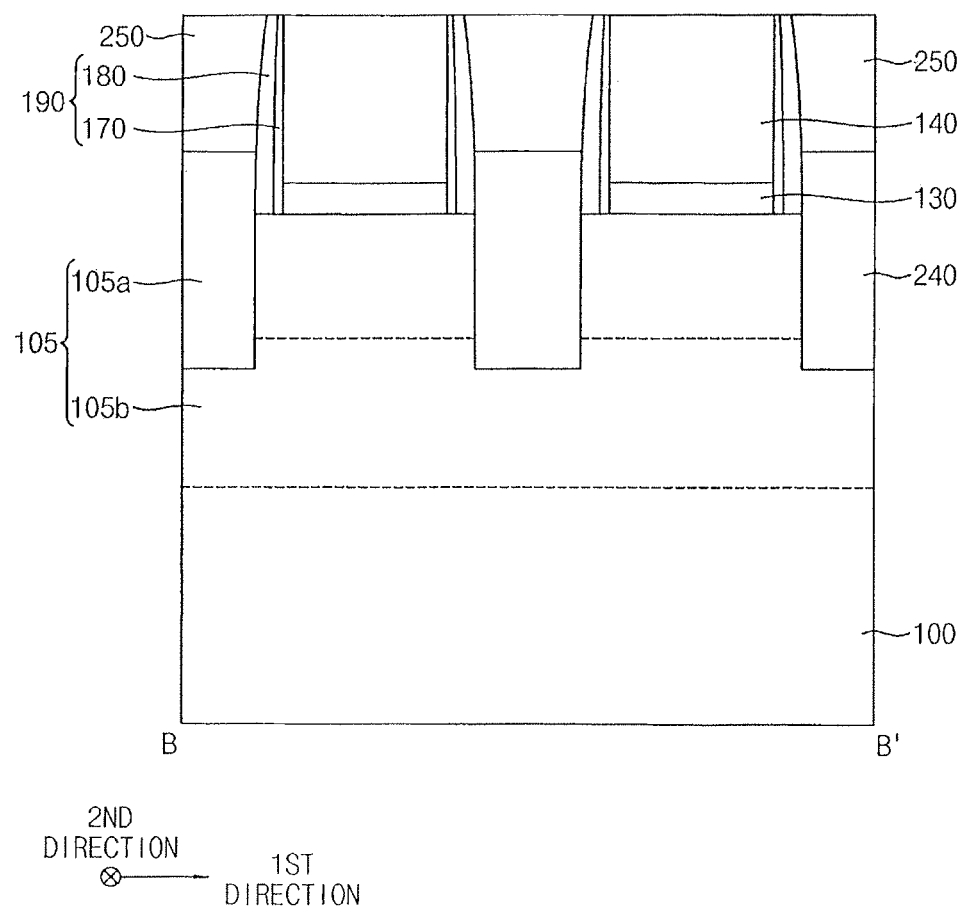
Figure 40:
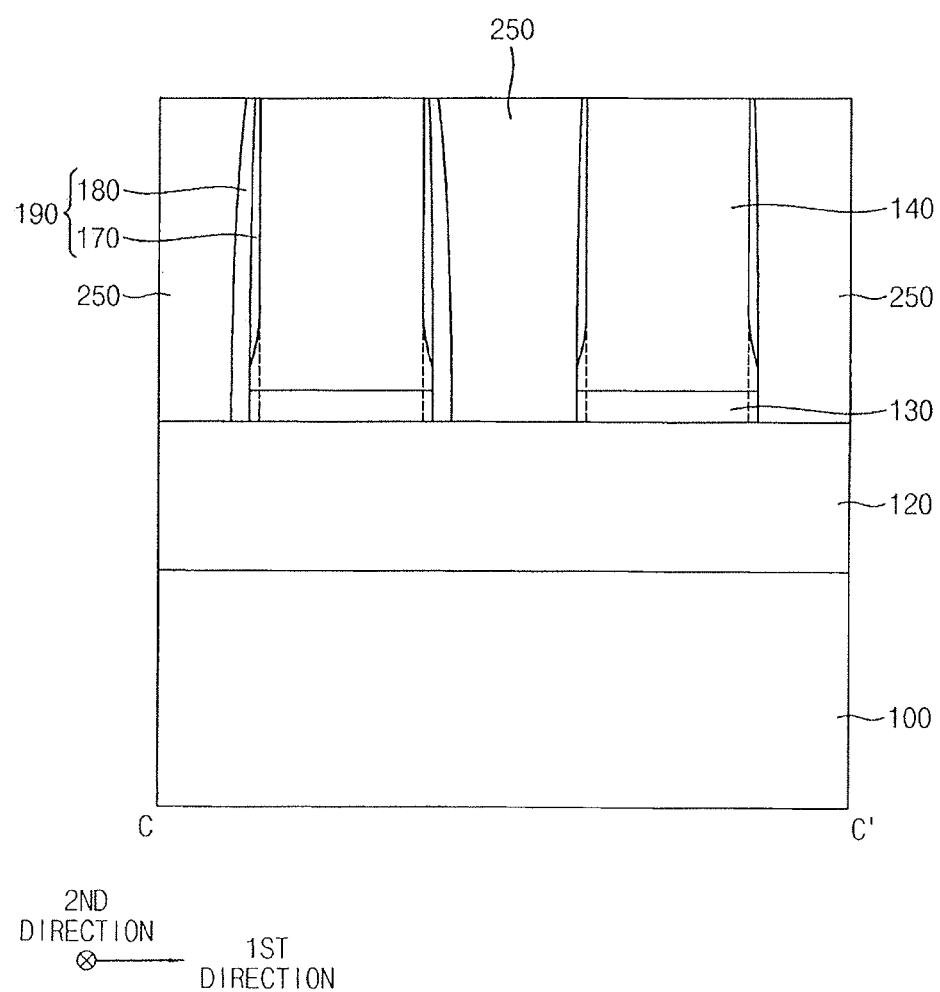
Figure 41:
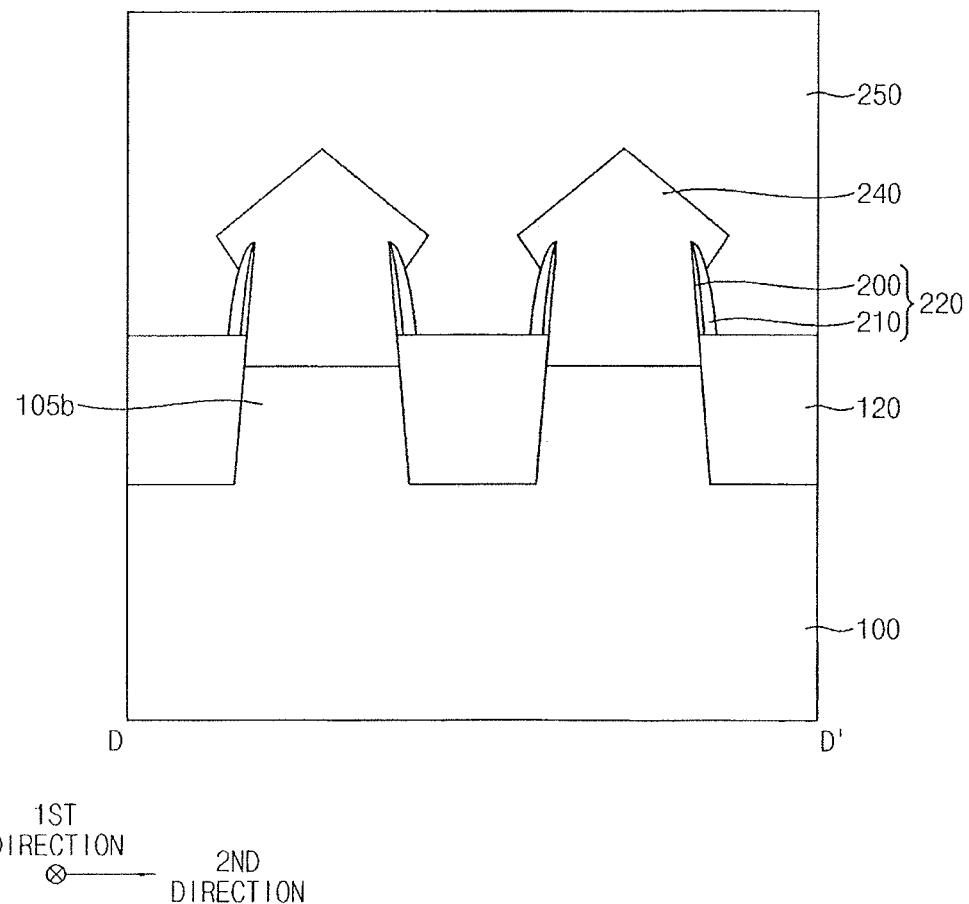
Figure 42:
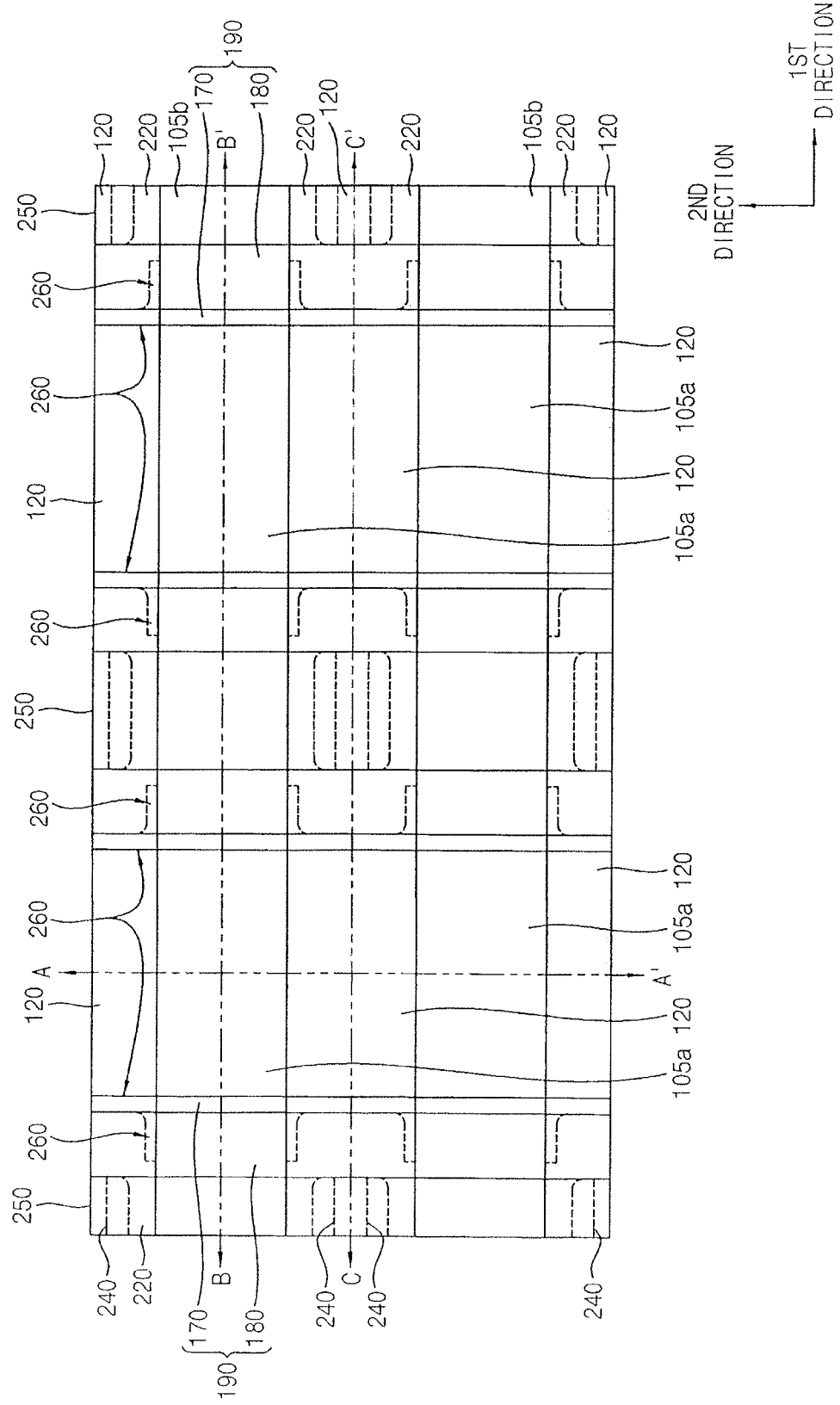
Figure 43:
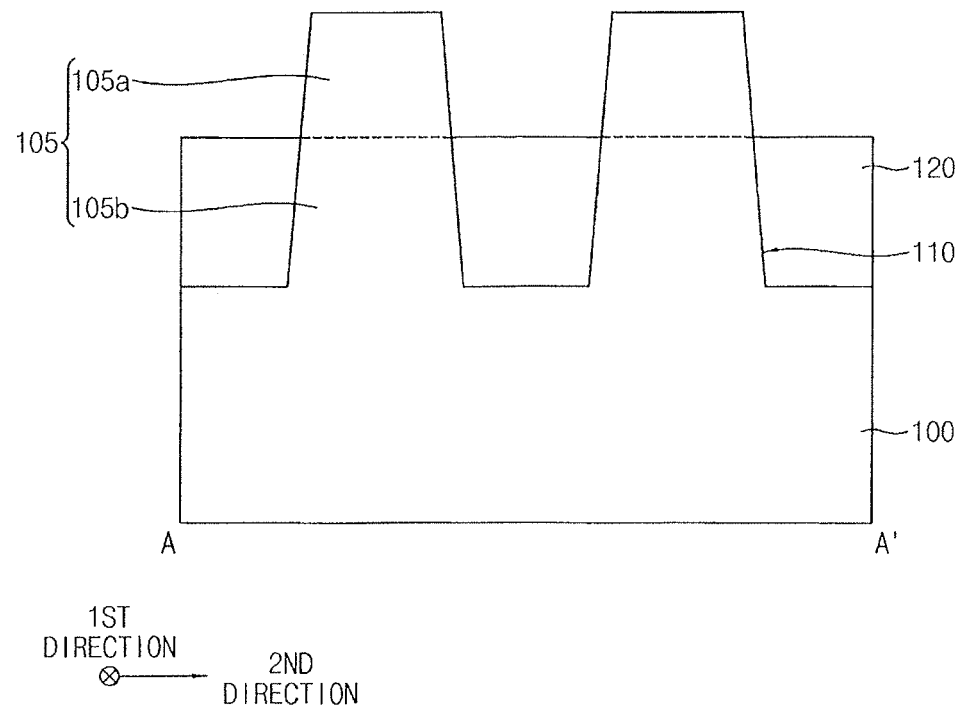
Figure 44:
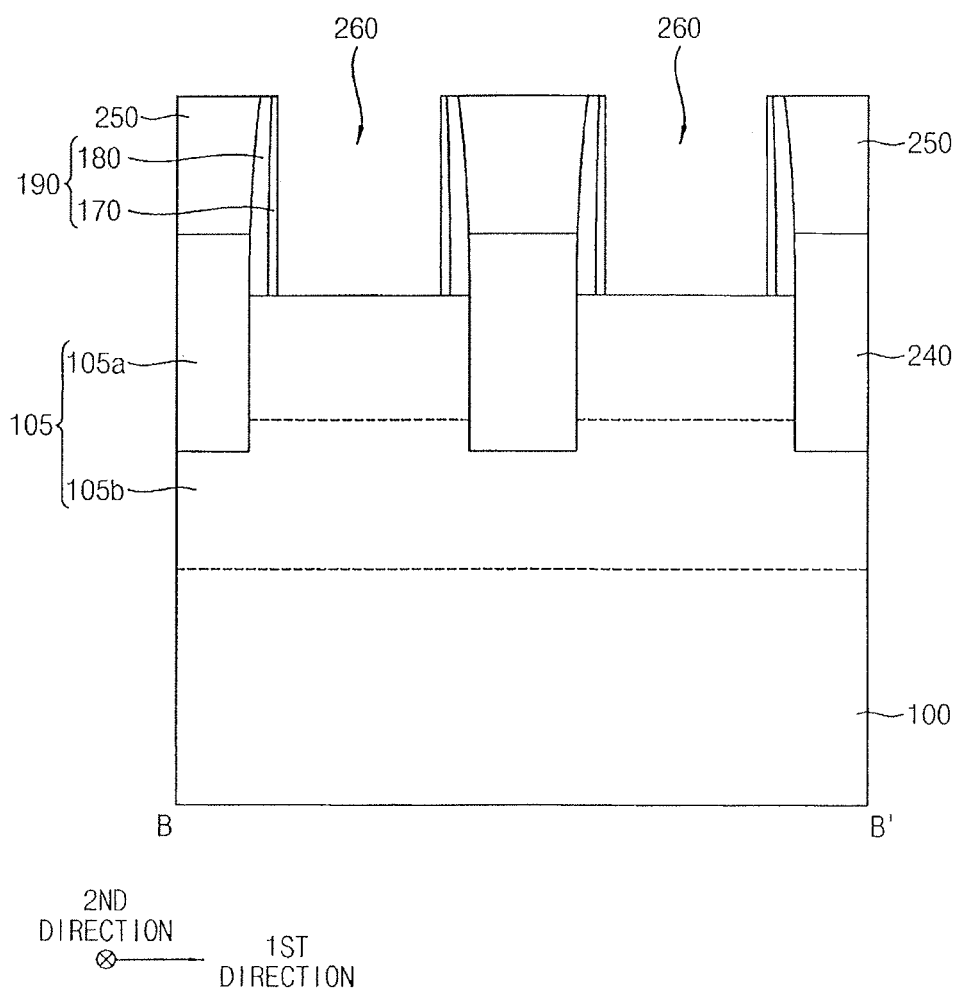
Figure 45:
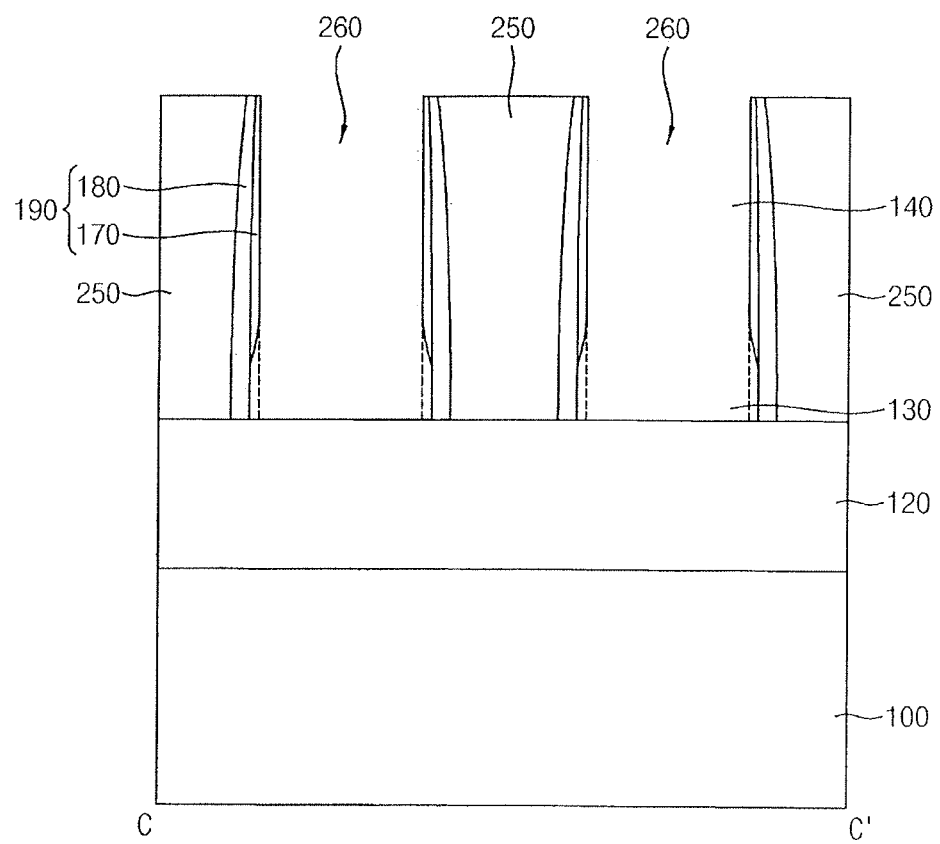
Figure 46:
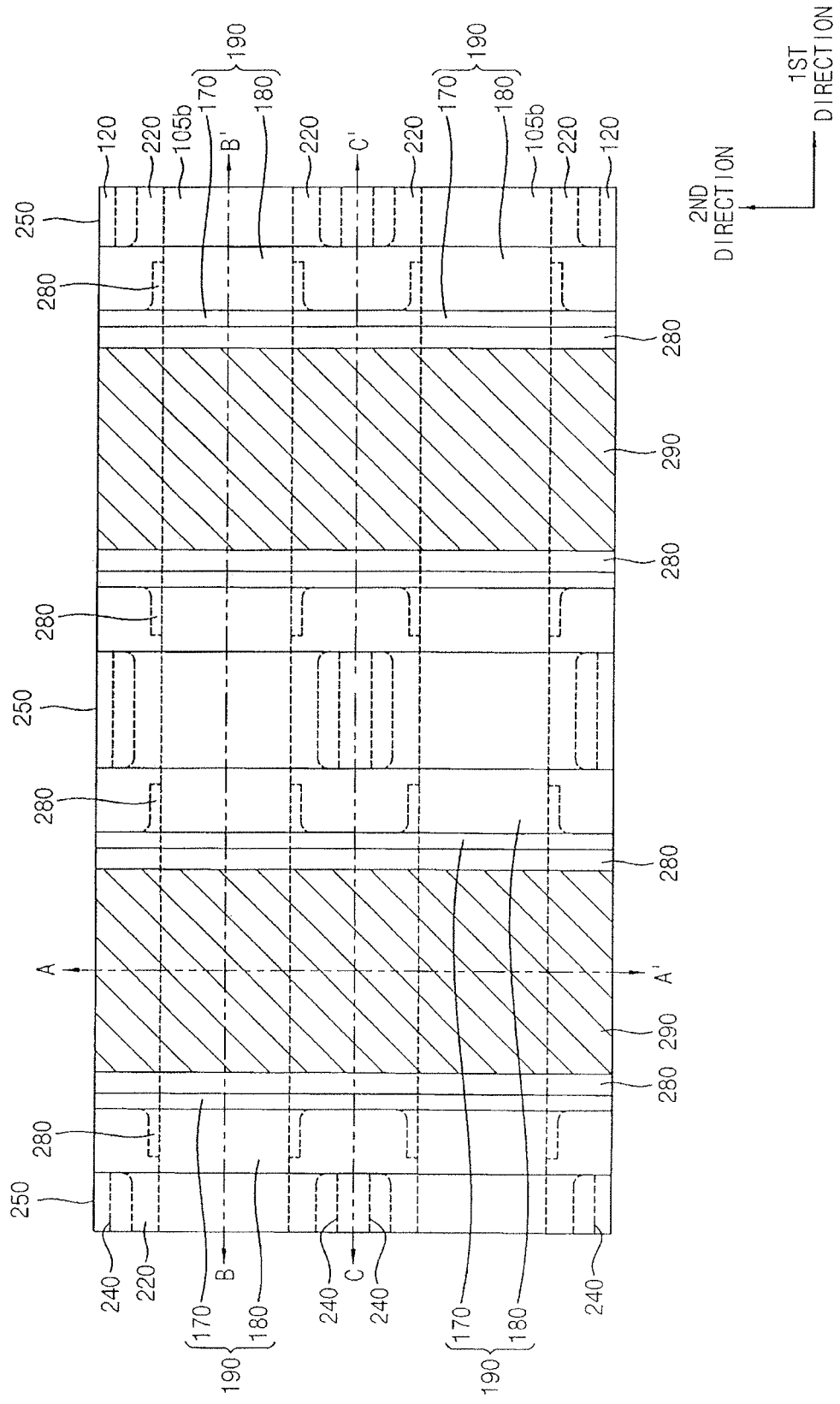
Figure 47:
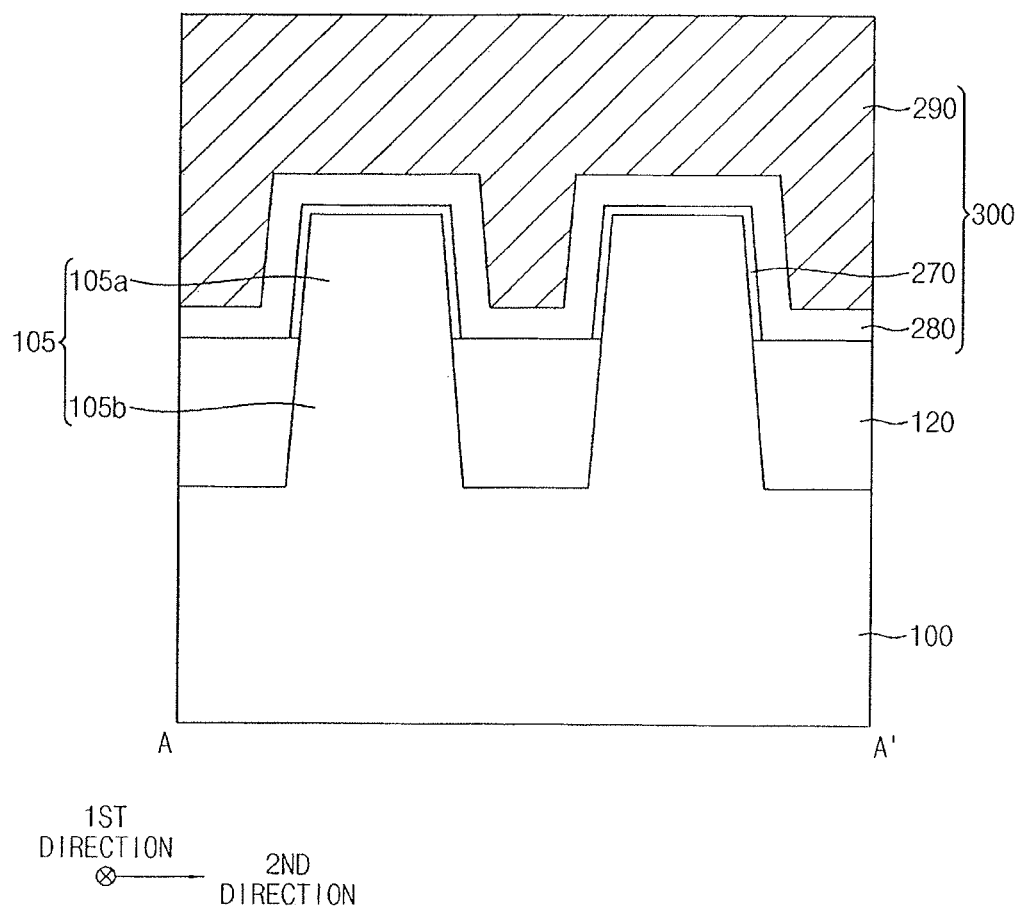
Figure 48:
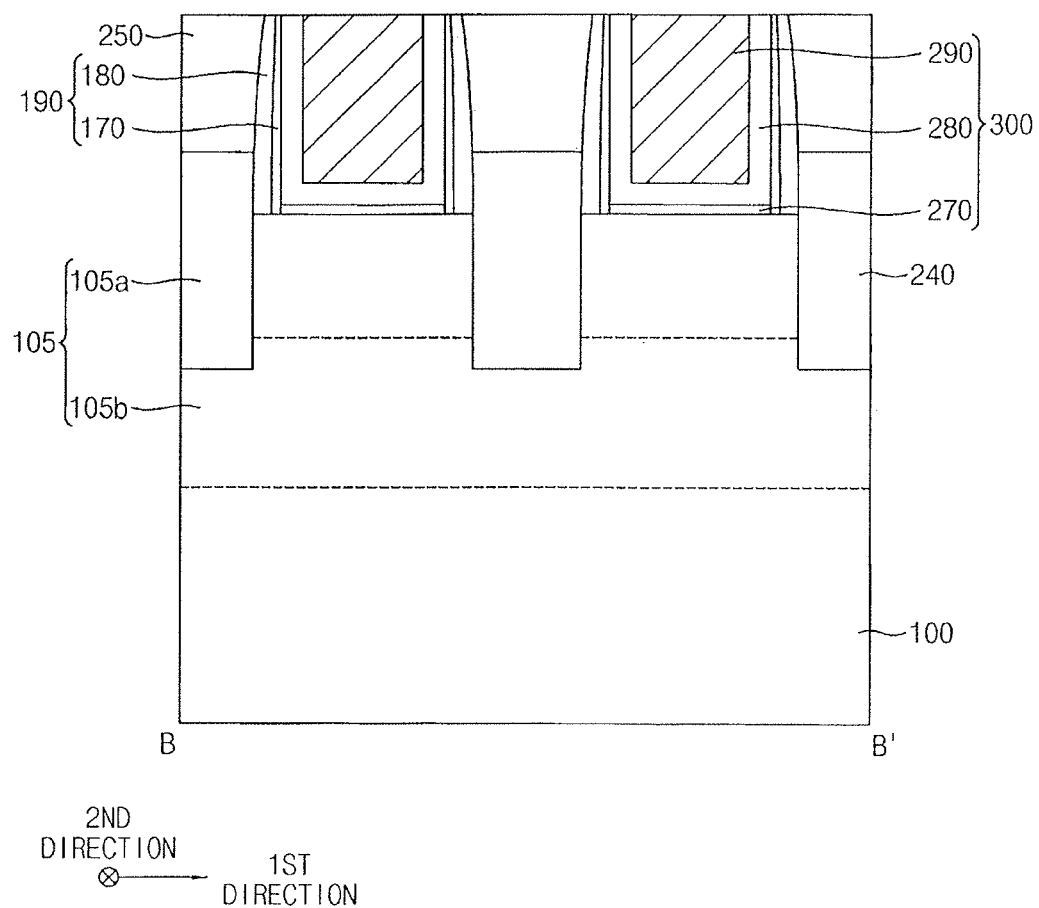
Figure 49:
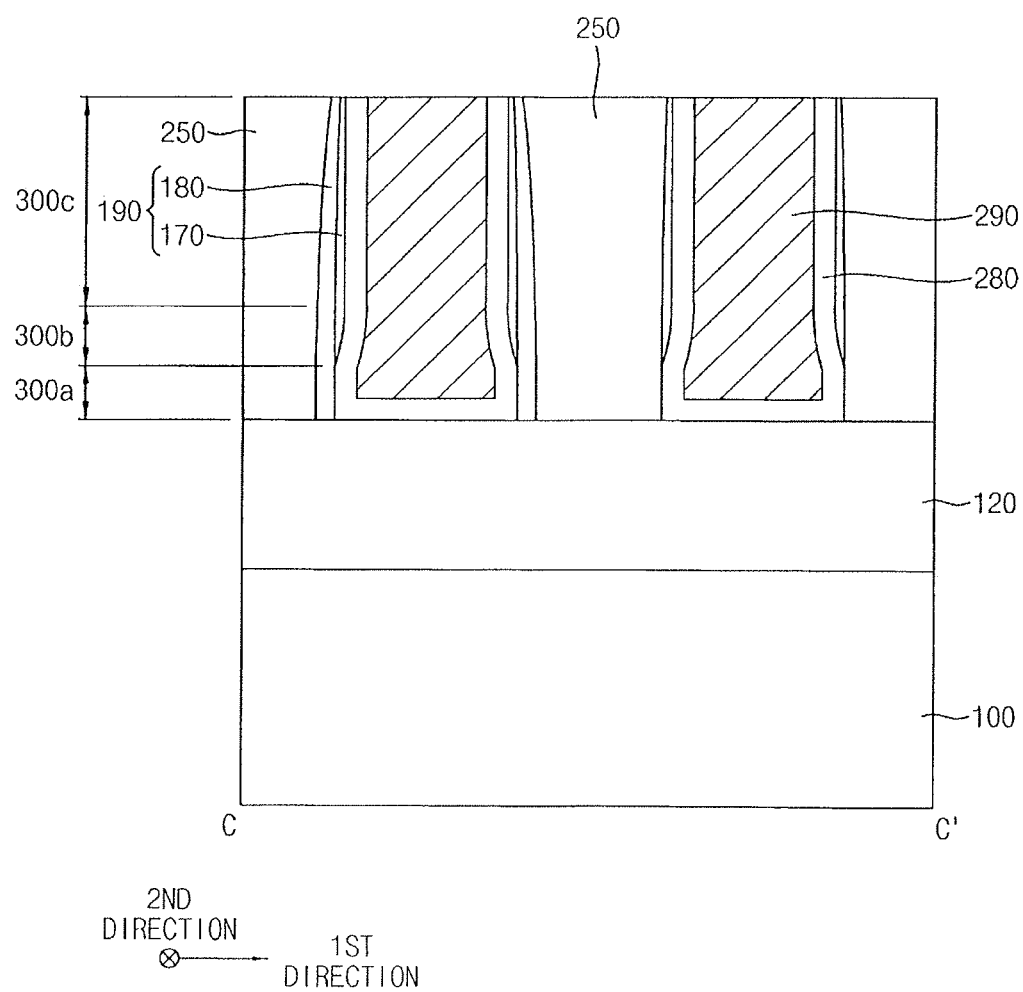

Referring to FIGS. 36 to 37, when a distance between the active fins 105 adjacent to each other in the second direction is short (e.g., is below a predetermined distance), the source/drain layers 240 grown on the active fins 105 may contact and be merged with each other.

Referring to FIGS. 38 to 41, a first insulating interlayer 250 may be formed on the dummy gate structure 160, the gate spacer structure 190, the fin spacer structure 220, and the source/drain layer 240 to a sufficient height, and may be planarized until a top surface of the dummy gate electrode 140 of the dummy gate structure 160 is exposed. In the planarization process, the gate mask 150 may be also removed, and upper portions of the first and second gate spacers 170 and 180 may be partially removed.

The first insulating interlayer 250 may be formed of an oxide, e.g., silicon oxide. The planarization process may be performed, for example, by a CMP process and/or an etch back process.

Referring to FIGS. 42 to 45, the exposed dummy gate electrode 140 and the dummy gate insulation pattern 130 under the dummy gate electrode 140 may be removed to form an opening 260 exposing inner sidewalls of the first and second gate spacers 170 and 180, and a top surface of the active fin 105, e.g., a top surface of the upper active pattern 105a. In example embodiments, the exposed dummy gate electrode 140 may be removed by a dry etch process and then a wet etch process using ammonia hydroxide ($NH_4OH$) as an etching solution. The dummy gate insulation pattern 130 may be removed by a dry etch process and/or a wet etch process using hydrogen fluoride (HF) as an etching solution.

Referring to FIGS. 46 to 49, a gate structure 300 may be formed to fill the opening 260. Particularly, after performing a thermal oxidation process on the top surface of the active fin 105 exposed by the opening 260 to form an interface pattern 270, a gate insulation layer may be formed on the interface pattern 270, the isolation layer 120, the gate spacer structure 190, and the first insulating interlayer 250. A gate electrode layer may be formed on the gate insulation layer to sufficiently fill a remaining portion of the opening 260.

The gate insulation layer may be formed to include a metal oxide having a high dielectric constant (e.g., hafnium oxide, tantalum oxide, zirconium oxide, or the like) by a CVD process or an ALD process. The gate electrode layer may be formed to include a material having a low resistance, e.g., a metal such as aluminum, copper, tantalum, etc., or a metal nitride thereof by an ALD process, a physical vapor deposition (PVD) process, or the like. In an example embodiment, a heat treatment process (e.g., a rapid thermal annealing (RTA) process, a spike rapid thermal annealing (spike RTA) process, a flash rapid thermal annealing (flash RTA) process or a laser annealing process) may be further performed. Alternatively, the gate electrode layer may be formed of doped polysilicon.

The interface pattern 270 may be formed instead of the thermal oxidation process, by a CVD process, an ALD process, or the like, in a manner similar to the gate insulation layer or the gate electrode layer. In this case, the interface pattern 270 may be formed not only on a top surface of the active fin 105, but also on top surfaces of the isolation layer 120 and an inner sidewall of the gate spacer structure 190.

The gate electrode layer and the gate insulation layer may be planarized until a top surface of the first insulating interlayer 250 is exposed to form a gate insulation pattern 280 on the interface pattern 270 and the inner sidewall of the gate spacer structure 190, and a gate electrode 290 filling a remaining portion of the opening 260 on the gate insulation pattern 280. Accordingly, a bottom surface and a sidewall of the gate electrode 290 may be covered by the gate insulation pattern 280. In example embodiments, the planarization process may be performed, for example, by a CMP process and/or an etch back process.

The interface pattern 270, the gate insulation pattern 280, and the gate electrode 290 sequentially stacked may form the gate structure 300. The gate structure 300 together with the source/drain layer 240 may form a PMOS transistor or an NMOS transistor according to the conductivity type of the impurities doped into the source/drain layer 240.

The gate structure 300 may include a first portion on the isolation layer 120 and a second portion on the active fin 105. First, second, and third regions 300a, 300b, and 300c may be defined in the first portion of the gate structure 300 from the top surface of the isolation layer 120 upwardly in this order. The third region 300c of the first portion of the gate structure 300 may be formed at a height corresponding to that of the second portion of the gate structure 300. The first and second regions 300a and 300b of the gate structure 300 may be formed at a height lower than that of the second portion of the gate structure 300. For example, a bottom of the third region 300c of the first portion of the gate structure 300 may be formed at a height substantially the same as that of a bottom of the second portion of the gate structure 300. Alternatively, the bottom of the third region 300c of the first portion of the gate structure 300 may be formed at a height slightly lower than that of the bottom of the second portion of the gate structure 300.

Referring to FIGS. 46 to 49 and FIG. 4, sidewalls of the first, second, and third regions 300a, 300b, and 300c in the first direction may have first, second, and third slopes S1, S2 and S3, respectively, with respect to the top surface of the substrate 100. In example embodiments, the third slope S3 may be about 90 degrees with respect to the top surface of the substrate 100. The first slope S1 may be equal to or less than the third slope S3. The second slope S2 may vary according to height. In example embodiments, the second slope S2 of the second region 300b may be less than the first slope S1 at an interface between the first and second regions 300a and 300b, may increase according to the height thereof, and may be substantially the same as the third slope S3 at an interface between the second and third regions 300b and 300c.

Since the first portion of the gate structure 300 may have the slopes S1, S2, and S3 varying according to the height, the first portion of the gate structure 300 may have a width in the first direction varying according to height. For example, the first, second, and third regions 300a, 300b, and 300c of the first portion of the gate structure 300 may have first, second and third widths W1, W2, and W3, respectively, in the first direction.

In example embodiments, the third width W3 may be substantially the same as that of the second portion of the gate structure 300. The second width W2 of the second region 300b may be greater than the third width W3 of the third region 300c. The first width W1 of the first region 300a may be greater than the second width W2 of the second region 300b. The second width W2 of the second region 300b may decrease according to height, and a rate of reduction may also decrease according to height.

Accordingly, sidewalls of the first portion and the second portion of the gate structure 300 may have slopes at least partially different from each other. The first and second portions of the gate structure 300 may have widths at least partially different from each other.

Referring again to FIGS. 1 to 8, a second insulating interlayer 310 may be formed on the first insulating interlayer 250, the gate structure 300, and the gate spacer structure 190. A hole may be formed through the first and second insulating interlayers 250 and 310 to expose a top surface of the source/drain layer 240.

The second insulating interlayer 310 may be formed of a material substantially the same as or different from that of the first insulating interlayer 250. For example, the second insulating interlayer 310 may be formed of an oxide, e.g., silicon oxide.

The hole may be formed, for example, by forming a photoresist pattern on the second insulating interlayer 310 and performing a dry etch process using the photoresist pattern as an etching mask. In example embodiments, the holes may be formed to be self-aligned with the gate spacer structure 190.

A metal silicide pattern 320 may be formed on the source/drain layer 240 exposed by the hole. In example embodiments, after forming a metal layer on the exposed source/drain layer 240 and the second insulating interlayer 310, a heat treatment may be performed on the metal layer, and an unreacted portion of the metal layer may be removed to form the metal silicide pattern 320 on the source/drain layer 240. The metal layer may be formed of, e.g., cobalt, nickel, etc. The metal silicide pattern 320 may be formed on the source/drain layer 240 and separated therefrom. In another embodiment, no metal silicide pattern may be formed on the source/drain layer 240.

A contact plug 330 may be formed to fill the hole. The contact plug 330 may be formed, for example, by forming a conductive layer on top surface of the metal silicide pattern 320 or the source/drain layer 240, a sidewall of the hole, and a top surface of the second insulating interlayer 310 to sufficiently fill the hole. The conductive layer may then be planarized until the top surface of the second insulating interlayer 310 is exposed. In example embodiments, the conductive layer may be formed of a metal, a metal nitride, doped polysilicon, etc. In an example embodiment, the contact plug 330 may be formed to include a barrier layer covering a bottom and a sidewall of the conductive layer. The barrier layer may be formed to include a metal nitride layer and/or a metal.

By the above processes, the semiconductor device may be manufactured.

As mentioned above, after etching the lower portion of the dummy gate structure 160 that is not covered by the first gate spacer 170 using the first gate spacer 170 as an etching mask, the sidewall of the exposed portion of the dummy gate structure 160 may be covered by the second gate spacer 180. Accordingly, the gate structure 300 subsequently formed may be electrically insulated from the source/drain layer 240 and/or the metal silicide pattern 320, so that the electrical short may be prevented.

Figure 50:
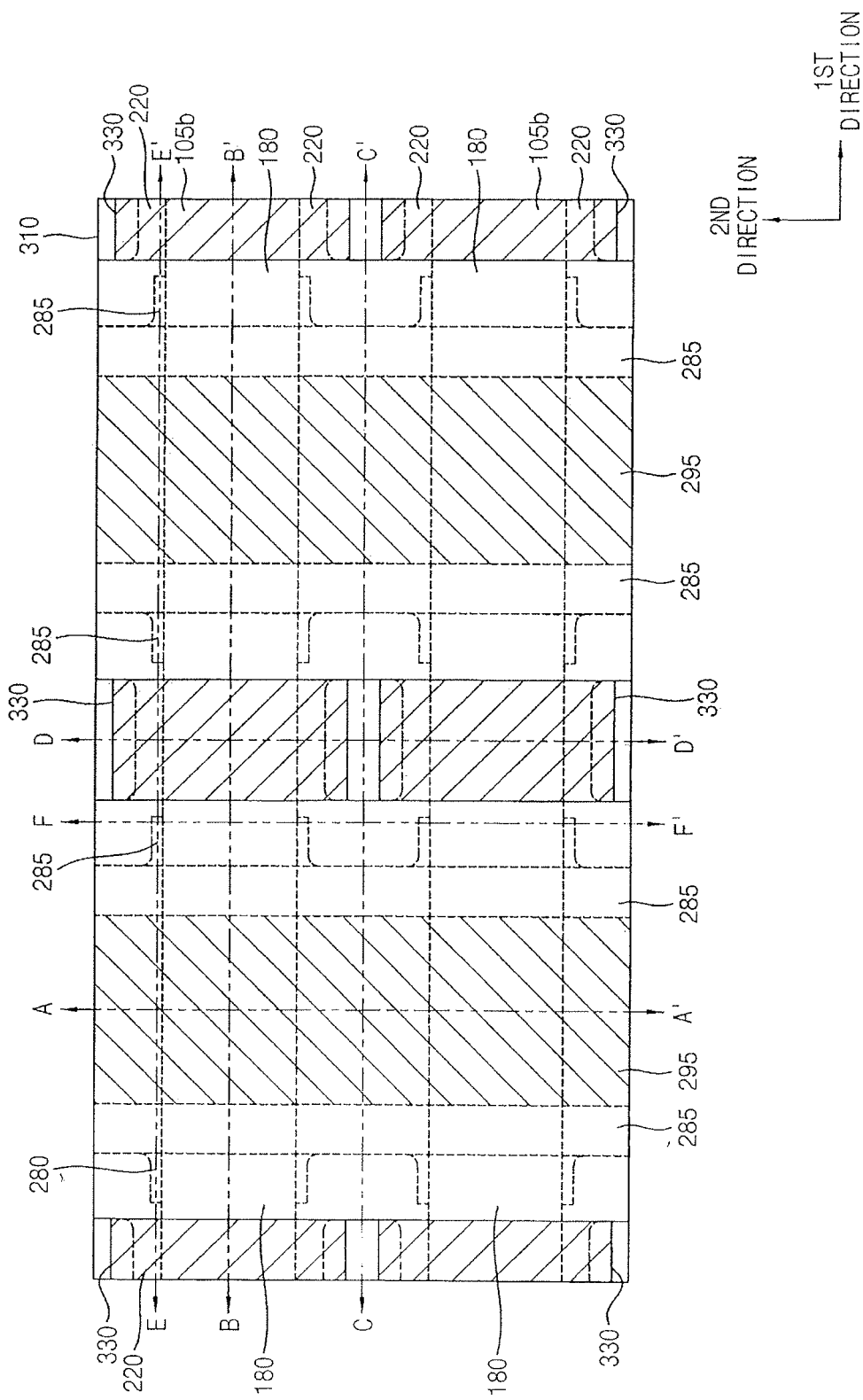
FIGS. 50 to 53 illustrate another embodiment of a semiconductor device.
Figure 51:
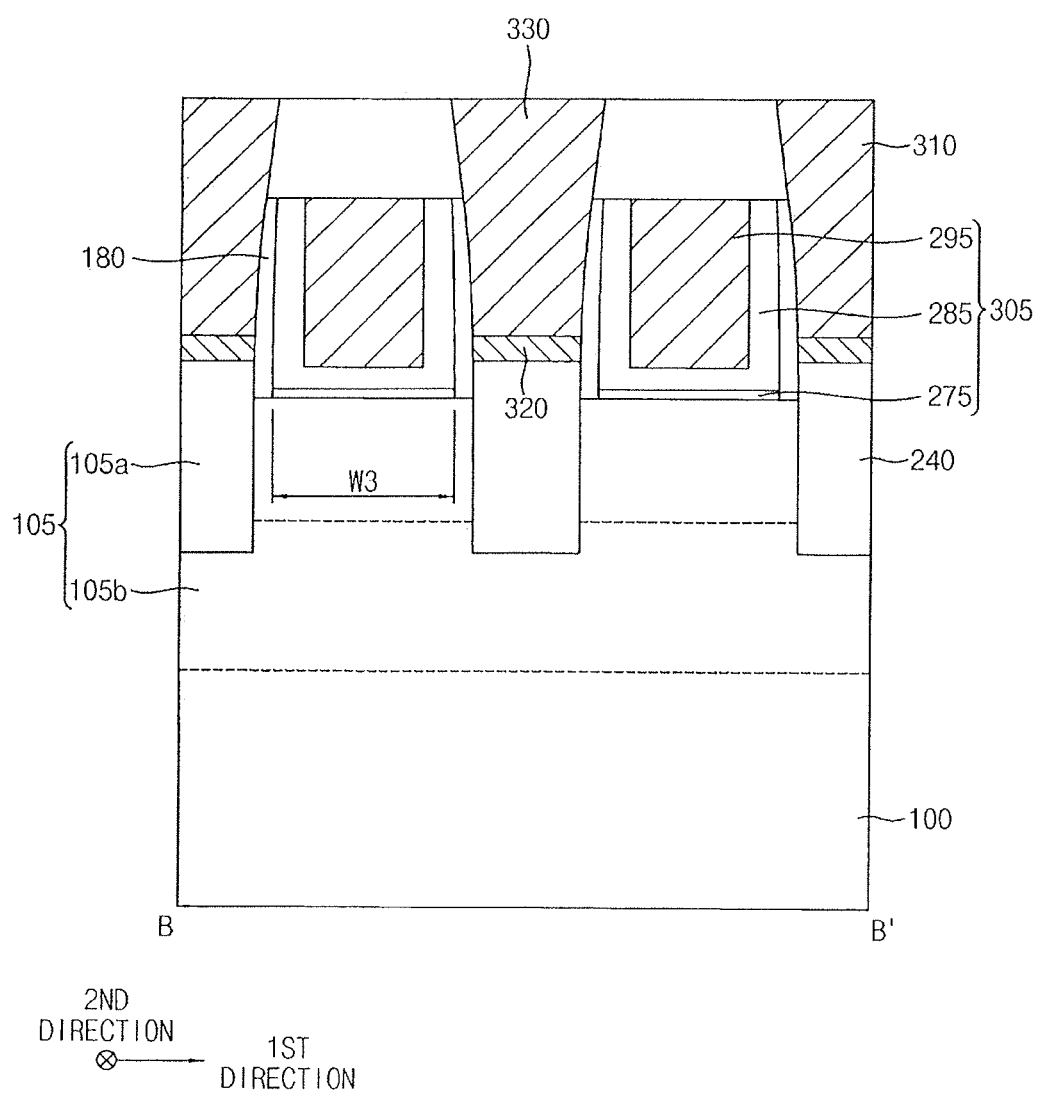
Figure 52:
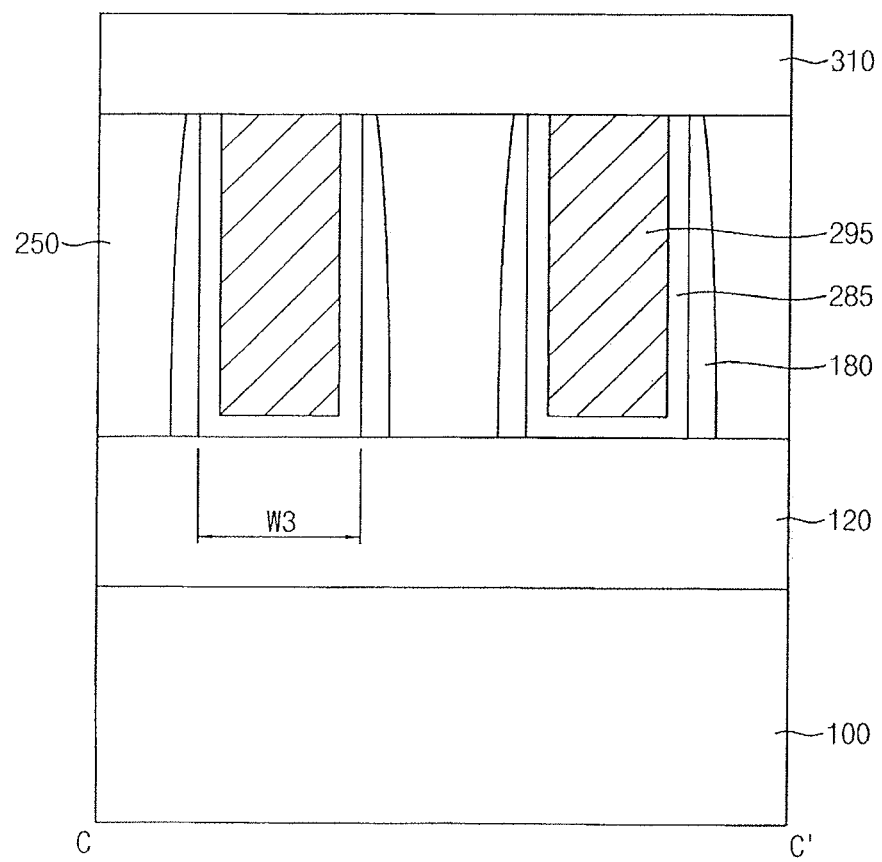
Figure 53:
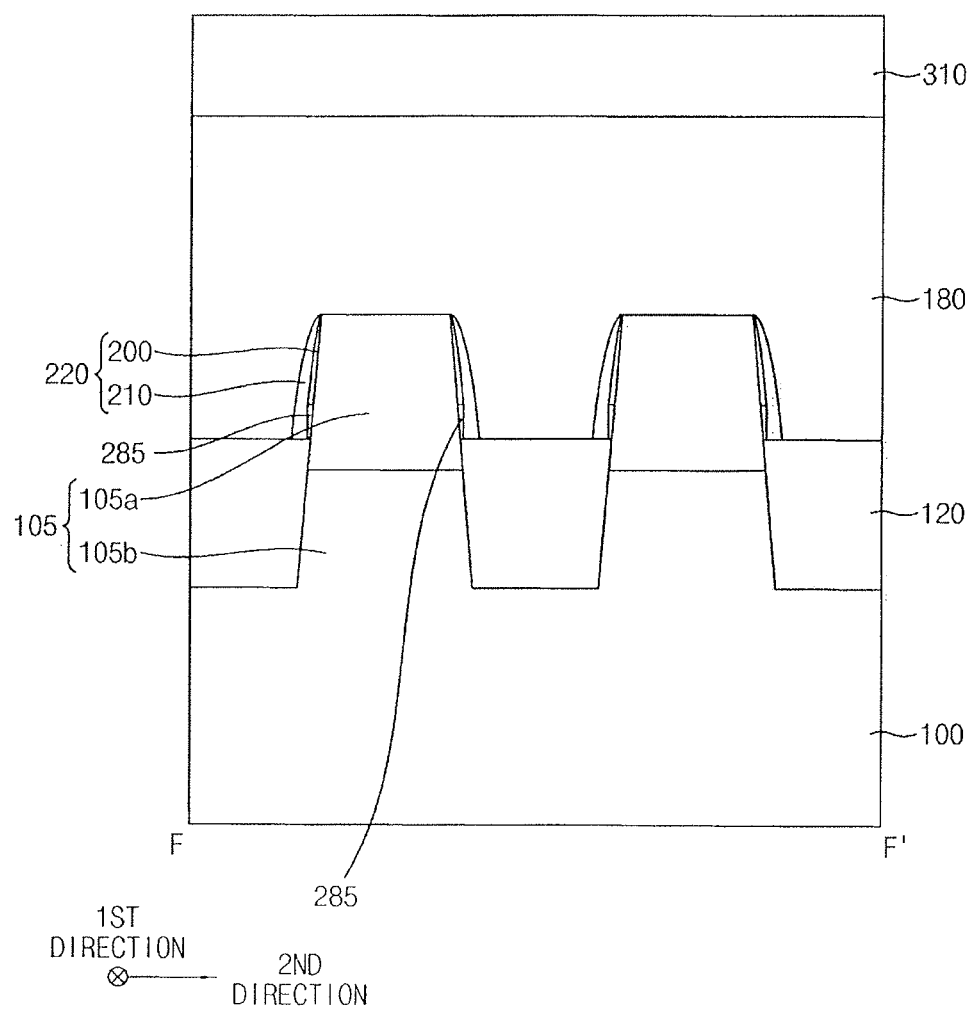

FIGS. 50 to 53 illustrate plan and cross-sectional views of another embodiment of a semiconductor device. FIG. 51 is a cross-sectional view taken along a line B-B' of FIG. 50, FIG. 52 is a cross-sectional view taken along a line C-C' of FIG. 50, and FIG. 53 is a cross-sectional view taken along a line F-F' of FIG. 50. The semiconductor device may be substantially the same as or similar to that of FIGS. 1 to 8, except for the gate structure and the gate spacer structure.

Referring to FIGS. 50 to 53, the semiconductor device may include the active fin 105, a gate structure 305, and the second gate spacer 180 on the substrate 100. The semiconductor device may further include the fin spacer structure 220, the source/drain layer 240, the metal silicide pattern 320, the contact plug 330, and the insulating interlayers 250 and 310.

The gate structure 305 may extend in the second direction on the active fin 105 and the isolation layer 120. The gate structure 305 may include a first portion on the isolation layer 120 and a second portion on the active fin 105. The first and second portions of the gate structure 305 may be integrally formed so as not to be spaced apart from each other in the second direction. A plurality of gate structures 305 may be formed on the first direction.

FIG. 51 shows a cross-section of the second portion of the gate structure 305, and FIG. 52 shows a cross-section of the first portion of the gate structure 305. In example embodiments, top surfaces of the first and second portions of the gate structure 305 may be substantially coplanar with each other. A bottom surface of the first portion of the gate structure 300 may be lower than a bottom surface of the second portion of the gate structure 300. For example, the second portion of the gate structure 305 may be formed on the active fin 105 protruding from the top surface of the isolation layer 120. Thus, the bottom surface thereof may be higher than that of the first portion of the gate structure 305 on the isolation layer 120. In some embodiments, the top surface of the second portion of the gate structure 305 may be higher than that of the first portion of the gate structure 300.

Sidewalls of both of the first and second portions of the gate structure 305 in the first direction may be substantially perpendicular to a top surface of the active fin 105. Thus, each of the first and second portions of the gate structure 305 may have the third width W3 in the first direction. For example, unlike the gate structure 300 in FIGS. 1 to 8, the first and second portions of the gate structure 305 in FIGS. 50 to 53 may have substantially the same sidewall profile and substantially the same width.

Unlike the gate structure 300 in FIGS. 1 to 8, the semiconductor device in FIGS. 50 to 53 may not include the first gate spacer 170, but may include only the second gate spacer 180 The second gate spacer 180 may have a substantially vertical sidewall profile corresponding to the sidewall shape of the gate structure 305.

The semiconductor device may include the second gate spacer 180 only. However, the sidewall of the gate structure 305 may be well covered. Thus, the gate structure 305 and the source/drain layer 240 (refer, e.g., to FIG. 5) and/or the metal silicide pattern 320 (refer, e.g., to FIG. 5) may be electrically insulated.

Figure 54:
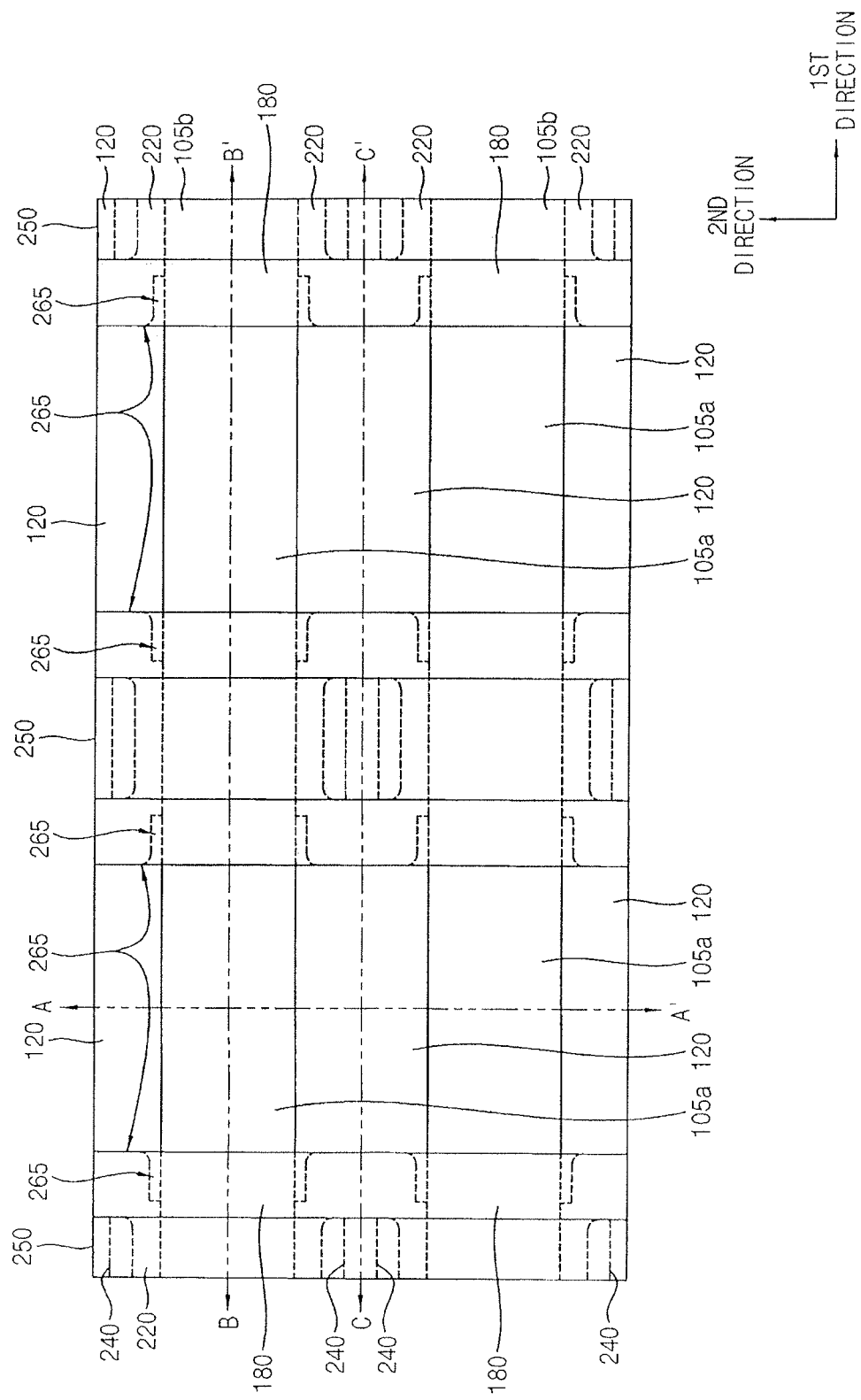
FIGS. 54 to 56 illustrate another embodiment of a method for manufacturing a semiconductor device.
Figure 55:
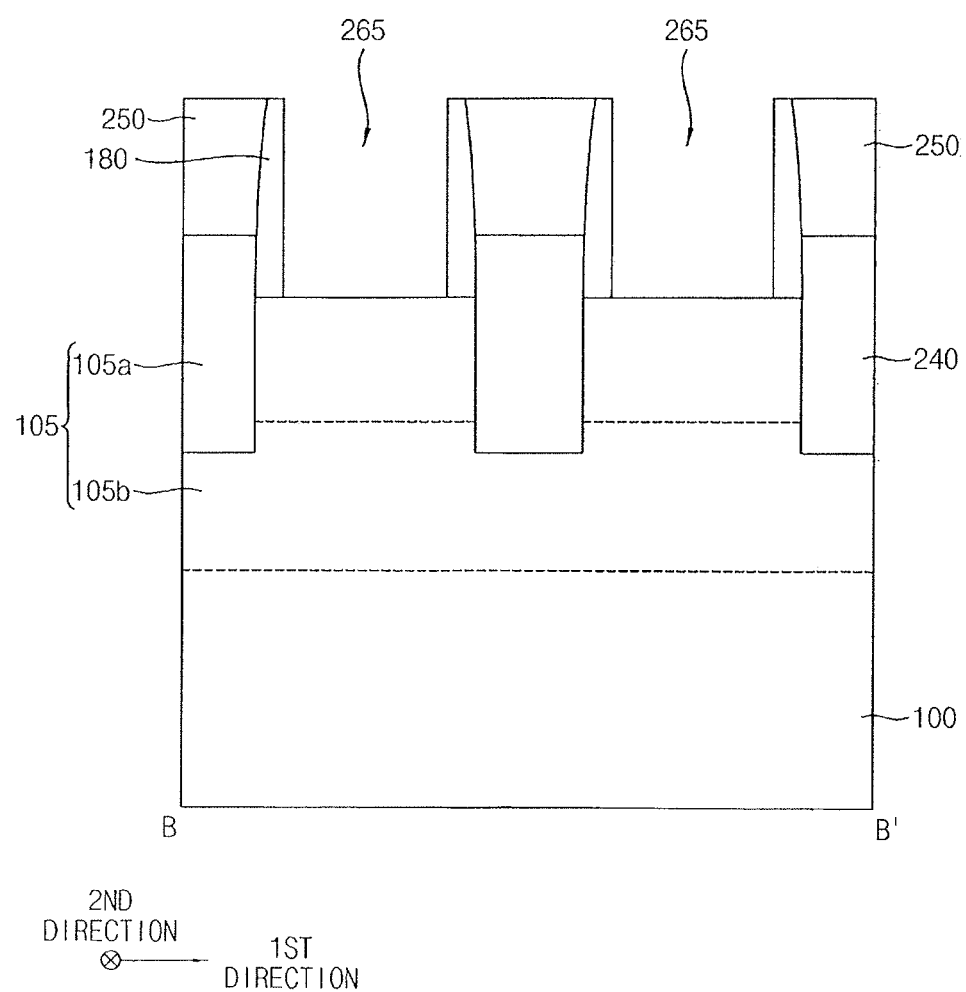
Figure 56:
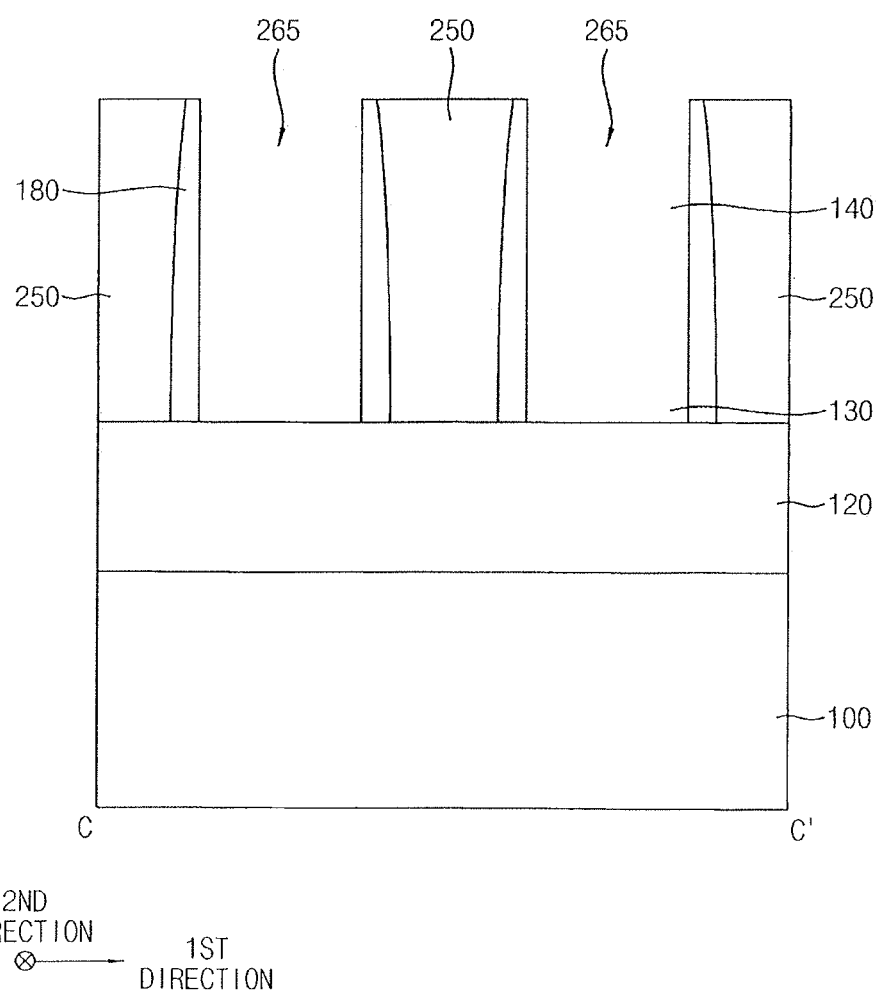

FIGS. 54 to 56 are a plan view and cross-sectional views illustrating stages of another embodiment of a method for manufacturing a semiconductor device. FIG. 54 is a plan view, FIG. 55 is a cross-sectional view taken along a line B-B' of FIG. 54, and FIG. 56 is a cross-sectional view taken along a line C-C' of FIG. 54.

First, processes substantially the same as or similar to those illustrated with reference to FIGS. 9 to 41 may be performed. Referring to FIGS. 54 to 56, processes substantially the same as or similar to those illustrated with reference to FIGS. 42 to 45 may be performed. However, when the dummy gate electrode 140 and the dummy gate insulation pattern 130 are removed, the first gate spacer 170 may be also removed.

In example embodiments, when the first gate spacer 170 includes an oxide (e.g., silicon oxide), the first gate spacer 170 may be also removed when the dummy gate insulation pattern 130 is removed. Thus, an opening 265 exposing inner sidewalls of the second gate spacer 180. A top surface of the active fin 105 (e.g., a top surface of the upper active pattern 105a) may be formed.

Then, processes substantially the same as or similar to those illustrated with reference to FIGS. 46 to 49 and FIGS. 1 to 8 may be performed to complete the semiconductor device.

Figure 57:
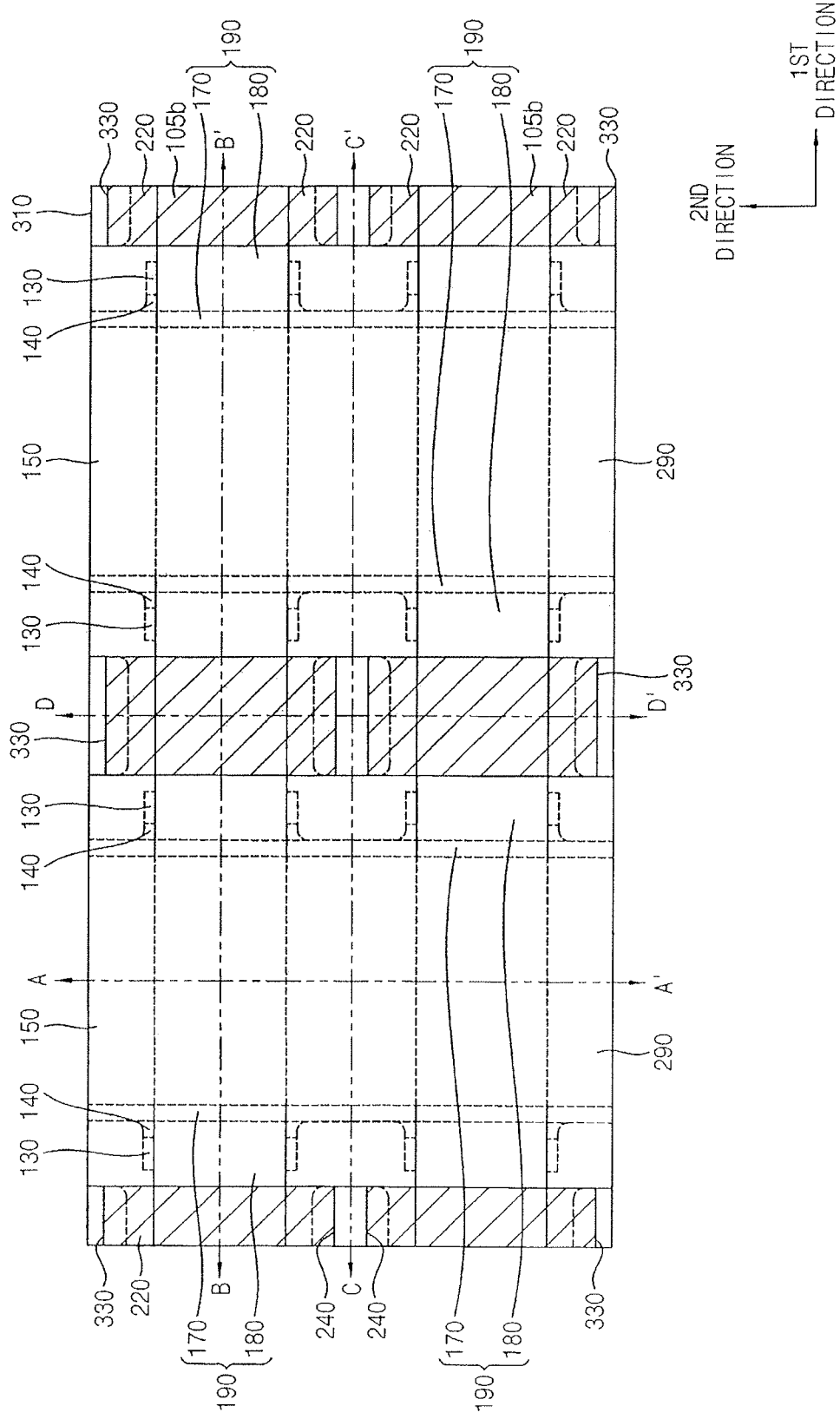
FIGS. 57 to 60 illustrate another embodiment of a method for manufacturing a semiconductor device.
Figure 58:
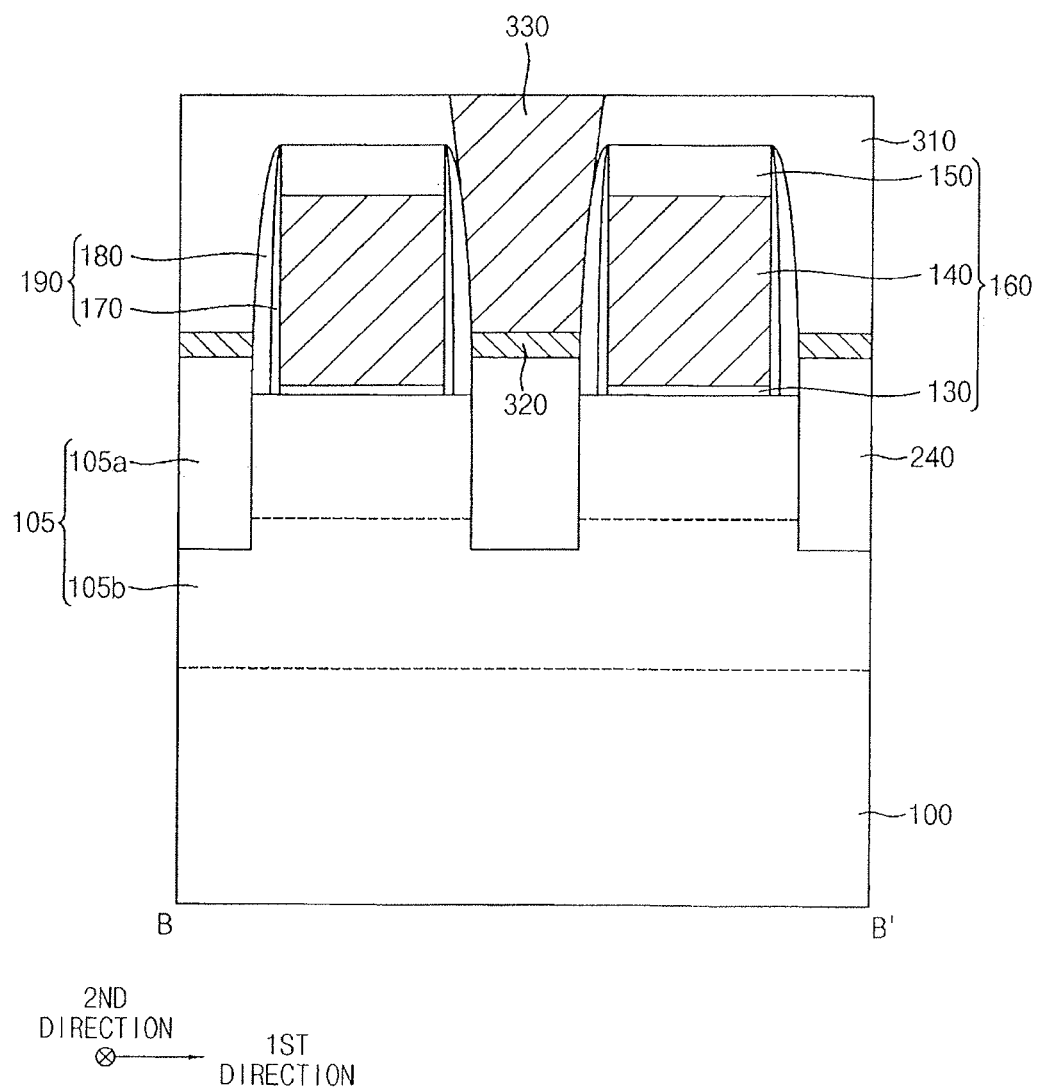
Figure 59:
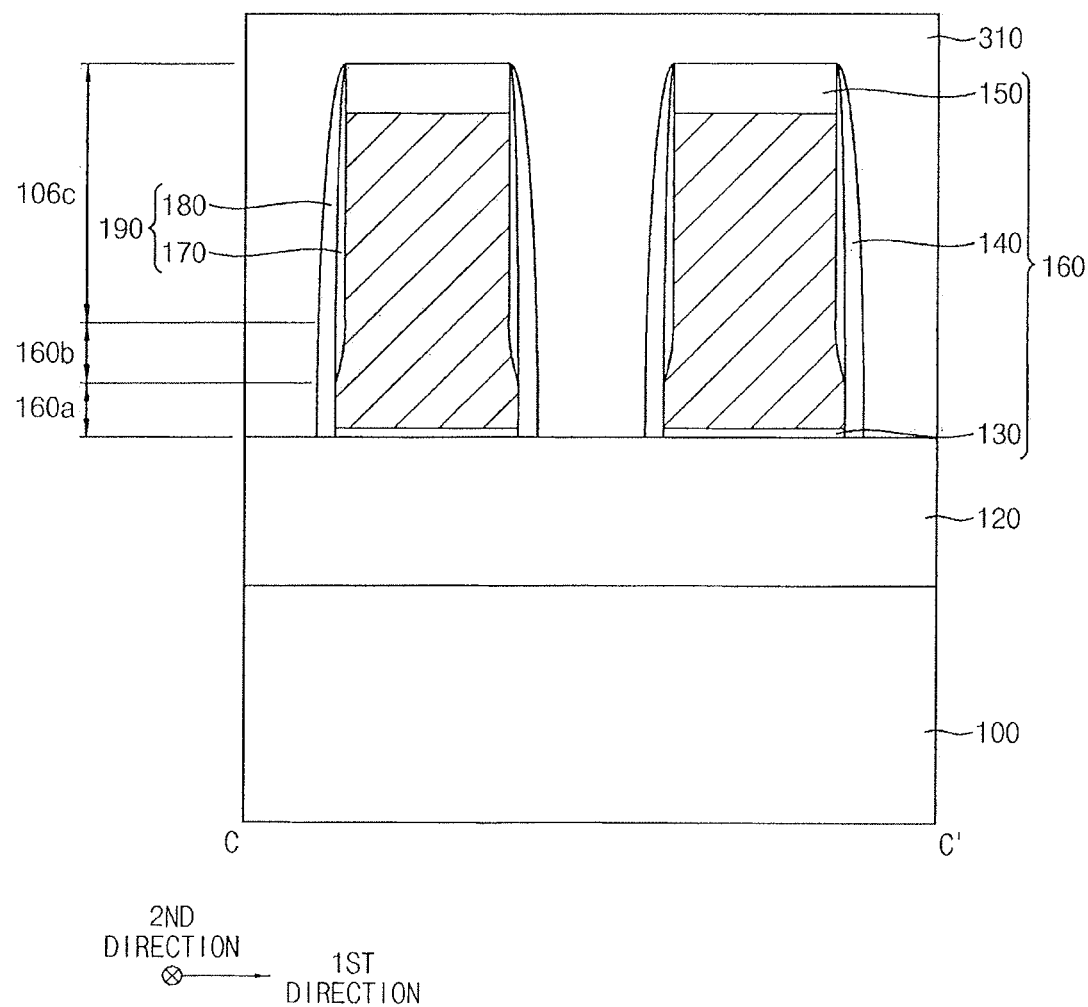
Figure 60:
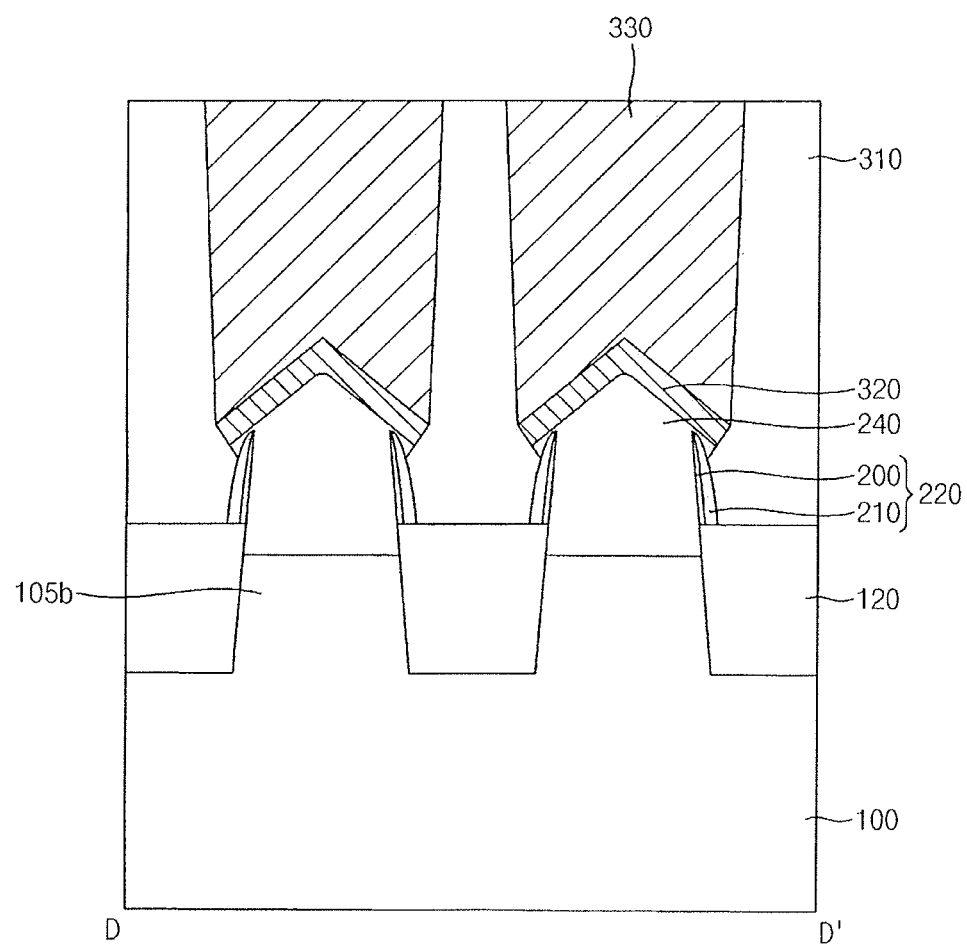

FIGS. 57 to 60 are a plan view and cross-sectional views illustrating another embodiment of a semiconductor device. FIG. 57 is a plan view, FIG. 58 is a cross-sectional view taken along a line B-B' of FIG. 57, FIG. 59 is a cross-sectional view taken along a line C-C' of FIG. 57, and FIG. 60 is a cross-sectional view taken along a line D-D' of FIG. 57. The semiconductor device may be substantially the same as or similar to that of FIGS. 1 to 8, except for the gate structure.

Referring to FIGS. 57 to 60, the semiconductor device may include the active fin 105, a gate structure 160, and the gate spacer structure 190 on the substrate 100. The semiconductor device may further include the fin spacer structure 220, the source/drain layer 240, the metal silicide pattern 320, the contact plug 330, and the insulating interlayers 250 and 310.

Instead of the gate structure 300 in FIGS. 1 to 8, the semiconductor device may include the gate structure 160. Unlike the processes illustrated with reference to FIGS. 9 to 49, the gate structure 160 may be formed to have a gate electrode 140 including a conductive material (e.g., doped polysilicon or a metal) instead of the dummy gate electrode 140 including polysilicon. Thus, after performing processes substantially the same as or similar to those illustrated with reference to FIGS. 9 to 37, the process illustrated with reference to FIGS. 38 to 49 may not be performed, and the gate structure 160 including the gate electrode 140 may serve as a real gate.

In accordance with one or more of the aforementioned embodiments, a semiconductor device and method of manufacturing a semiconductor device may be correspond to various types of memory devices including a finFET. For example, the semiconductor device and the method of manufacturing the same may be applied to logic devices such as central processing units (CPUs), main processing units (MPUs), or application processors (APs), or the like. Additionally, the semiconductor device and the method of manufacturing the same may be applied to volatile memory devices such as DRAM devices or SRAM devices, or non-volatile memory devices such as flash memory devices, PRAM devices, MRAM devices, RRAM devices, or the like.

By way of summation and review, a fin-type field effect transistor (finFET) may be manufactured by forming a dummy gate electrode to cross over active fins. As the distance between the active fins decreases, the dummy gate electrode may have a skirt-like shape. This is because the lower portion of the dummy gate electrode may not be etched well, and thus may be exposed when a gate spacer is subsequently formed. Consequently, a short may form between a gate electrode and a source/drain layer of the transistor.

In accordance with one or more of the aforementioned embodiments, after etching a lower portion of a dummy gate structure not covered by a first gate spacer using the first gate spacer as an etching mask, a second gate spacer may be formed to cover the first gate spacer and the lower portion of a dummy gate structure. Thus, a gate structure subsequently formed may be electrically insulated from a source/drain layer, so that the electrical short may be prevented.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A semiconductor device comprising:
   a substrate;
   a plurality of active fins disposed on the substrate and including a first fin and a second fin, each of the plurality of active fins extending in a first direction substantially parallel to an upper surface of the substrate;
   an isolation layer disposed on the substrate and disposed between the first fin and the second fin;
   a gate structure disposed on the plurality of active fins and the isolation layer and extending in a second direction substantially parallel to the upper surface of the substrate and crossing the first direction, and the gate structure including a gate insulation pattern and a gate electrode disposed on the gate insulation pattern, the gate insulation pattern including a bottom portion covering a bottom surface of the gate electrode and a side portion covering a sidewall of the gate electrode, and a thickness of the side portion of the gate insulation pattern being substantially constant along a vertical direction substantially perpendicular to the upper surface of the substrate;

a first gate spacer on both sidewalls, in the first direction, of the gate structure, the first gate spacer contacting a top surface of the first fin; and a second gate spacer disposed on outer sidewalls of the first gate spacer, wherein:

a distance between the outer sidewalls of the first gate spacer in the first direction at a contact portion between the first gate spacer and the top surface of the first fin is less than a width, in the first direction, of the top surface of the first fin contacting the first gate spacer, the second gate spacer, and the gate structure, the first gate spacer includes inner sidewalls contacting the gate structure and the outer sidewalls contacting the second gate spacer, the second gate spacer contacts the top surface of the first fin in an active region, the gate structure includes a first portion disposed on the first fin and a second portion disposed on the isolation layer, a width in the first direction of a lower portion of the first portion of the gate structure is the same as a width in the first direction of an upper portion of the first portion of the gate structure, a width in the first direction of a lower portion of the second portion of the gate structure is greater than a width in the first direction of an upper portion of the second portion of the gate structure, and a thickness of a first portion of the first gate spacer is greater than a thickness of a second portion of the first gate spacer.

2. The semiconductor device of claim 1, further comprising:

a source/drain disposed on the first fin; and a fin spacer structure disposed on a sidewall of the source/drain layer.

3. The semiconductor device of claim 2, further comprising:

a metal silicide pattern disposed on the source/drain; and a contact plug disposed on the metal silicide pattern.

4. The semiconductor device of claim 1, wherein a distance between the second gate spacer and the lower portion of the second portion of the gate structure is less than a distance between the second gate spacer and the upper portion of the second portion of the gate structure.

5. The semiconductor device of claim 1, further comprising:

a first insulating interlayer disposed on the substrate and covering a sidewall of the second gate spacer; and a second insulating interlayer disposed on the first insulating interlayer and the gate structure, and including a material that the first insulating interlayer does not include.

6. The semiconductor device of claim 1, wherein the gate insulation pattern includes:

a first skirt disposed on a first sidewall of the first fin; and a second skirt disposed on a second sidewall of the first fin.

7. A semiconductor device comprising:

a substrate;

a plurality of active fins disposed on the substrate and including a first fin and a second fin, each of the plurality of active fins extending in a first direction substantially parallel to an upper surface of the substrate;

an isolation layer disposed on the substrate and disposed between the first fin and the second fin;

a gate structure disposed on the plurality of active fins and the isolation layer and extending in a second direction substantially parallel to the upper surface of the substrate and crossing the first direction, and the gate structure including a gate insulation pattern and a gate electrode disposed on the gate insulation pattern, the gate insulation pattern including a bottom portion covering a bottom surface of the gate electrode and a side portion covering a sidewall of the gate electrode, and a thickness of the side portion of the gate insulation pattern being substantially constant along a vertical direction substantially perpendicular to the upper surface of the substrate;

a first gate spacer on both sidewalls, in the first direction, of the gate structure, the first gate spacer contacting a top surface of the first fin; and a second gate spacer disposed on outer sidewalls of the first gate spacer, wherein:

a distance between outer sidewalls of the first gate spacer in the first direction at a contact portion between the first gate spacer and the top surface of the first fin is less than a width, in the first direction, of the top surface of the first fin contacting the first gate spacer, the second gate spacer, and the gate structure, the first gate spacer includes inner sidewalls contacting the gate structure and the outer sidewalls contacting the second gate spacer, the second gate spacer contacts the top surface of the first fin in an active region, the gate structure includes a first portion disposed on the first fin and a second portion disposed on the isolation layer, a width in the first direction of a lower portion of the first portion of the gate structure is the same as a width in the first direction of an upper portion of the first portion of the gate structure, a width in the first direction of a lower portion of the second portion of the gate structure is different from a width in the first direction of an upper portion of the second portion of the gate structure, the first gate spacer includes a first portion disposed on the first fin and a second portion disposed on the isolation layer, and a bottom surface of the second portion of the first gate spacer is disposed higher than a bottom surface of the second portion of the gate structure.

8. The semiconductor device of claim 7, further comprising:

a source/drain disposed on the first fin; and a fin spacer structure disposed on a sidewall of the source/drain layer.

9. The semiconductor device of claim 8, further comprising:

a metal silicide pattern disposed on the source/drain; and a contact plug disposed on the metal silicide pattern.

10. The semiconductor device of claim 7, wherein the width of the lower portion of the second portion of the gate structure is greater than the width of the upper portion of the second portion of the gate structure.

11. The semiconductor device of claim 7, wherein a distance between the second gate spacer and the lower portion of the second portion of the gate structure is less than a distance between the second gate spacer and the upper portion of the second portion of the gate structure.

12. The semiconductor device of claim 7, further comprising:
a first insulating interlayer disposed on the substrate and covering a sidewall of the second gate spacer; and
a second insulating interlayer disposed on the first insulating interlayer and the gate structure, and including a material that the first insulating interlayer does not include.

13. The semiconductor device of claim 7, wherein the gate insulation pattern includes:
a first skirt disposed on a first sidewall of the first fin; and
a second skirt disposed on a second sidewall of the first fin.

14. A semiconductor device comprising:
a substrate;
a plurality of active fins disposed on the substrate and including a first fin and a second fin, each of the plurality of active fins extending in a first direction substantially parallel to an upper surface of the substrate;
an isolation layer disposed on the substrate and disposed between the first fin and the second fin;
a gate structure disposed on the plurality of active fins and the isolation layer and extending in a second direction substantially parallel to the upper surface of the substrate and crossing the first direction, and the gate structure including a gate insulation pattern and a gate electrode disposed on the gate insulation pattern, the gate insulation pattern covering a bottom surface and a sidewall of the gate electrode;
a first gate spacer on both sidewalls of the gate structure, the first gate spacer contacting a top surface of the first fin; and
a second gate spacer disposed on outer sidewalls of the first gate spacer,
wherein:
a distance between outer sidewalls of the first gate spacer in the first direction at a contact portion between the first gate spacer and the top surface of the first fin is less than a width, in the first direction, of the top surface of the first fin contacting the first gate spacer, the second gate spacer, and the gate structure,
the first gate spacer includes inner sidewalls contacting the gate structure and the outer sidewalls contacting the second gate spacer,
the second gate spacer contacts the top surface of the first fin in an active region,
the gate structure includes a first portion disposed on the first fin and a second portion disposed on the isolation layer,
a width in the first direction of a lower portion of the first portion of the gate structure is the same as a width in the first direction of an upper portion of the first portion of the gate structure,
a width in the first direction of a lower portion of the second portion of the gate structure is different from a width in the first direction of an upper portion of the second portion of the gate structure,
the first gate spacer includes a first portion disposed on the first fin and a second portion disposed on the isolation layer,
a bottom surface of the second portion of the first gate spacer is disposed higher than a bottom surface of the second portion of the gate structure,
the second portion of the gate electrode includes a corner portion where a sidewall of second portion of the gate electrode and the bottom surface of second portion of the gate electrode meet,
the corner portion of the second portion of the gate electrode is rounded,
a thickness of a first sub-portion of the second portion of the first gate spacer is greater than a thickness of a second sub-portion of the second portion of the first gate spacer, and
the second sub-portion of the second portion of the first gate spacer is disposed on the first sub-portion of the second portion of the first gate spacer.

15. The semiconductor device of claim 14, further comprising:
a source/drain disposed on the first fin;
a fin spacer structure disposed on a sidewall of the source/drain layer;
a metal silicide pattern disposed on the source/drain; and
a contact plug disposed on the metal silicide pattern.

16. The semiconductor device of claim 14, wherein a lower portion of the gate insulation pattern includes a protruding portion, and
at least a portion of the first gate spacer is disposed on the protruding portion of the gate insulation pattern.

17. The semiconductor device of claim 14, wherein the gate insulation pattern includes:
a first skirt disposed on a first sidewall of the first fin; and
a second skirt disposed on a second sidewall of the first fin.

18. The semiconductor device of claim 14, wherein the width of the lower portion of the second portion of the gate structure is greater than the width of the upper portion of the second portion of the gate structure.

19. The semiconductor device of claim 14, wherein:
the gate insulation pattern includes a bottom portion covering the bottom surface of the gate electrode and a side portion covering the sidewall of the gate electrode, and
a thickness of the side portion of the gate insulation pattern is substantially constant along a vertical direction substantially perpendicular to the upper surface of the substrate.

* * * * *